US012176236B2

(12) United States Patent
Li et al.

(10) Patent No.: US 12,176,236 B2
(45) Date of Patent: Dec. 24, 2024

(54) SEMICONDUCTOR MANUFACTURING APPARATUS AND METHOD FOR MANUFACTURING SEMICONDUCTOR DEVICE

(71) Applicant: Kioxia Corporation, Tokyo (JP)

(72) Inventors: Wu Li, Yokkaichi (JP); Tsubasa Imamura, Kuwana (JP); Yuto Itagaki, Yokkaichi (JP); Minki Chou, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 327 days.

(21) Appl. No.: 17/694,145

(22) Filed: Mar. 14, 2022

(65) Prior Publication Data
US 2022/0399222 A1    Dec. 15, 2022

(30) Foreign Application Priority Data

Jun. 15, 2021   (JP) ................................. 2021-099777
Dec. 20, 2021   (JP) ................................. 2021-205698

(51) Int. Cl.
*H01L 21/683* (2006.01)
*H01J 37/32* (2006.01)
*H01L 21/3065* (2006.01)
*H01L 21/311* (2006.01)

(52) U.S. Cl.
CPC .... *H01L 21/6833* (2013.01); *H01J 37/32449* (2013.01); *H01J 37/32724* (2013.01);
(Continued)

(58) Field of Classification Search
None
See application file for complete search history.

(56) References Cited

U.S. PATENT DOCUMENTS

| 10,651,071 B2 | 5/2020 | Tobe |
| 2012/0227955 A1 | 9/2012 | Koshimizu |

(Continued)

FOREIGN PATENT DOCUMENTS

| JP | 2001-102435 A | 4/2001 |
| JP | 2002-141332 A | 5/2002 |

(Continued)

OTHER PUBLICATIONS

W. R. Knolle, et al., "Ammonium Hexafluorosilicate Formation during Plasma Etching of Silicon Nitride", Journal of Electrochemical Society, vol. 135, No. 10, 1988, 6 pages.

(Continued)

*Primary Examiner* — Roberts P Culbert
(74) *Attorney, Agent, or Firm* — Oblon, McClelland, Maier & Neustadt, L.L.P.

(57) ABSTRACT

A semiconductor device manufacturing apparatus according to an embodiment includes: a chamber; a holder provided in the chamber and capable of adsorbing a substrate, the holder including a recess on a surface, a first hole provided in the recess, and a second hole provided in the recess; a first gas passage connected to the first hole; a second gas passage connected to the second hole; a first valve provided in the first gas passage; a second valve provided in the second gas passage; a first gas supply pipe for supplying a first gas to the recess; and a gas discharge pipe for discharging a gas from the recess. The first gas passage and the second gas passage are connected to the first gas supply pipe, or the first gas passage and the second gas passage are connected to the gas discharge pipe.

15 Claims, 23 Drawing Sheets

(52) U.S. Cl.
CPC .... *H01L 21/3065* (2013.01); *H01L 21/31116* (2013.01); *H01J 2237/332* (2013.01); *H01J 2237/3341* (2013.01); *H01J 2237/3345* (2013.01)

(56) References Cited

U.S. PATENT DOCUMENTS

| | | |
|---|---|---|
| 2012/0238040 A1 | 9/2012 | Kubota et al. |
| 2017/0372916 A1* | 12/2017 | Kudo ............... H01J 37/32091 |
| 2022/0406611 A1 | 12/2022 | Takahashi et al. |

FOREIGN PATENT DOCUMENTS

| | | |
|---|---|---|
| JP | 2003-68836 A | 3/2003 |
| JP | 2011-119708 A | 6/2011 |
| JP | 2012-195463 A | 10/2012 |
| JP | 2012-199535 A | 10/2012 |
| JP | 2016-100414 A | 5/2016 |
| JP | 2017-130518 A | 7/2017 |
| JP | 2018-186179 A | 11/2018 |
| JP | 2022-191787 A | 12/2022 |
| TW | 202103229 A | 1/2021 |

OTHER PUBLICATIONS

Nobuya Miyoshi, et al., "Atomic layer etching of silicon nitride using infrared annealing for short desorption time of ammonium fluorosilicate", Japanese Journal of Applied Physics 56, 2017, 8 pages.

* cited by examiner

FIG.3
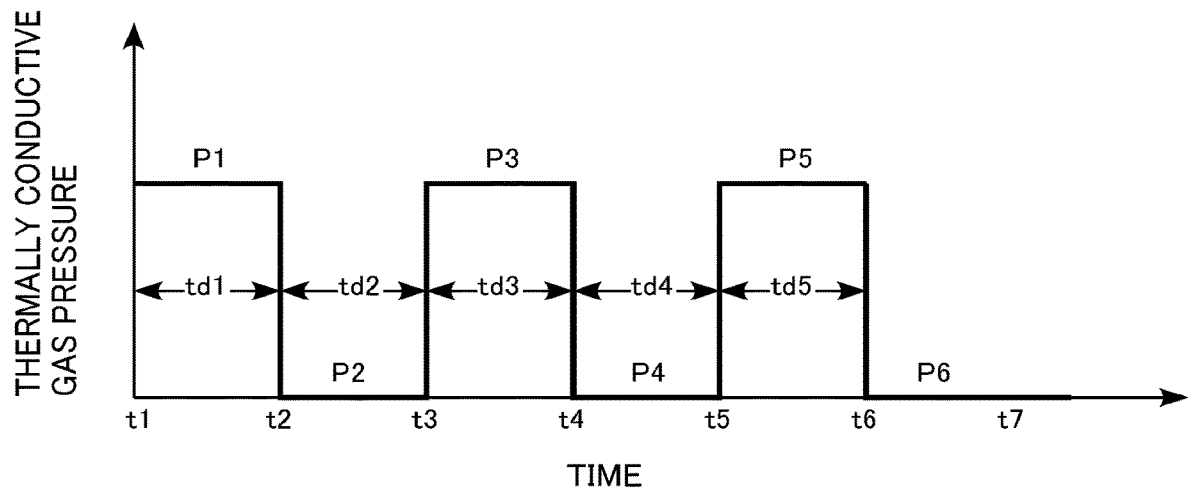
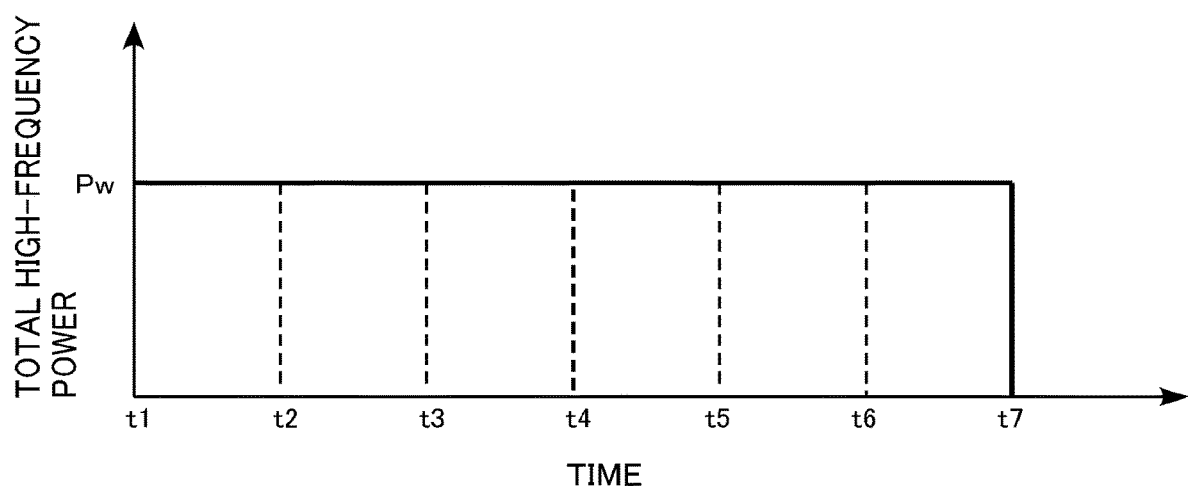
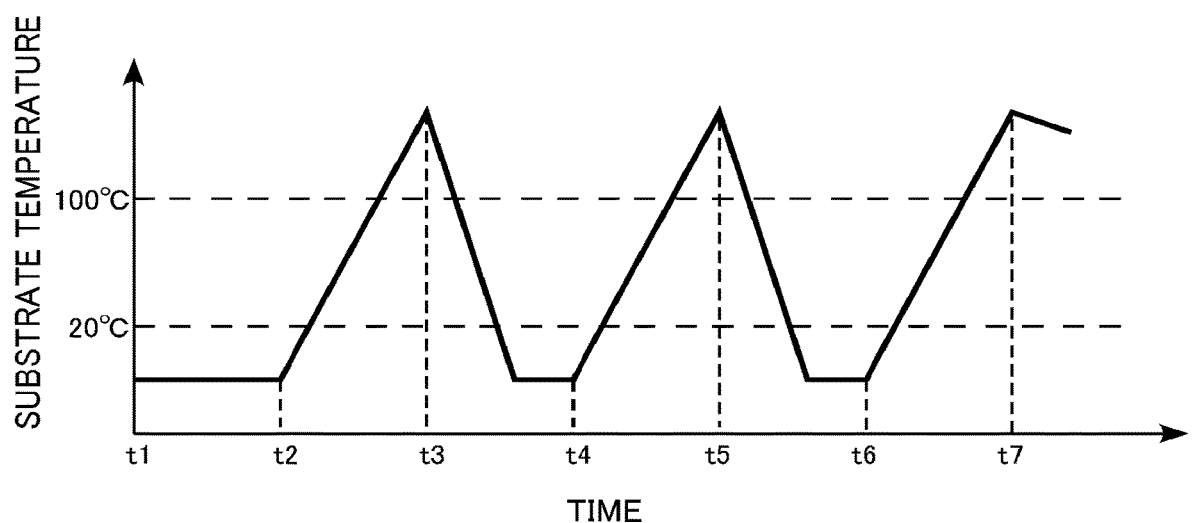

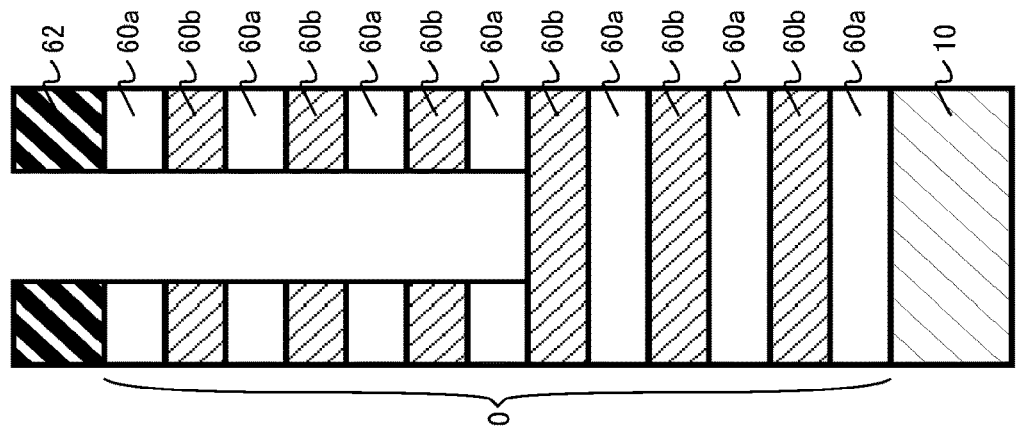
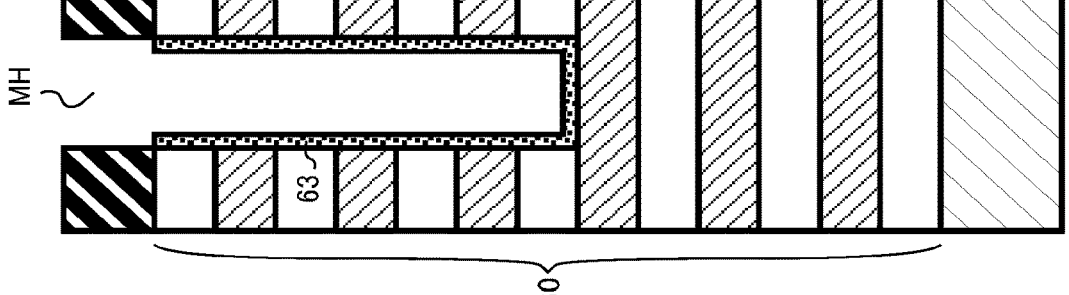
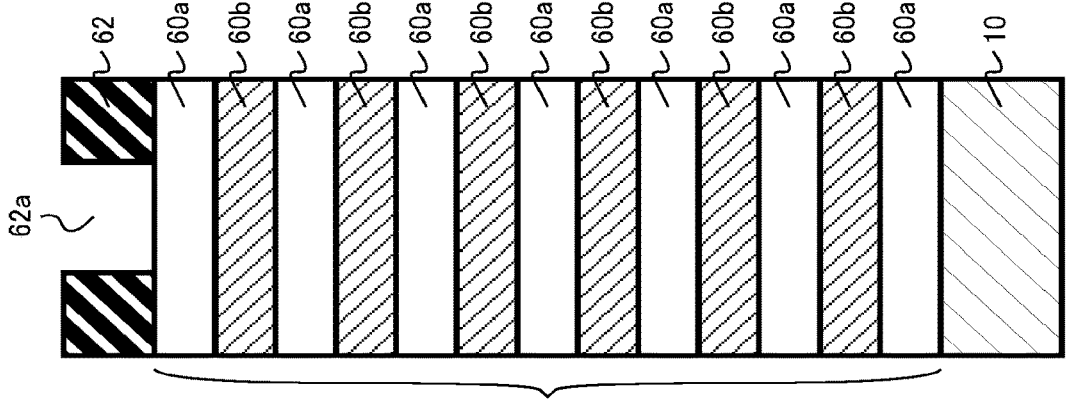
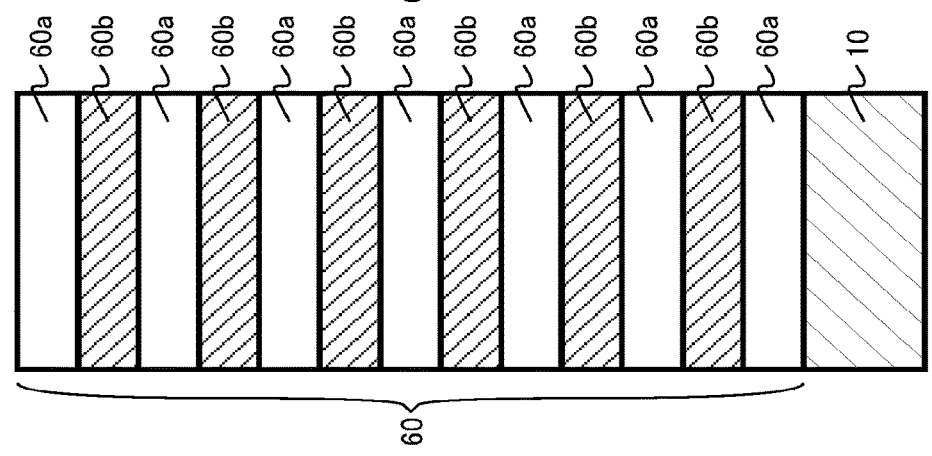

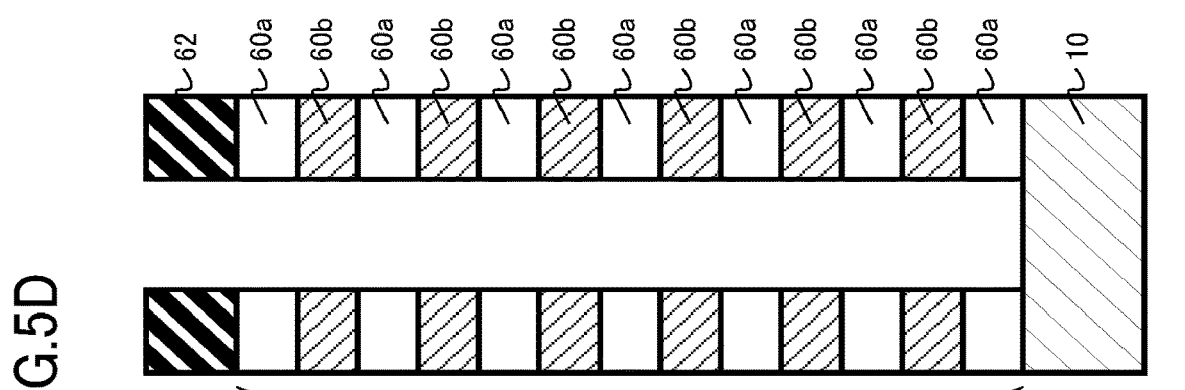
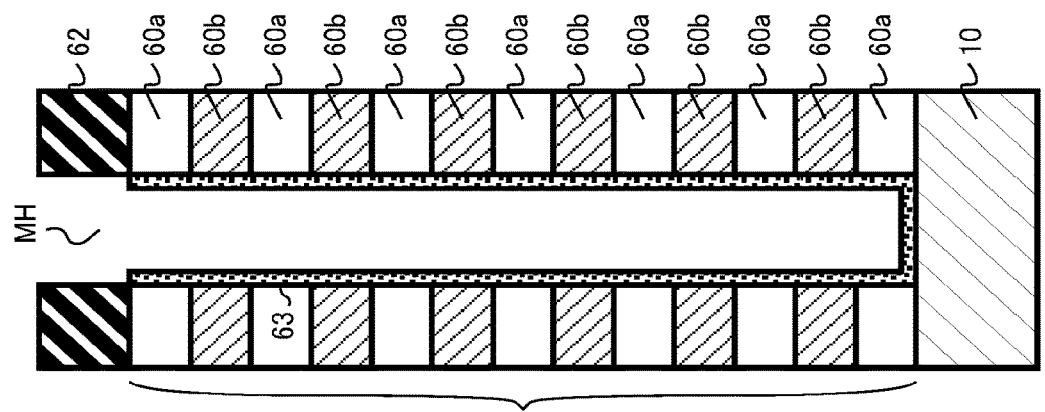
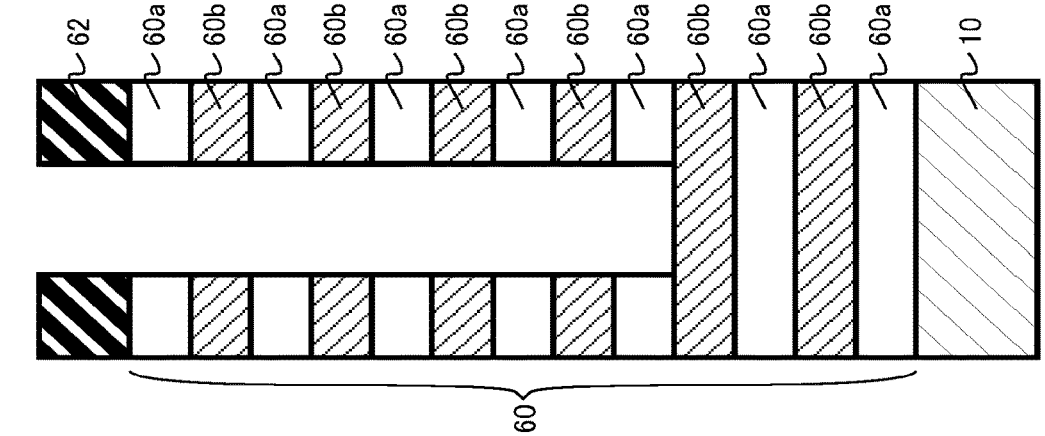
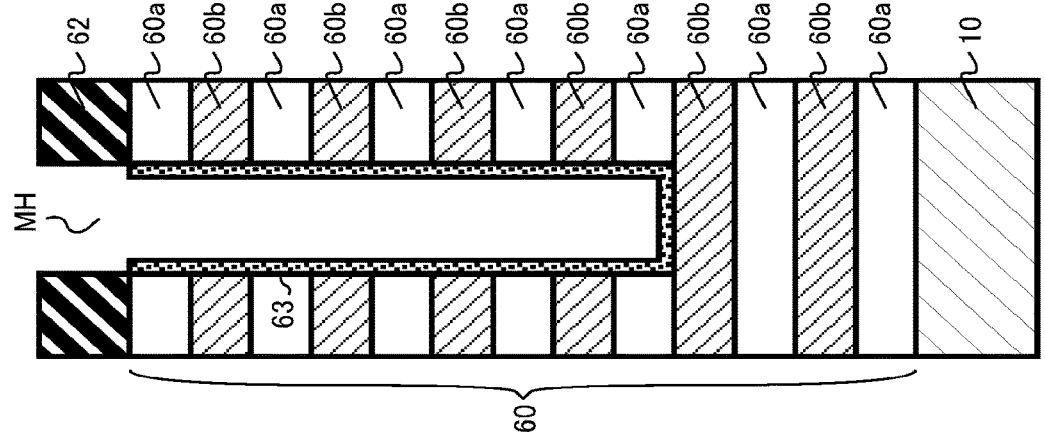

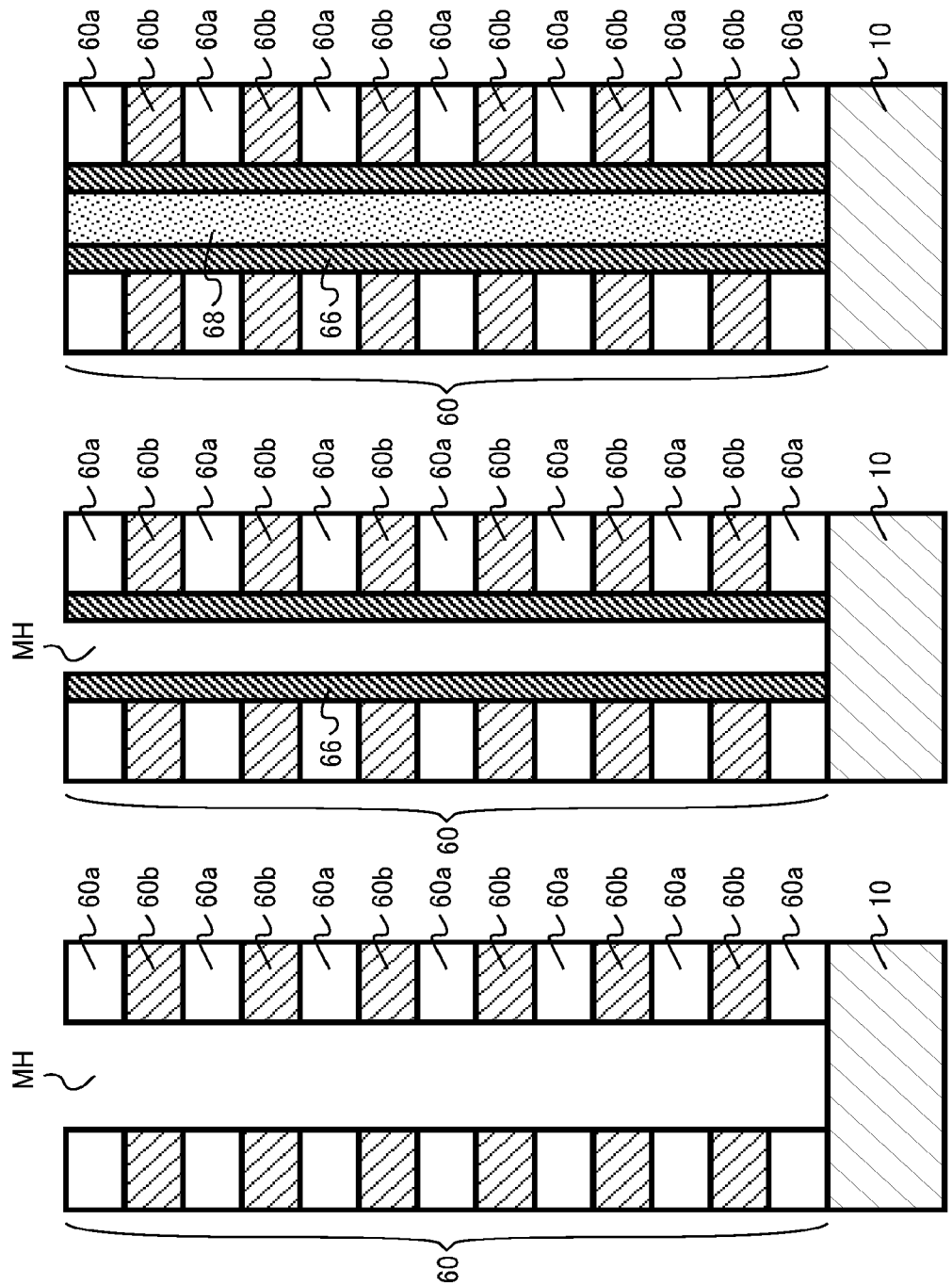

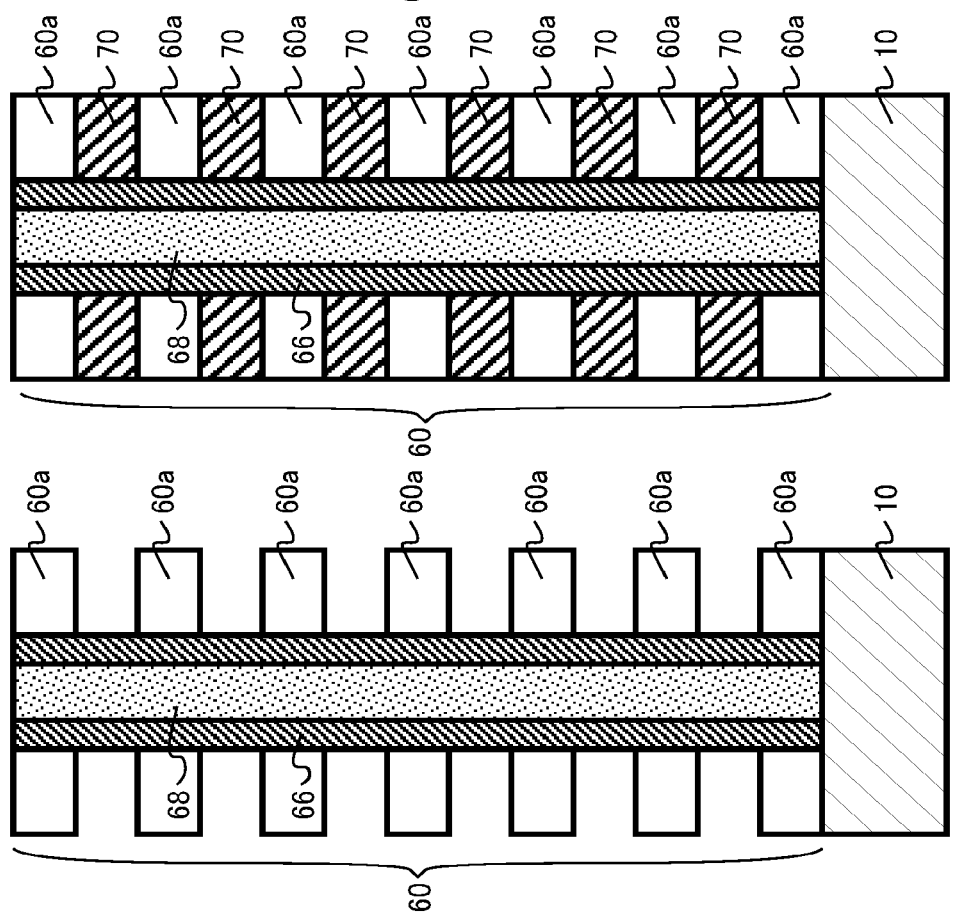

FIG.8
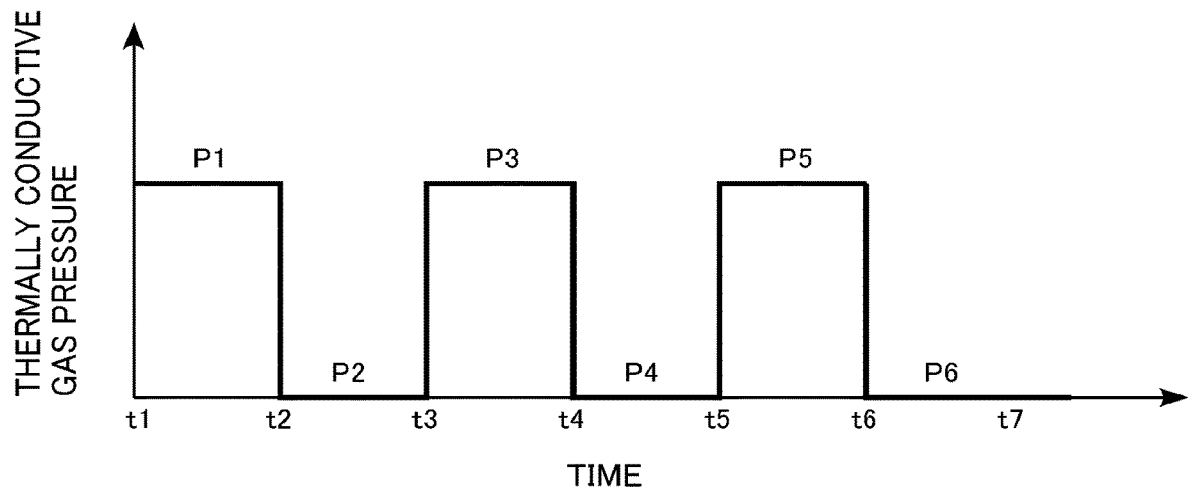
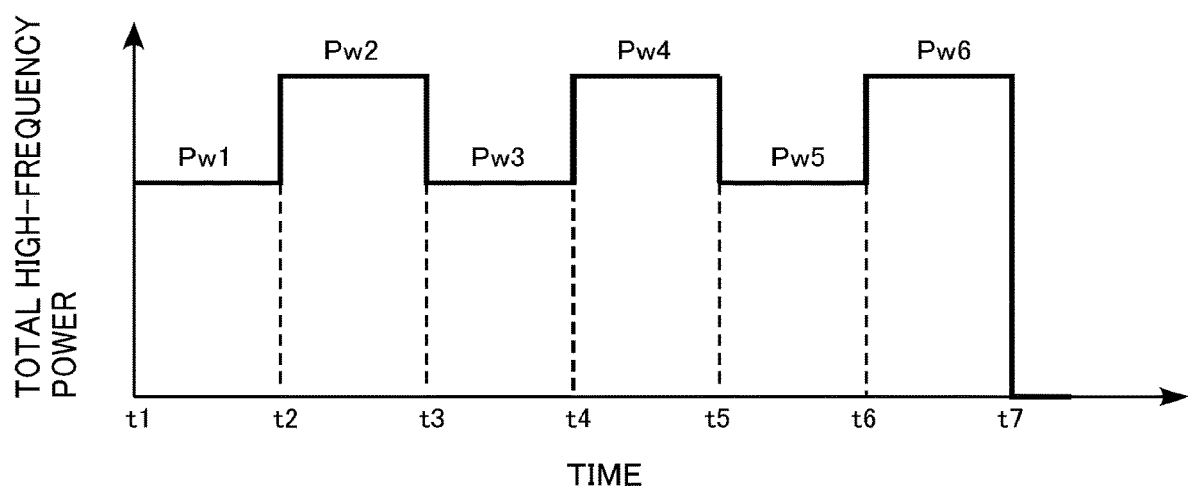
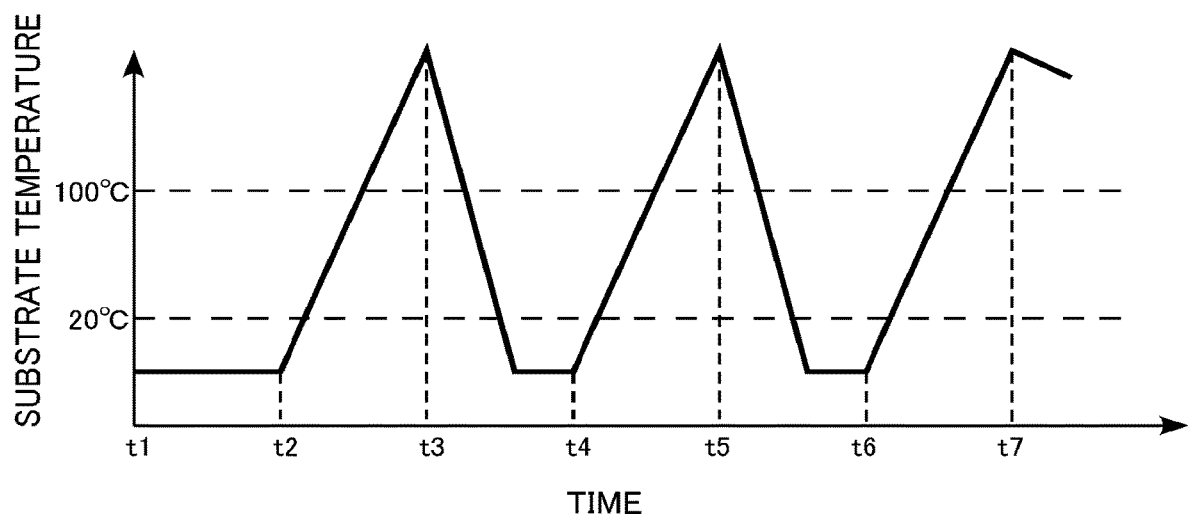

FIG.9
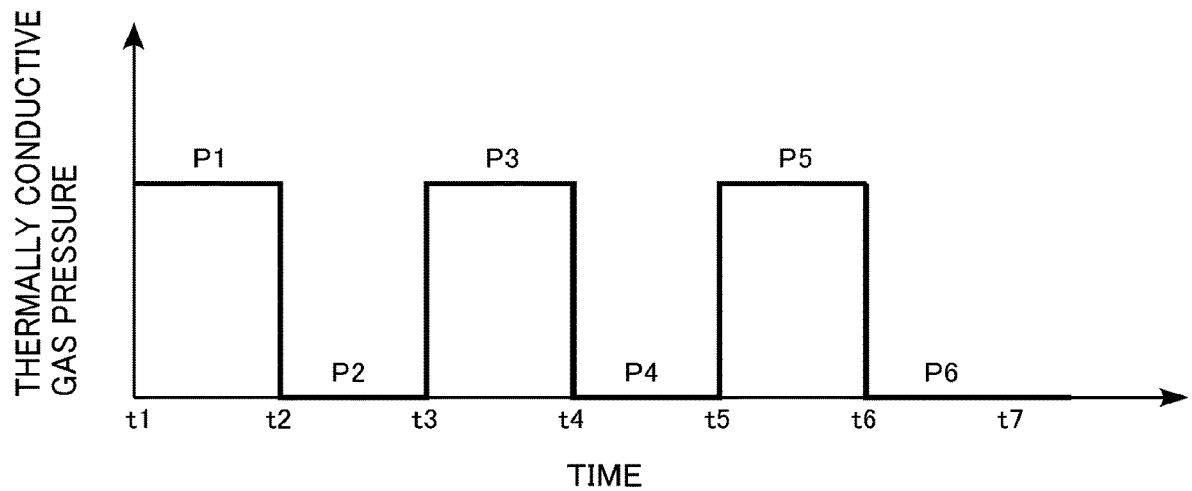
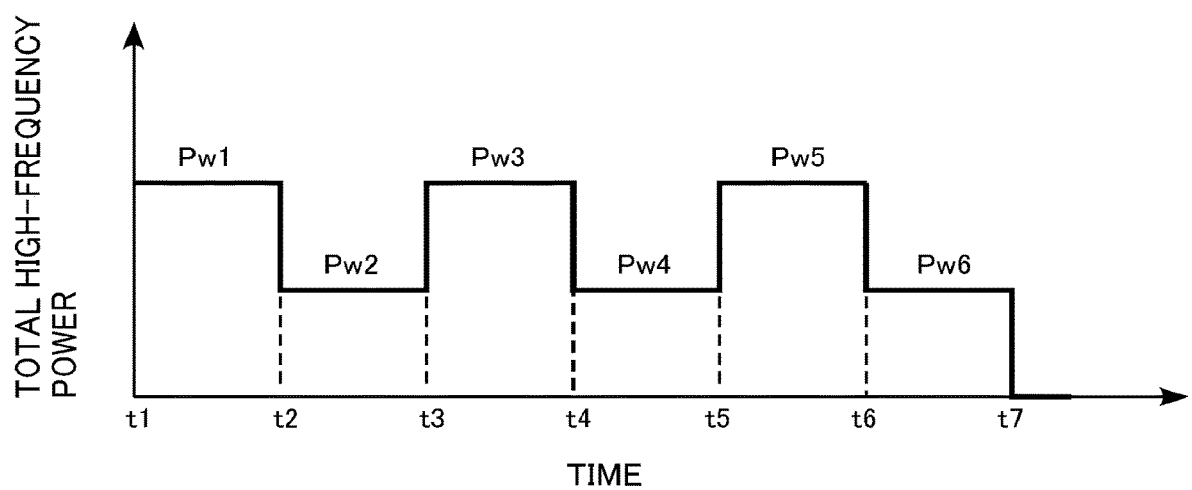
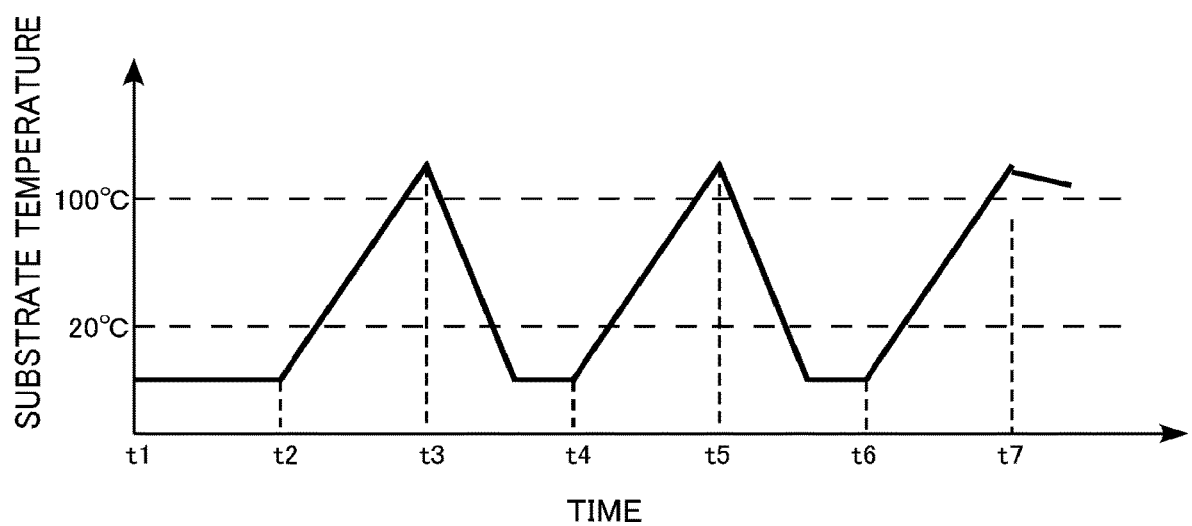

FIG.10
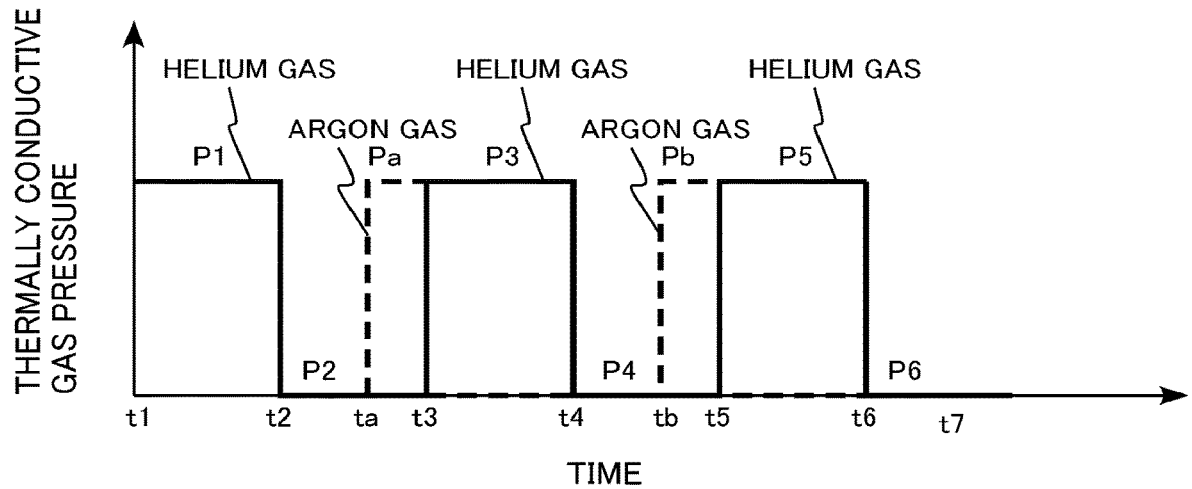
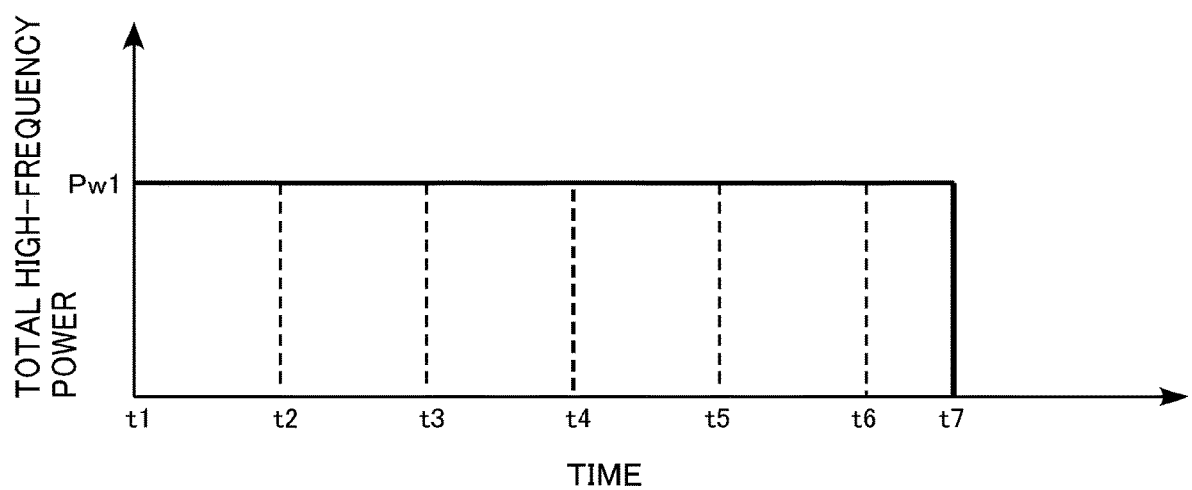
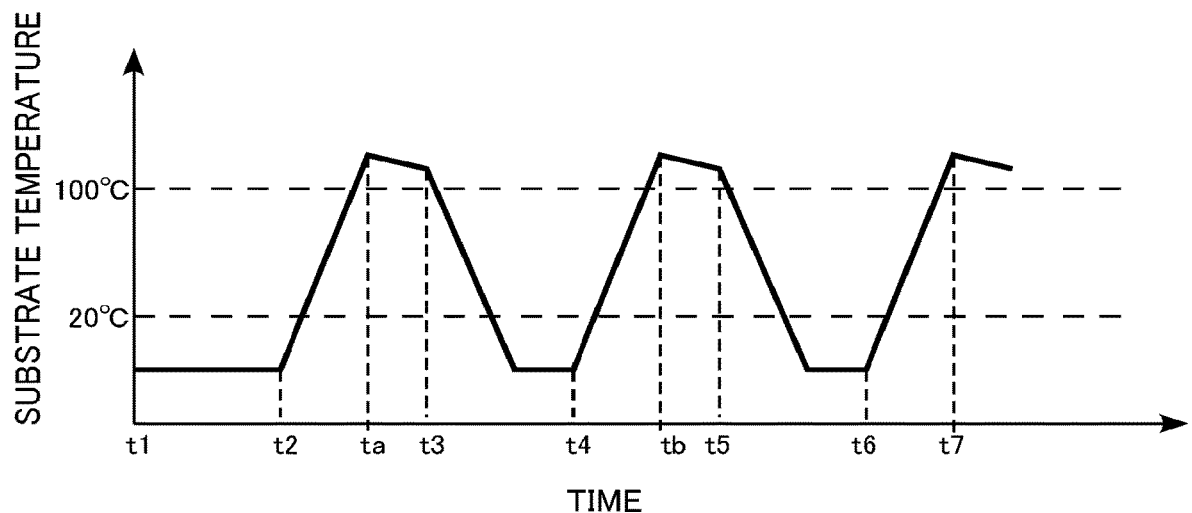

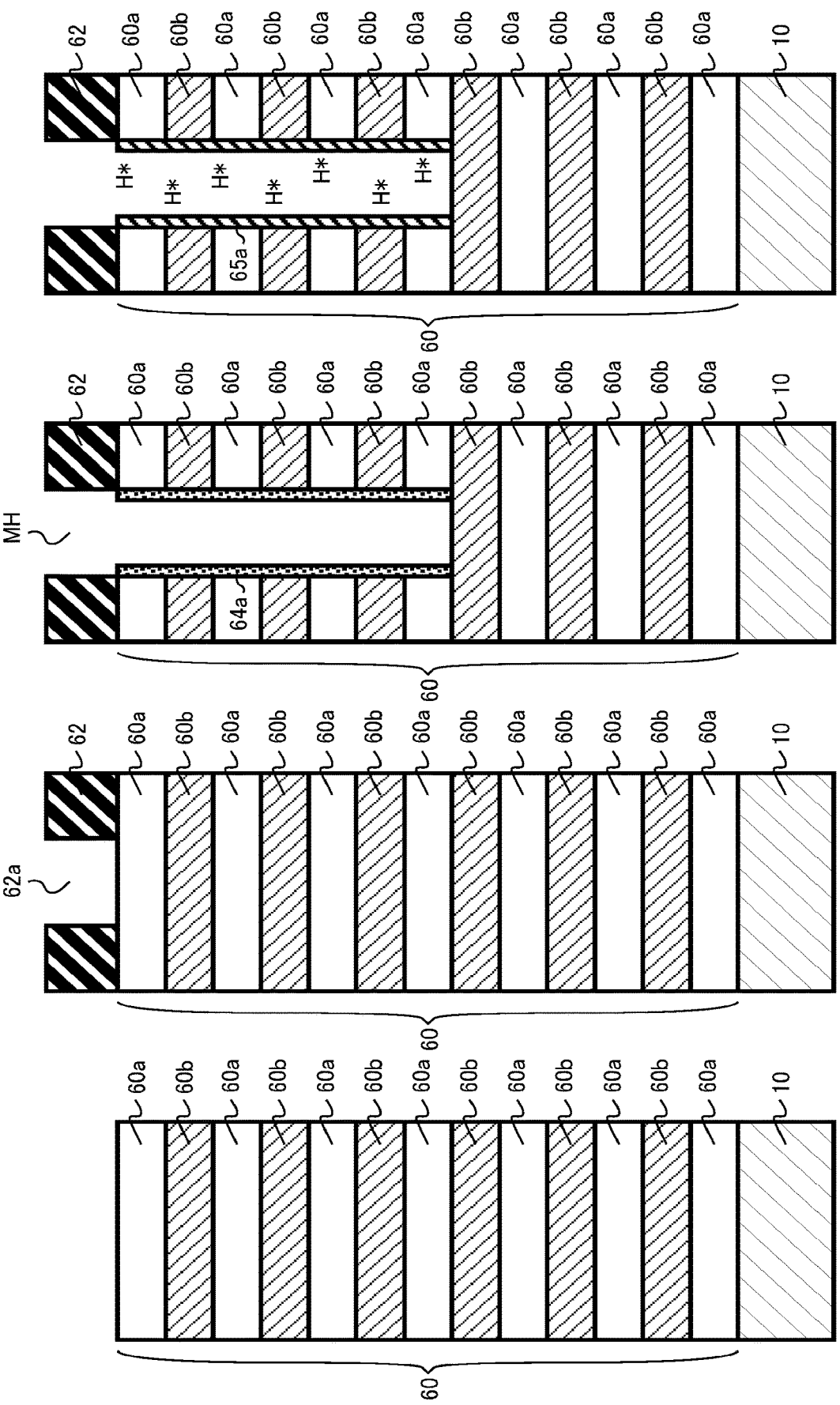

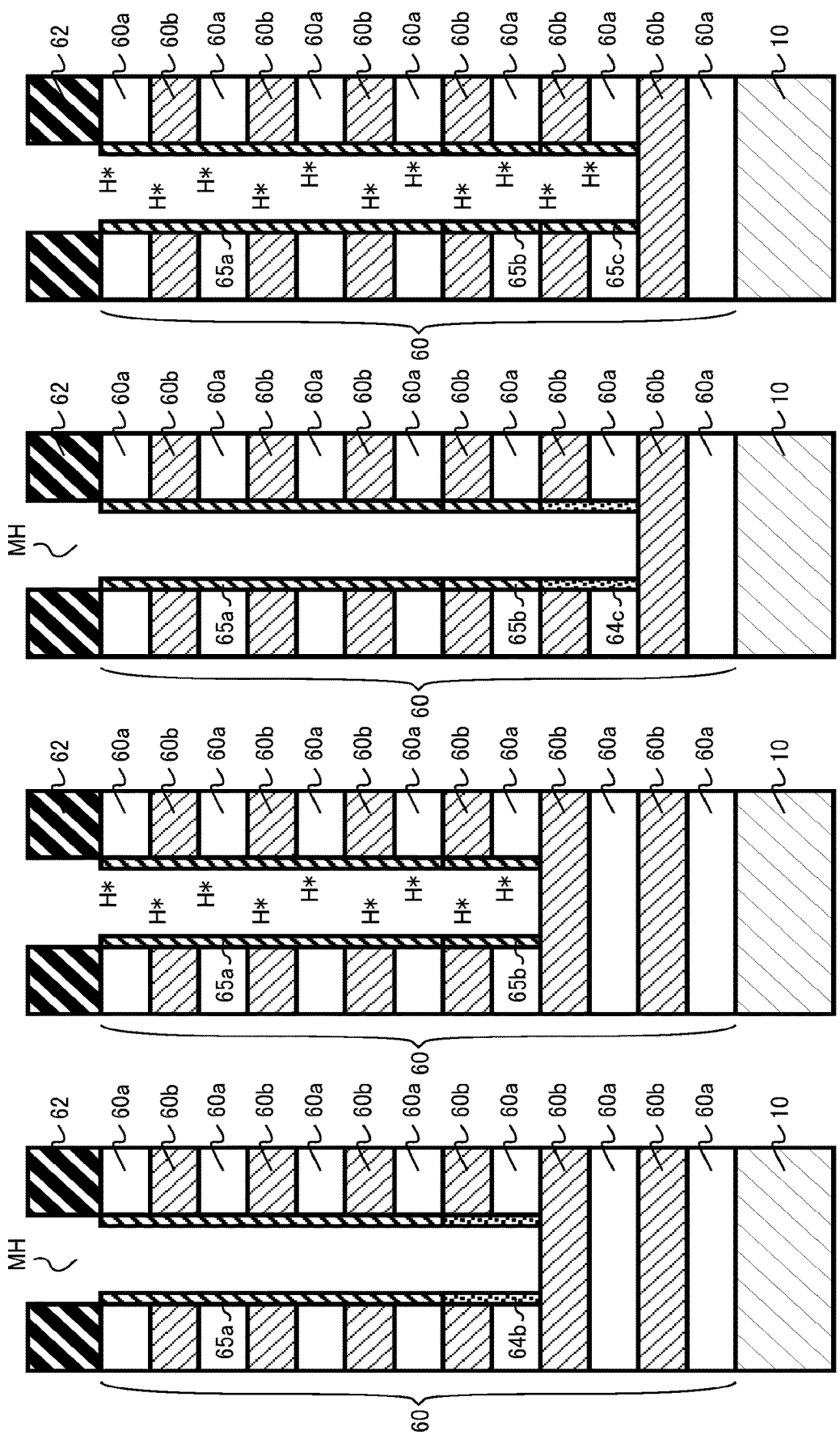

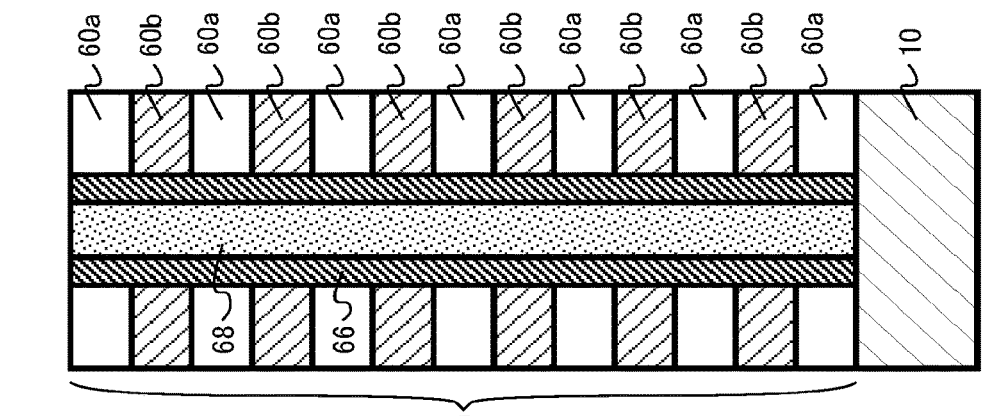
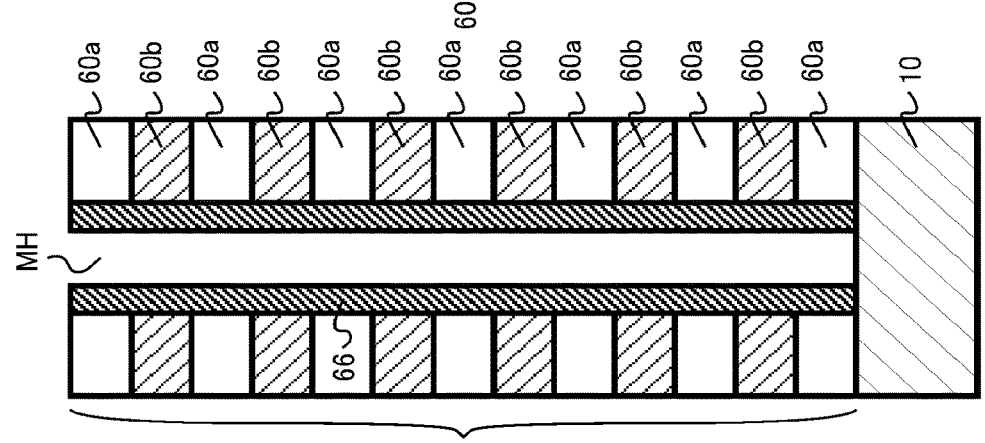
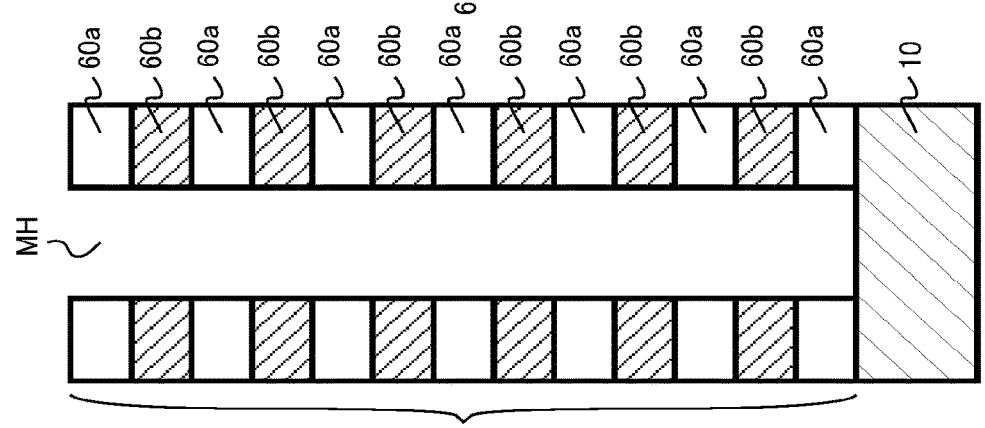
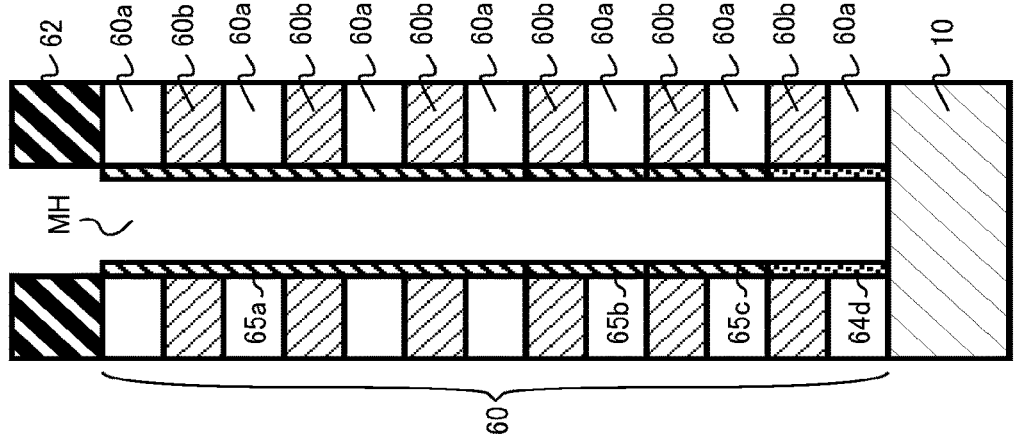

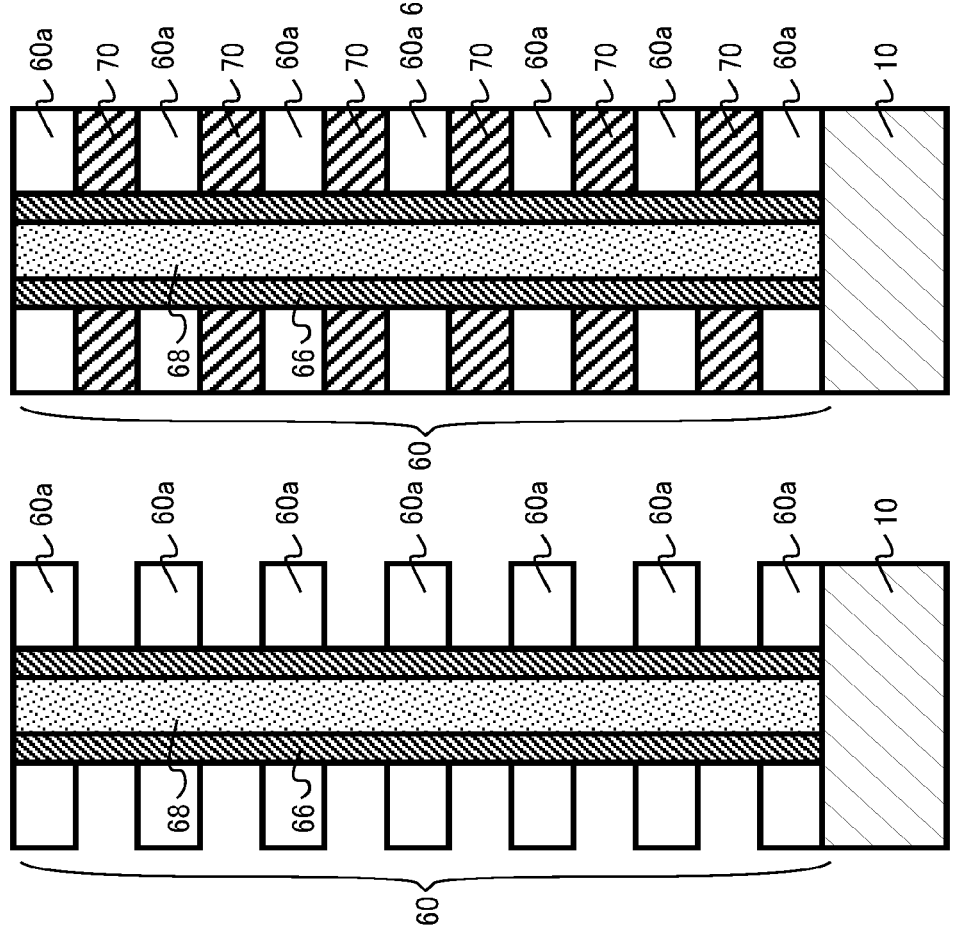

SEMICONDUCTOR MANUFACTURING APPARATUS AND METHOD FOR MANUFACTURING SEMICONDUCTOR DEVICE

CROSS-REFERENCE TO RELATED APPLICATION

This application is based upon and claims the benefit of priority from Japanese Patent Application No. 2021-099777, filed on Jun. 15, 2021, and Japanese Patent Application No. 2021-205698, filed on Dec. 20, 2021, the entire contents of which are incorporated herein by reference.

FIELD

Embodiments described herein relate generally to a semiconductor manufacturing apparatus and a method for manufacturing a semiconductor device.

BACKGROUND

Along with scaling-down of a semiconductor device, it is desired to process a layer to be processed with high accuracy when the layer to be processed is processed by dry etching. For example, when manufacturing a three-dimensional semiconductor memory, it is desired to form a memory hole having a high aspect ratio with high processing accuracy.

BRIEF DESCRIPTION OF THE DRAWINGS

FIG. 3 is an explanatory diagram of the method for manufacturing the semiconductor device according to the first embodiment;

FIGS. 4A, 4B, 4C, and 4D are schematic diagrams illustrating the method for manufacturing the semiconductor device of the first embodiment;

FIGS. 5A, 5B, 5C, and 5D are schematic diagrams illustrating the method for manufacturing the semiconductor device of the first embodiment;

FIGS. 6A, 6B, and 6C are schematic diagrams illustrating the method for manufacturing the semiconductor device of the first embodiment;

FIGS. 7A, 7B, and 7C are schematic diagrams illustrating the method for manufacturing the semiconductor device of the first embodiment;

FIG. 8 is an explanatory diagram of the method for manufacturing the semiconductor device according to a second embodiment;

FIG. 9 is an explanatory diagram of the method for manufacturing the semiconductor device according to a third embodiment;

FIG. 10 is an explanatory diagram of the method for manufacturing the semiconductor device according to a fourth embodiment;

FIGS. 12A, 12B, 12C, and 12D are schematic diagrams illustrating the method for manufacturing the semiconductor device of the fifth embodiment;

FIGS. 13A, 13B, 13C, and 13D are schematic diagrams illustrating the method for manufacturing the semiconductor device of the fifth embodiment;

FIGS. 14A, 14B, 14C, and 14D are schematic diagrams illustrating the method for manufacturing the semiconductor device of the fifth embodiment;

FIGS. 15A, 15B, and 15C are schematic diagrams illustrating the method for manufacturing the semiconductor device of the fifth embodiment;

DETAILED DESCRIPTION

Figure 1:
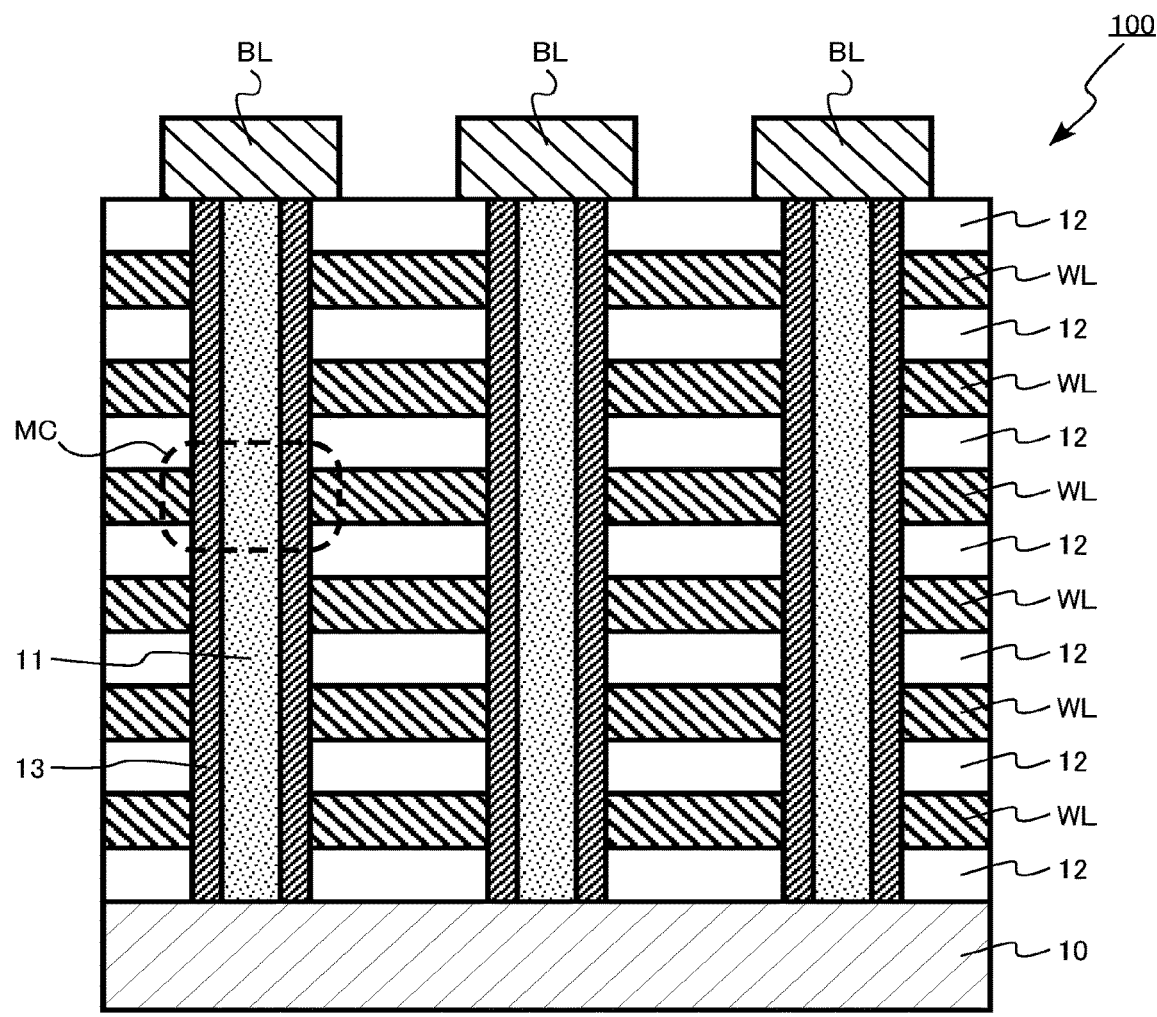
FIG. 1 is a schematic cross-sectional view of a semiconductor device manufactured by a method for manufacturing a semiconductor device according to a first embodiment.

A semiconductor manufacturing apparatus according to an embodiment includes: a chamber; a holder provided in the chamber and capable of adsorbing a substrate, the holder including a recess on a surface, a first hole provided in the recess, and a second hole provided in the recess; a first gas passage connected to the first hole; a second gas passage connected to the second hole; a first valve provided in the first gas passage; a second valve provided in the second gas passage; a first gas supply pipe that supplies a first gas to the recess; and a gas discharge pipe that discharges gas from the recess, wherein the first gas passage and the second gas passage are connected to the first gas supply pipe, or the first gas passage and the second gas passage are connected to the gas discharge pipe.

Hereinafter, embodiments of the present disclosure will be described with reference to the drawings. In the following description, the same or similar members and the like are denoted by the same reference numerals, and the description of the members and the like once described may be appropriately omitted.

In the present specification, the term "upper" or "lower" may be used for convenience. The term "upper" or "lower" is, for example, a term indicating a relative positional relationship in the drawings. The term "upper" or "lower" does not necessarily define a positional relationship with respect to gravity.

Qualitative analysis and quantitative analysis of the chemical composition of members constituting the semiconductor device in the present specification can be performed by, for example, secondary ion mass spectrometry (SIMS) or energy dispersive X-ray spectroscopy (EDX). For measuring the thickness of the members constituting the semiconductor device, the distance between the members, and the like, for example, a transmission electron microscope (TEM) or a scanning electron microscope (SEM) can be used.

Hereinafter, a semiconductor manufacturing apparatus and a method for manufacturing a semiconductor device according to embodiments will be described with reference to the drawings.

First Embodiment

A method for manufacturing a semiconductor device according to a first embodiment includes: placing a substrate having a layer to be processed on a holder provided in a chamber; supplying a first gas in contact with the substrate between the holder and the substrate; controlling a pressure of the first gas to a first pressure; performing a first etching process of etching the layer to be processed using a reactive ion etching method after controlling the pressure of the first gas to the first pressure; controlling a pressure of the first gas to a second pressure lower than the first pressure after the first etching process; performing a first reaction product removal to remove a reaction product on the layer to be processed after controlling the pressure of the first gas to the second pressure; controlling a pressure of the first gas to a third pressure higher than the second pressure after the first reaction product removal; and performing a second etching process of etching the layer to be processed using a reactive ion etching method after controlling the pressure of the first gas to the third pressure.

Further, the method for manufacturing the semiconductor device according to the first embodiment includes: placing a substrate having a layer to be processed on a holder provided in a chamber; supplying a first gas in contact with the substrate between the holder and the substrate; controlling a pressure of the first gas to a first pressure; performing a first etching process of etching the layer to be processed using a reactive ion etching method in a first state in which a temperature of the substrate is equal to or less than 60° C. after controlling the pressure of the first gas to the first pressure; controlling the pressure of the first gas to a second pressure lower than the first pressure after the first etching process; realizing a second state in which the temperature of the substrate is equal to or more than 100° C. after controlling the pressure of the first gas to the second pressure; controlling the pressure of the first gas to a third pressure higher than the second pressure after realizing the second state; and performing a second etching process of etching the layer to be processed using a reactive ion etching method in a third state in which the temperature of the substrate is equal to or less than 60° C. after controlling the pressure of the first gas to the third pressure.

FIG. 1 is a schematic cross-sectional view of a semiconductor device manufactured by a method for manufacturing a semiconductor device according to a first embodiment. The semiconductor device manufactured by the method for manufacturing the semiconductor device according to the first embodiment is a nonvolatile memory 100 in which memory cells are three-dimensionally disposed. FIG. 1 is a cross-sectional view of a memory cell array of a nonvolatile memory 100.

The nonvolatile memory 100 includes a silicon substrate 10, a channel layer 11, a plurality of interlayer insulating layers 12, a gate insulating layer 13, a plurality of word lines WL, and a plurality of bit lines BL. The nonvolatile memory 100 includes a plurality of memory cells MC disposed three-dimensionally. A region surrounded by a dotted line in FIG. 1 corresponds to one memory cell MC.

The channel layer 11 extends in the normal direction of the surface of the silicon substrate 10. The channel layer 11 is electrically connected to the silicon substrate 10. The channel layer 11 functions as a channel region of a transistor of the memory cell MC. The channel layer 11 is a semiconductor. The channel layer 11 is, for example, polycrystalline silicon.

The word lines WL are stacked in the normal direction of the surface of the silicon substrate 10. The word line WL functions as a gate electrode of a transistor of the memory cell MC. The word line WL is, for example, a plate-like conductor. The word line WL is tungsten (W), for example. The channel layer 11 penetrates the plurality of word lines WL.

The interlayer insulating layer 12 is provided between the word line WL and the word line WL. The interlayer insulating layer 12 electrically isolates the word line WL from the word line WL.

The bit line BL extends in a direction parallel to the surface of the silicon substrate 10. The bit line BL is electrically connected to the channel layer 11.

The gate insulating layer 13 is provided between the channel layer 11 and the word line WL. The gate insulating layer 13 includes, for example, a tunnel insulating film, a charge storage film, and a block insulating film (not illustrated). The tunnel insulating film is, for example, a silicon oxide film. The charge storage film is, for example, a silicon nitride film. The block insulating film is, for example, an aluminum oxide film.

The memory cell MC stores data by the charge stored in the charge storage film of the gate insulating layer 13. The threshold voltage of the transistor of the memory cell MC changes depending on the amount of charge stored in the charge storage film. Data stored in the memory cell MC is read by monitoring the current flowing between the word line WL and the bit line BL, which changes according to the threshold voltage of the transistor.

Figure 2:
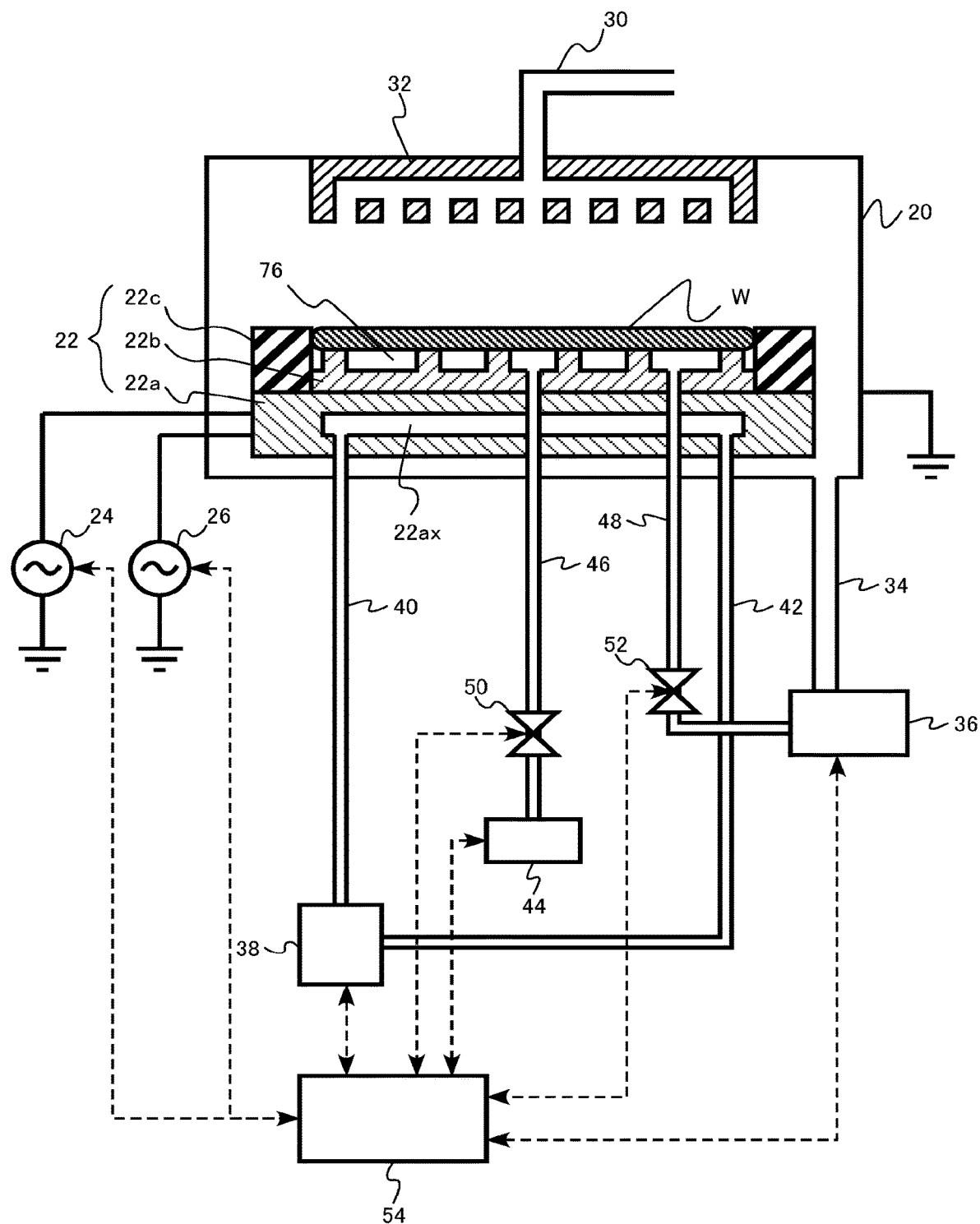
FIG. 2 is a schematic diagram of an example of a reactive ion etching apparatus used in the method for manufacturing the semiconductor device according to the first embodiment.

FIG. 2 is a schematic diagram of an example of a reactive ion etching apparatus used in the method for manufacturing the semiconductor device according to the first embodiment. The reactive ion etching apparatus (RIE apparatus) in FIG. 2 is a dual-frequency capacitively coupled plasma apparatus (CCP apparatus).

The RIE apparatus includes, for example, a chamber 20, a holder 22, a first high-frequency power source 24, a second high-frequency power source 26, a process gas supply pipe 30, a shower plate 32, a process gas discharge pipe 34, an exhaust device 36, a refrigerant unit 38, a refrigerant supply pipe 40, a refrigerant discharge pipe 42, a thermally conductive gas supply unit 44, a first thermally conductive gas supply pipe 46, a thermally conductive gas discharge pipe 48, a first main valve 50, a second main valve 52, and a control circuit 54.

The holder 22 is provided in the chamber 20. The holder 22 mounts a semiconductor wafer W, for example.

The holder 22 includes a support portion 22a, an electrostatic chuck 22b, and an outer circumferential ring 22c.

The support portion 22a functions as a lower electrode. High-frequency power is applied to the support portion 22a. The support portion 22a is, for example, metal.

A refrigerant flow path 22ax is provided inside the support portion 22a. The refrigerant flow path 22ax is a void. A refrigerant for cooling the support portion 22a is supplied to the refrigerant flow path 22ax. The refrigerant is, for example, a fluorine-based inert liquid.

The electrostatic chuck 22b is provided on the support portion 22a. The electrostatic chuck 22b has a function of adsorbing and fixing the semiconductor wafer W. The electrostatic chuck 22b is formed of, for example, a dielectric including an electrode therein. The dielectric is, for example, ceramics.

A thermally conductive gas region 76 is formed on the upper surface of the electrostatic chuck 22b. A thermally conductive gas for cooling the semiconductor wafer W is supplied between the electrostatic chuck 22b and the semiconductor wafer W. By fixing the semiconductor wafer W to the electrostatic chuck 22b, the thermally conductive gas region 76 becomes a closed space.

The thermally conductive gas contains, for example, helium (He), hydrogen (H), nitrogen (N), neon (Ne), argon (Ar), krypton (Kr), or xenon (Xe). The thermally conductive gas includes, for example, helium gas, hydrogen gas, nitrogen gas, neon gas, argon gas, krypton gas, or xenon gas.

The outer circumferential ring 22c is provided on the support portion 22a. The outer circumferential ring 22c is provided around the electrostatic chuck 22b. The outer circumferential ring 22c has a function of supporting the outer circumference of the semiconductor wafer W. The upper surface of the outer circumferential ring 22c is formed of, for example, silicon.

The first high-frequency power source 24 has a function of applying first high-frequency power to the inside of the chamber 20. The first high-frequency power source 24 applies high-frequency power between the support portion 22a of the holder 22 and the shower plate 32. The first high-frequency power applied to the chamber 20 using the first high-frequency power source 24 generates plasma in the chamber 20.

The first high-frequency power applied by the first high-frequency power source 24 is, for example, equal to or more than 50 W and equal to or less than 20,000 W. The first frequency applied by the first high-frequency power source 24 is, for example, equal to or more than 20 MHz and equal to or less than 200 MHz.

The second high-frequency power source 26 has a function of applying second high-frequency power to the inside of the chamber 20. The second high-frequency power source 26 applies the second high-frequency power to the support portion 22a of the holder 22. By applying the second high-frequency power to the holder 22, the energy of ions colliding with the semiconductor wafer W is controlled.

The second high-frequency power applied to the holder 22 is, for example, equal to or more than 50 W and equal to or less than 20,000 W. The second frequency applied to the holder 22 is lower than the first frequency applied to the chamber 20 by the first high-frequency power source 24. The second frequency applied to the holder 22 is, for example, equal to or more than 0.1 MHz and 20 MHz or less.

The process gas supply pipe 30 is provided above the chamber 20. An etching gas is supplied from the process gas supply pipe 30 to the shower plate 32.

The shower plate 32 is provided in the chamber 20. The shower plate 32 is provided above the holder 22.

An etching gas is supplied from the process gas supply pipe 30 to the shower plate 32. An etching gas is supplied into the chamber 20 from a plurality of gas supply ports provided in the shower plate 32.

The shower plate 32 also functions as an upper electrode of the first high-frequency power.

The process gas discharge pipe 34 is provided below the chamber 20. The etching gas and the reaction product not consumed in the etching reaction are discharged from the process gas discharge pipe 34 to the outside of the chamber 20.

The exhaust device 36 is connected to the process gas discharge pipe 34 and the thermally conductive gas discharge pipe 48. The exhaust device 36 is, for example, a vacuum pump.

The refrigerant unit 38 is connected to the refrigerant supply pipe 40. The refrigerant supply pipe 40 is connected to the refrigerant flow path 22ax. The refrigerant flow path 22ax is connected to the refrigerant discharge pipe 42. The refrigerant circulates in the refrigerant supply pipe 40, the refrigerant flow path 22ax, and the refrigerant discharge pipe 42 by the refrigerant unit 38.

The thermally conductive gas supply unit 44 is connected to the first thermally conductive gas supply pipe 46. The first thermally conductive gas supply pipe 46 is connected to the thermally conductive gas region 76. The first main valve 50 is provided in the first thermally conductive gas supply pipe 46. The thermally conductive gas is supplied to the thermally conductive gas region 76 by the thermally conductive gas supply unit 44.

The first main valve 50 is, for example, a flow control valve. By control using the first main valve 50, it is possible to control the pressure of the thermally conductive gas in the thermally conductive gas region 76. It is also possible to cut off the supply of thermally conductive gas to the thermally conductive gas region 76 using the first main valve 50.

The thermally conductive gas region 76 is connected to the thermally conductive gas discharge pipe 48. The thermally conductive gas discharge pipe 48 is connected to the exhaust device 36. The thermally conductive gas in the thermally conductive gas region 76 is discharged using the thermally conductive gas discharge pipe 48.

The second main valve 52 is provided in the thermally conductive gas discharge pipe 48. The discharge of the thermally conductive gas is controlled by means of the second main valve 52.

The control circuit 54 has a function of controlling operations of the first high-frequency power source 24, the second high-frequency power source 26, the exhaust device 36, the refrigerant unit 38, the thermally conductive gas supply unit 44, the first main valve 50, and the second main valve 52.

The semiconductor wafer W placed on the holder 22 is anisotropically etched using plasma generated between the shower plate 32 and the holder 22 in the chamber 20.

Next, an example of a method for manufacturing the semiconductor device according to the first embodiment will be described.

FIG. 3 is an explanatory diagram of the method for manufacturing the semiconductor device according to the first embodiment. FIGS. 4A, 4B, 4C, 4D, 5A, 5B, 5C, 5D, 6A, 6B, 6C, 7A, 7B, and 7C are schematic diagrams illustrating a method for manufacturing the semiconductor device of the first embodiment. FIGS. 4A, 4B, 4C, 4D, 5A, 5B, 5C, 5D, 6A, 6B, 6C, 7A, 7B, and 7C correspond to a portion including one channel layer 11 in FIG. 1.

First, a stacked body 60 is formed on the silicon substrate 10 (FIG. 4A). The silicon substrate 10 is a semiconductor wafer. The stacked body 60 is an insulating layer. The silicon substrate 10 is an example of the substrate. The stacked body 60 is an example of the layer to be processed. The silicon substrate 10 is an example of the semiconductor wafer W in FIG. 2.

The stacked body 60 has a structure in which silicon oxide films 60a and silicon nitride films 60b are alternately stacked. The silicon oxide film 60a and the silicon nitride film 60b are formed by, for example, a chemical vapor deposition method (CVD method).

A portion of the silicon oxide film 60a finally becomes the interlayer insulating layer 12.

Next, a carbon layer 62 having a hole pattern 62a is formed on the stacked body 60 (FIG. 4B). The carbon layer 62 is a mask layer. The carbon layer 62 is formed by, for example, a sputtering method. The hole pattern 62a is formed using, for example, a lithography method and a RIE method.

As the mask layer, for example, a resist layer, an insulating layer, or a metal layer can also be used.

Next, the silicon substrate 10 is carried into the chamber 20 of the RIE apparatus. The silicon substrate 10 is placed on the holder 22 provided in the chamber 20. The silicon substrate 10 is an example of a substrate.

In the chamber 20 of the RIE apparatus, a memory hole MH is formed using the carbon layer 62 as a mask using a reactive ion etching method (FIGS. 4C to 5D). The etching of the memory hole MH is performed while periodically changing the pressure of the thermally conductive gas for cooling the silicon substrate 10. The memory hole MH is an example of a recess.

FIG. 3 illustrates the relationship between the thermally conductive gas pressure, the total high-frequency power, and the wafer temperature, and the etching time when the memory hole MH is formed.

At time t1, the thermally conductive gas is supplied to the thermally conductive gas region 76 between the holder 22 and the silicon substrate 10. The thermally conductive gas is, for example, helium gas. The helium gas is in contact with the back surface of the silicon substrate 10. The helium gas is an example of the first gas.

At time t1, the pressure of the helium gas is controlled to the first pressure P1. The pressure of the helium gas is controlled by, for example, flow rate control using the first main valve 50. By adjusting the opening degree of the first main valve 50, the pressure of the helium gas is controlled to the first pressure P1.

The first pressure P1 is, for example, equal to or more than 133 Pa (1 Torr) and 13,332 Pa equal to or less than (100 Torr).

At time t1, high-frequency power is applied to the inside of the chamber 20. For example, the first high-frequency power source 24 is used to apply the first high-frequency power between the support portion 22a of the holder 22 and the shower plate 32. For example, the second high-frequency power source 26 is used to apply the second high-frequency power to the support portion 22a of the holder 22. The sum of the first high-frequency power and the second high-frequency power is referred to as total high-frequency power.

Further, at time t1, an etching gas is supplied into the chamber 20. The etching gas is supplied into the chamber 20 from the process gas supply pipe 30 through the shower plate 32.

The etching gas contains, for example, carbon (C) and fluorine (F). The etching gas contains, for example, CxHyFz (x is an integer of equal to or more than 1, y is an integer of equal to or more than 0, and z is an integer of equal to or more than 1). The etching gas includes, for example, $C_4F_6$, $C_4F_8$, and $CH_2F_2$.

The etching gas contains, for example, oxygen gas. The etching gas contains, for example, hydrogen bromide gas (HBr).

At time t1, the refrigerant is supplied to the refrigerant flow path 22ax. The refrigerant is, for example, a fluorine-based inert liquid. When the refrigerant is supplied to the refrigerant flow path 22ax, the temperatures of the support portion 22a and the electrostatic chuck 22b of the holder 22 decrease. The temperature of the support portion 22a of the holder 22 and the electrostatic chuck 22b is, for example, equal to or more than −196° C. and equal to or less than 60° C.

After the pressure of the helium gas is controlled to the first pressure P1, the first etching process for etching the stacked body 60 is performed using the reactive ion etching method (FIG. 4C). A first etching process for etching the stacked body 60 is performed between time t1 and time t2. In the first etching process, the memory hole MH does not penetrate the stacked body 60.

During the first etching process, the temperature of the silicon substrate 10 is, for example, equal to or more than −150° C. and equal to or less than 60° C. During the first etching process, for example, a first state in which the temperature of the silicon substrate 10 is equal to or more than −150° C. and equal to or less than 60° C. is realized.

During the first etching process, a reaction product 63 is formed on the stacked body 60. During the first etching process, the reaction product 63 is formed on the bottom surface and the side surfaces of the memory hole MH. The reaction product 63 formed during the first etching process is an example of the first reaction product.

The reaction product 63 contains, for example, silicon (Si), nitrogen (N), and fluorine (F). The reaction product 63 includes, for example, ammonium fluorosilicate. The reaction product 63 includes, for example, $(NH_4)_2SiF_6$.

After the first etching process, at time t2, the pressure of the helium gas is controlled to the second pressure P2. After the first etching process, at time t2, the pressure of the helium gas is changed from the first pressure P1 to the second pressure P2. The second pressure P2 is lower than the first pressure P1.

The pressure of the helium gas is controlled by, for example, flow rate control using the first main valve 50. For example, the first main valve 50 is closed to block the inflow of the helium gas into the thermally conductive gas region 76. For example, by closing the first main valve 50, the second pressure P2 approaches vacuum.

The second pressure P2 is, for example, equal to or more than 0 Pa and equal to or less than 13.3 Pa (0.1 Torr). The second pressure P2 is, for example, equal to or less than 1/100 of the first pressure P1.

After controlling the pressure of the helium gas to the second pressure P2, a first reaction product removal of removing the reaction product 63 on the stacked body 60 is performed (FIG. 4D). Between time t2 and time t3, the reaction product 63 on the stacked body 60 is removed. The reaction product 63 on the bottom surface and the side surfaces of the memory hole MH is removed by the first reaction product removal.

During the first reaction product removal, the temperature of the silicon substrate 10 is, for example, equal to or more than 100° C. and equal to or less than 300° C. During the first reaction product removal, for example, a second state in which the temperature of the silicon substrate 10 is equal to or more than 100° C. and equal to or less than 300° C. is realized.

At time t2, after the pressure of the helium gas is controlled from the first pressure P1 to the second pressure P2, the temperature of the silicon substrate 10 rises, and the second state in which the temperature of the silicon substrate 10 is equal to or more than 100° C. is realized. As the pressure of the helium gas decreases, the propagation of heat in the helium gas is suppressed. Heat dissipation from the silicon substrate 10 to the holder 22 via the helium gas is suppressed, and the temperature of the silicon substrate 10 rises.

The decomposition reaction of the reaction product 63 is promoted as the temperature is higher, for example, and the removal from the memory hole MH is promoted. The decomposition reaction of the reaction product 63 is promoted, for example, when the temperature of the silicon substrate 10 is equal to or more than 100° C. In particular, when the reaction product 63 is ammonium fluorosilicate, the decomposition reaction is promoted as the temperature of the silicon substrate 10 becomes equal to or more than 100° C.

For example, during the first reaction product removal, the supply of the etching gas into the chamber 20 is continued.

After the first reaction product removal, at time t3, the pressure of the helium gas is controlled to a third pressure P3. After the first reaction product removal, at time t3, the pressure of the helium gas is changed from the second pressure P2 to the third pressure P3. After the second state is realized, the pressure of the helium gas is controlled to the third pressure P3.

The third pressure P3 is higher than the second pressure P2. The pressure of the helium gas is controlled by, for example, flow rate control using the first main valve 50. For example, by opening the first main valve 50, the inflow of the helium gas into the thermally conductive gas region 76 is started. By adjusting the opening degree of the first main valve 50, the pressure of the helium gas is controlled to the third pressure P3.

The third pressure P3 is, for example, equal to or more than 133 Pa (1 Torr) and 13,332 Pa equal to or less than (100 Torr). The third pressure P3 is, for example, equal to the first pressure P1.

After the pressure of the helium gas is controlled to the third pressure P3, the second etching process of etching the stacked body 60 is performed using the reactive ion etching method (FIG. 5A). During the second etching process, the supply of the etching gas into the chamber 20 is continued.

Between time t3 and time t4, a second etching process for etching the stacked body 60 is performed. In the second etching process, the bottom surface of the memory hole MH is etched. During the second etching process, the memory hole MH becomes deep. In the second etching process, the memory hole MH does not penetrate the stacked body 60.

As the pressure of the helium gas increases from the second pressure P2 to the third pressure P3, the propagation of heat in the helium gas is promoted. Heat dissipation from the silicon substrate 10 to the holder 22 via the helium gas is promoted, and the temperature of the silicon substrate 10 decreases.

During the second etching process, the temperature of the silicon substrate 10 is, for example, equal to or more than −150° C. and equal to or less than 60° C. During the second etching process, for example, a third state in which the temperature of the silicon substrate 10 is equal to or more than −150° C. and equal to or less than 60° C. is realized.

During the second etching process, the reaction product 63 is formed on the stacked body 60. During the second etching process, the reaction product 63 is formed on the bottom surface and the side surfaces of the memory hole MH. The reaction product 63 formed during the second etching process is an example of the second reaction product.

After the second etching process, at time t4, the pressure of the helium gas is controlled to the fourth pressure P4. After the second etching process, at time t4, the pressure of the helium gas is changed from the third pressure P3 to the fourth pressure P4. The fourth pressure P4 is lower than the third pressure P3. The fourth pressure P4 is, for example, equal to the second pressure P2.

The fourth pressure P4 is, for example, equal to or more than 0 Pa and equal to or less than 13.3 Pa (0.1 Torr). The fourth pressure P4 is, for example, 1/100 or less of the third pressure P3.

After controlling the pressure of the helium gas to a fourth pressure P4, a second reaction product removal of removing reaction product 63 on the stacked body 60 is performed (FIG. 5B). Between time t4 and time t5, the reaction product 63 on the stacked body 60 is removed. The reaction product 63 on the bottom surface and the side surfaces of the memory hole MH is removed by the second reaction product removal.

During the second reaction product removal, the temperature of the silicon substrate 10 is, for example, equal to or more than 100° C. and equal to or less than 300° C. During the second reaction product removal, for example, a fourth state in which the temperature of the silicon substrate 10 is equal to or more than 100° C. and equal to or less than 300° C. is realized.

At time t4, after the pressure of the helium gas is changed from the third pressure P3 to the fourth pressure P4, the temperature of the silicon substrate 10 increases, and a fourth state in which the temperature of the silicon substrate 10 is equal to or more than 100° C. and equal to or less than 300° C. is realized.

For example, during the second reaction product removal, the supply of the etching gas into the chamber 20 is continued.

After the second reaction product removal, at time t5, the pressure of the helium gas is controlled to a fifth pressure P5. After the second reaction product removal, at time t5, the pressure of the helium gas is changed from the fourth pressure P4 to the fifth pressure P5. After the fourth state is realized, the pressure of the helium gas is controlled to the fifth pressure P5.

The fifth pressure P5 is higher than the fourth pressure P4. The fifth pressure P5 is, for example, equal to or more than 133 Pa (1 Torr) and 13,332 Pa equal to or less than (100 Torr). The fifth pressure P5 is equal to, for example, the first pressure P1 and the third pressure P3.

After the pressure of the helium gas is controlled to the fifth pressure P5, a third etching process of etching the stacked body 60 is performed using the reactive ion etching method (FIG. 5C). During the fifth etching, the supply of the etching gas into the chamber 20 is continued.

Between time t5 and time t6, the third etching process for etching the stacked body 60 is performed. In the third etching process, the bottom surface of the memory hole MH is etched. During the third etching process, the memory hole MH becomes deep. In the third etching process, the memory hole MH penetrates the stacked body 60 and reaches the silicon substrate 10. The aspect ratio of the memory hole MH penetrating the stacked body 60 is, for example, equal to or more than 30.

As the pressure of the helium gas increases from the fourth pressure P4 to the fifth pressure P5, the temperature of the silicon substrate 10 decreases.

During the third etching process, the temperature of the silicon substrate 10 is, for example, equal to or more than −150° C. and equal to or less than 60° C. During the third etching process, for example, a fifth state in which the temperature of the silicon substrate 10 is equal to or more than −150° C. and equal to or less than 60° C. is realized.

During the third etching process, the reaction product 63 is formed on the stacked body 60. During the third etching process, the reaction product 63 is formed on the bottom surface and the side surfaces of the memory hole MH.

After the third etching process, at time t6, the pressure of the helium gas is controlled to the sixth pressure P6. After the third etching process, at time t6, the pressure of the helium gas is changed from the fifth pressure P5 to the sixth pressure P6. The sixth pressure P6 is lower than the fifth pressure P5. The sixth pressure P6 is equal to, for example, the second pressure P2 and the fourth pressure P4.

The sixth pressure P6 is, for example, equal to or more than 0 Pa and equal to or less than 13.3 Pa (0.1 Torr). The sixth pressure P6 is, for example, equal to or less than 1/100 of the fifth pressure P5.

After controlling the pressure of the helium gas to a sixth pressure P6, a third reaction product removal of removing the reaction product 63 on the stacked body 60 is performed (FIG. 5D). After time t6, the reaction product 63 on the stacked body 60 is removed. The reaction products 63 on the bottom surface and the side surfaces of the memory hole MH are removed by the third reaction product removal.

During the third reaction product removal, the temperature of the silicon substrate 10 is, for example, equal to or more than 100° C. and equal to or less than 300° C. During the third reaction product removal, for example, a sixth state in which the temperature of the silicon substrate 10 is equal to or more than 100° C. and equal to or less than 300° C. is realized.

At time t6, after the pressure of the helium gas is changed from the fifth pressure P5 to the sixth pressure P6, the temperature of the silicon substrate 10 increases, and the sixth state in which the temperature of the silicon substrate 10 is equal to or more than 100° C. is realized.

For example, during the third reaction product removal, the supply of the etching gas into the chamber 20 is continued.

After the third reaction product removal, at time t7, the application of the high-frequency power to the inside of the chamber 20 is stopped. Further, at time t7, the supply of the etching gas into the chamber 20 is blocked.

At time t7, the etching of the memory hole MH ends.

After the third reaction product removal, the pressure of the helium gas may be increased to a pressure higher than the sixth pressure P6, and the etching of the memory hole MH may be terminated in a state in which the temperature of the silicon substrate 10 is lowered.

As illustrated in FIG. 3, the time during which the pressure of the helium gas is controlled to the first pressure P1 at the time of etching the memory hole MH is td1. The time during which the pressure of the helium gas is controlled to the second pressure P2 at the time of etching the memory hole MH is td2. The time during which the pressure of the helium gas is controlled to the third pressure P3 at the time of etching the memory hole MH is td3. The time during which the pressure of the helium gas is controlled to the fourth pressure P4 at the time of etching the memory hole MH is td4. The time during which the pressure of the helium gas is controlled to the fifth pressure P5 at the time of etching the memory hole MH is td5.

For example, time td1, time td3, and time td5 are equal. Furthermore, for example, time td2 and time td4 are equal.

Furthermore, for example, time td1 and time td2 are equal. In addition, for example, time td3 is equal to time td4.

In addition, for example, time td2 is shorter than time td1. In addition, for example, time td4 is shorter than time td3.

In addition, for example, time td2 is longer than time td1. In addition, for example, time td4 is longer than time td3.

When the time during which the pressure of the helium gas is controlled to the second pressure P2 is td2 (sec), the temperature of the holder 22 in the first etching process is T (° C.), the ratio of the surface area of the silicon substrate 10 to the sum of the area of the silicon substrate 10 and the inner wall area of the chamber 20 is k, the high-frequency power applied to the inside of the chamber 20 while the pressure of the helium gas is controlled to the second pressure P2 is Pw (W), the mass of the silicon substrate 10 is m (kg), and the specific heat capacity of the silicon substrate 10 is c (J/(kg·° C.)), for example, the following inequality (1) is satisfied.

$$td2 \geq (100-T)/\{(k \times Pw)/(m \times c)\} \qquad (1)$$

Note that the temperature T of the holder 22 is a set temperature of the electrostatic chuck 22b. During the etching of the memory hole MH, the set temperature of the electrostatic chuck 22b is maintained at a constant temperature. The temperature of the electrostatic chuck 22b is measured by, for example, a thermometer not illustrated in FIG. 2.

The ratio k is expressed by the following formula.

$$k = \text{(Surface area of silicon substrate)}/[\text{(Surface area of silicon substrate)} + \text{(Inner wall area of chamber)}]$$

In addition, the high-frequency power Pw is total high-frequency power that is the sum of the first high-frequency power and the second high-frequency power.

Similarly, for example, the following inequality (2) is satisfied for time td4 during which the pressure of helium gas is controlled to the fourth pressure P4.

$$td4 \geq (100-T)/\{(k \times Pw)/(m \times c)\} \qquad (2)$$

After the etching of the memory hole MH is completed, the silicon substrate 10 is carried out from the chamber 20 of the RIE apparatus.

Next, the carbon layer 62 is removed (FIG. 6A). The carbon layer 62 is formed by, for example, an asking process using oxygen plasma.

Next, a stacked insulating layer 66 is formed in the memory hole MH (FIG. 6B). The stacked insulating layer 66 has, for example, a stacked structure of a silicon oxide film, a silicon nitride film, and an aluminum oxide film. The stacked insulating layer 66 finally becomes the gate insulating layer 13.

Next, a polycrystalline silicon layer 68 is formed in the memory hole MH (FIG. 6C). The polycrystalline silicon layer 68 finally becomes the channel layer 11.

Next, the silicon nitride film 60b is selectively removed (FIG. 7A).

Next, a first tungsten layer 70 is formed in the region from which the silicon nitride film 60b has been removed (FIG. 7B). The first tungsten layer 70 finally becomes the word line WL.

Next, a second tungsten layer 69 is formed on the polycrystalline silicon layer 68 (FIG. 7C). The second tungsten layer 69 finally becomes the bit line BL.

The nonvolatile memory 100 illustrated in FIG. 1 is manufactured by the above manufacturing method.

Next, functions and effects of the method for manufacturing the semiconductor device according to the first embodiment will be described.

In the nonvolatile memory 100 in which the memory cells are three-dimensionally disposed, in order to increase the capacity of the memory, for example, the hole diameter of the memory hole is reduced and the number of stacked word lines WL is increased. When the hole diameter of the memory hole is reduced and the number of stacked word lines WL is increased, it is necessary to form a memory hole having a high aspect ratio ((depth of memory hole)/(hole diameter of memory hole)).

When the aspect ratio of the memory hole increases, there arises a problem that the shape of the memory hole cannot be processed into a desired shape. In other words, there is a problem that the processing accuracy of the shape of the memory hole decreases.

For example, the shape of the cross-section perpendicular to the depth direction of the memory hole may be distorted from a desired shape. In addition, for example, etching in the depth direction of the memory hole may not proceed vertically, and the shape in the depth direction of the memory hole may be a curved shape.

One of the causes of the decrease in the processing accuracy of the shape of the memory hole as described above is considered to be a reaction product formed on the bottom surface and the side surfaces of the memory hole during etching. That is, since the reaction products formed on the bottom surface and the side surfaces of the memory hole inhibit etching, it is considered that the processing accuracy of the shape of the memory hole decreases.

For example, the etching speed of the memory hole increases as the temperature of the substrate having the layer to be processed decreases. From the viewpoint of improving the throughput of etching of the memory hole, it is desirable to lower the temperature of the substrate having the layer to be processed. From the viewpoint of improving the throughput of etching of the memory hole, the temperature of the substrate having the layer to be processed is preferably equal to or less than 60° C., more preferably equal to or less than 20° C., and still more preferably equal to or less than 0° C.

On the other hand, when the decomposition temperature of the reaction product formed at the time of etching the memory hole is high, the reaction product is not easily decomposed by lowering the temperature of the substrate. Therefore, when the temperature of the substrate is lowered, etching may be further inhibited by the reaction product. As the etching is further inhibited, the processing accuracy of the shape of the memory hole may be further deteriorated.

In the method for manufacturing the semiconductor device according to the first embodiment, when the memory hole MH is formed, the temperature of the silicon substrate 10 having the stacked body 60 which is a layer to be processed is changed. That is, the low-temperature state of the silicon substrate 10 and the high-temperature state of the silicon substrate 10 are alternately repeated.

The first state, the third state, and the fifth state correspond to the low-temperature state. The second state, the fourth state, and the sixth state correspond to the high-temperature state.

When the silicon substrate 10 is in a low-temperature state, the etching speed of the memory hole MH increases, and the etching of the stacked body 60 mainly proceeds. On the other hand, when the silicon substrate 10 is in a high-temperature state, the decomposition reaction of the reaction product 63 formed on the bottom surface and the side surfaces of the memory hole MH is promoted, and the decomposition of the reaction product 63 mainly proceeds.

When the silicon substrate 10 shifts from the high-temperature state to the low-temperature state, the reaction product 63 is removed, so that the inhibition of etching by the reaction product 63 hardly occurs. Therefore, the processing accuracy of the shape of the memory hole is improved.

In the method for manufacturing the semiconductor device according to the first embodiment, the memory holes MH are formed while the low-temperature state of the silicon substrate 10 and the high-temperature state of the silicon substrate 10 are alternately repeated, so that the processing accuracy of the shape of the memory holes is improved. In addition, the throughput of etching of the memory hole MH is improved.

In the method for manufacturing the semiconductor device according to the first embodiment, the transition between the high-temperature state and the low-temperature state of the silicon substrate 10 is performed by changing the pressure of the thermally conductive gas. The thermally conductive gas is, for example, helium gas.

By changing the pressure of the thermally conductive gas, propagation of heat between the silicon substrate 10 and the holder 22 is changed. The propagation of heat is accelerated when the pressure of the thermally conductive gas increases, and the propagation of heat is suppressed when the pressure of the thermally conductive gas decreases. For example, the silicon substrate 10 can be shifted from a low-temperature state to a high-temperature state by reducing the pressure of the thermally conductive gas. In addition, for example, the silicon substrate 10 can be shifted from a high-temperature state to a low-temperature state by increasing the pressure of the thermally conductive gas.

In the method for manufacturing the semiconductor device according to the first embodiment, the temperature of the silicon substrate 10 is changed only by changing the pressure of the thermally conductive gas used for cooling the silicon substrate 10. Therefore, it is not necessary to add a new structure for changing the temperature of the silicon substrate 10 to the RIE apparatus. Therefore, the processing accuracy of the shape of the memory hole can be easily improved.

The surface of the silicon substrate 10 is exposed to high-energy plasma formed by application of high-frequency power during etching of the stacked body 60. The temperature of the silicon substrate 10 increases due to the heat input from high-energy plasma. On the other hand, the temperature of the silicon substrate 10 decreases due to the heat output toward the holder 22 cooled by the supply of the refrigerant. The temperature of the silicon substrate 10 is determined by a balance between the heat input from the plasma and the heat output toward the holder 22.

When the time during which the pressure of the helium gas is controlled to the low pressure is td (sec), the temperature of the holder 22 before the pressure of the helium gas starts to be controlled to the low pressure is T (° C.), the ratio of the surface area of the silicon substrate 10 to the sum of the surface area of the silicon substrate 10 and the inner wall area of the chamber 20 is k, the high-frequency power applied to the inside of the chamber 20 while the pressure of the helium gas is controlled to the low pressure is Pw (W), the mass of the silicon substrate 10 is m (kg), and the specific heat capacity of the silicon substrate 10 is c (J/(kg·° C.)), the following inequality (3) is preferably satisfied.

$$td \geq (100-T)/\{(k \times Pw)/(m \times c)\} \quad (3)$$

Note that the temperature T of the holder 22 is a set temperature of the electrostatic chuck 22b. During the etching of the memory hole MH, the set temperature of the electrostatic chuck 22b is maintained at a constant temperature. The temperature of the electrostatic chuck 22b is measured by, for example, a thermometer not illustrated in FIG. 2. Furthermore, the temperature T of the holder 22 may be, for example, the temperature of the electrostatic chuck 22b measured by the thermometer when the control is switched from the high pressure to the low pressure.

The ratio k is expressed by the following formula.

$$k=(\text{Surface area of silicon substrate})/[(\text{Surface area of silicon substrate})+(\text{Inner wall area of chamber})]$$

In addition, the high-frequency power Pw is total high-frequency power that is the sum of the first high-frequency power and the second high-frequency power.

When time td satisfies the inequality (3), the temperature of the silicon substrate 10 can be raised to equal to or more than 100° C. during time td. By setting the temperature of the silicon substrate 10 to equal to or more than 100° C., decomposition of the reaction product 63 is promoted.

Therefore, it is preferable that the following inequality (1) is satisfied for time td2 during which the pressure of the helium gas is controlled to the second pressure P2.

$$td2 \geq (100-T)/\{(k \times Pw)/(m \times c)\} \quad (1)$$

Similarly, it is preferable that the following inequality (2) is satisfied for time td4 during which the pressure of helium gas is controlled to the fourth pressure P4.

$$td4 \geq (100-T)/\{(k \times Pw)/(m \times c)\} \quad (2)$$

From the viewpoint of promoting the decomposition reaction of the reaction product 63 of the silicon substrate 10, the temperature of the silicon substrate 10 is preferably high. Therefore, the time during which the pressure of the helium gas is controlled to the low pressure is preferably long. Therefore, time td2 during which the pressure of the helium gas is controlled to the second pressure P2 is preferably longer than 10 seconds and more preferably longer than 15 seconds. The time td4 during which the pressure of the helium gas is controlled to the fourth pressure P4 is preferably longer than 10 seconds and more preferably longer than 15 seconds.

From the viewpoint of improving the throughput of etching of the memory hole, it is preferable that the time of the high-temperature state in which the reaction product removal mainly proceed is shorter than the time of the low-temperature state in which the etching mainly proceeds. Therefore, the time during which the pressure of the helium gas is controlled to the low pressure is preferably shorter than the time during which the pressure of the helium gas is set to the high pressure. Therefore, time td2 is preferably shorter than time td1, time td3, and time td5. The time td4 is preferably shorter than time td1, time td3, and time td5. The time td6 is preferably shorter than time td1, time td3, and time td5.

From the viewpoint of increasing the temperature change rate of the silicon substrate 10, the thermally conductive gas is preferably helium gas or hydrogen gas having high thermal conductivity.

Modified Example

A modified example of the method for manufacturing the semiconductor device according to the first embodiment is different from the method for manufacturing the semiconductor device according to the first embodiment in that the temperature of the substrate is measured and the pressure of the first gas is controlled to a third pressure based on the measured temperature of the substrate.

In the method for manufacturing the semiconductor device according to the modified example, the RIE apparatus used for etching the memory hole MH includes a thermometer (not illustrated in FIG. 2) that measures the temperature of the silicon substrate 10. The thermometer directly or indirectly measures the temperature of the silicon substrate 10.

The thermometer is, for example, a thermometer using a phosphor that directly measures the temperature of the silicon substrate 10, or a thermocouple. The thermometer is, for example, a thermometer using a phosphor that directly measures the temperature of the outer circumferential ring 22c, or a thermocouple. The temperature of the silicon substrate 10 can be indirectly derived from the temperature of the outer circumferential ring 22c.

In the method for manufacturing the semiconductor device of the modified example, the pressure of the helium gas is controlled based on the temperature of the substrate measured by the thermometer. The control of the pressure of the helium gas based on the temperature of the silicon substrate 10 is performed using, for example, the control circuit 54.

For example, the temperature of the silicon substrate 10 is measured in a state in which the pressure of the helium gas is controlled to the second pressure P2. For example, when the temperature of the silicon substrate 10 reaches a predetermined temperature, the pressure of the helium gas is switched from the second pressure P2 to the third pressure P3 higher than the second pressure P2. The predetermined temperature is, for example, 120° C. Based on the temperature of the silicon substrate 10, the pressure of the helium gas is controlled to the third pressure P3.

By switching the pressure of the helium gas from the second pressure P2 to the third pressure P3 based on the temperature of the silicon substrate 10, for example, it is possible to reliably suppress the temperature of the silicon substrate 10 from becoming too high.

Furthermore, for example, the temperature of the silicon substrate 10 is measured in a state in which the pressure of the helium gas is controlled to the third pressure P3. For example, after the temperature of the silicon substrate 10 decreases to a predetermined temperature, the pressure of the helium gas is switched from the third pressure P3 to the fourth pressure P4 lower than the third pressure P3 after the lapse of a predetermined time. The predetermined temperature is, for example, 20° C. The predetermined time is, for example, 10 seconds. Based on the temperature of the silicon substrate 10, the pressure of the helium gas is controlled to a fourth pressure P4.

By switching the pressure of the helium gas from the third pressure P3 to the fourth pressure P4 based on the temperature of the silicon substrate 10, for example, the etching amount of the stacked body 60 can be accurately controlled.

As described above, according to the method for manufacturing the semiconductor device of the first embodiment and the modified example thereof, it is possible to process a layer to be processed with high accuracy when the layer to be processed is processed by dry etching.

Second Embodiment

A method for manufacturing the semiconductor device according to the second embodiment is different from the manufacturing method according to the first embodiment in that the control of the change in the pressure of the first gas and the control of the change in the high-frequency power applied to the inside of the chamber are synchronized with each other. In addition, in the method for manufacturing the semiconductor device according to the second embodiment, the high-frequency power applied to the inside of the chamber during the first reaction product removal is made higher than the high-frequency power applied to the inside of the chamber during the first etching process. Hereinafter, description of contents overlapping with the first embodiment may be partially omitted.

FIG. 8 is an explanatory diagram of the method for manufacturing the semiconductor device according to the second embodiment. FIG. 8 illustrates the relationship between the thermally conductive gas pressure, the total high-frequency power, the wafer temperature, and the etching time when the memory hole MH is formed.

At time t1, the thermally conductive gas is supplied to the thermally conductive gas region 76 between the holder 22 and the silicon substrate 10. The thermally conductive gas is, for example, helium gas.

At time t1, the pressure of the helium gas is controlled to the first pressure P1. At time t1, the first power Pw1 is applied to the inside of the chamber 20.

Further, at time t1, an etching gas is supplied into the chamber 20. At time t1, the refrigerant is supplied to the refrigerant flow path 22ax.

After the pressure of the helium gas is controlled to the first pressure P1, the first etching process of etching the stacked body 60 is performed using the reactive ion etching method. During the first etching process, the temperature of the silicon substrate 10 is, for example, equal to or more than −150° C. and equal to or less than 60° C. During the first etching process, for example, a first state in which the temperature of the silicon substrate 10 is equal to or more than −150° C. and equal to or less than 60° C. is realized. During the first etching process, a reaction product 63 is formed on the stacked body 60.

After the first etching process, at time t2, the pressure of the helium gas is controlled to the second pressure P2. After the first etching process, at time t2, the pressure of the helium gas is changed from the first pressure P1 to the second pressure P2. The second pressure P2 is lower than the first pressure P1.

At time t2, the second power Pw2 is applied to the inside of the chamber 20. At time t2, the high-frequency power applied to the inside of the chamber 20 is changed from the first power Pw1 to the second power Pw2. The second power Pw2 is higher than the first power Pw1.

After the pressure of the helium gas is controlled to a second pressure P2, and the second power Pw2 is applied, a first reaction product removal of removing the reaction product 63 on the stacked body 60 is performed.

During the first reaction product removal, the temperature of the silicon substrate 10 is, for example, equal to or more than 100° C. and equal to or less than 300° C. During the first reaction product removal, for example, a second state in which the temperature of the silicon substrate 10 is equal to or more than 100° C. and equal to or less than 300° C. is realized.

After the first reaction product removal, at time t3, the pressure of the helium gas is controlled to a third pressure P3. After the first reaction product removal, at time t3, the pressure of the helium gas is changed from the second pressure P2 to the third pressure P3. The third pressure P3 is higher than the second pressure P2.

At time t3, the third power Pw3 is applied to the inside of the chamber 20. At time t3, the high-frequency power applied to the inside of the chamber 20 is changed from the second power Pw2 to the third power Pw3. The third power Pw3 is lower than the second power Pw2.

After the pressure of the helium gas is controlled to the third pressure P3 and the third power Pw3 is applied, the second etching process of etching the stacked body 60 is performed using the reactive ion etching method.

Between time t3 and time t4, a second etching process for etching the stacked body 60 is performed.

As the pressure of the helium gas increases from the second pressure P2 to the third pressure P3, the temperature of the silicon substrate 10 decreases. During the second etching process, for example, a third state in which the temperature of the silicon substrate 10 is equal to or more than −150° C. and equal to or less than 60° C. is realized. During the second etching process, the reaction product 63 is formed on the stacked body 60.

After the second etching process, at time t4, the pressure of the helium gas is controlled to the fourth pressure P4. After the second etching process, at time t4, the pressure of the helium gas is changed from the third pressure P3 to the fourth pressure P4. The fourth pressure P4 is lower than the third pressure P3.

At time t4, the fourth power Pw4 is applied to the inside of the chamber 20. At time t4, the high-frequency power applied to the inside of the chamber 20 is changed from the third power Pw3 to the fourth power Pw4. The fourth power Pw4 is higher than the third power Pw3.

After the pressure of the helium gas is controlled to a fourth pressure P4, and the fourth power Pw4 is applied, a second reaction product removal of removing the reaction product 63 on the stacked body 60 is performed.

During the second reaction product removal, the temperature of the silicon substrate 10 is, for example, equal to or more than 100° C. and equal to or less than 300° C. During the second reaction product removal, for example, a fourth state in which the temperature of the silicon substrate 10 is equal to or more than 100° C. and equal to or less than 300° C. is realized.

After the second reaction product removal, at time t5, the pressure of the helium gas is controlled to a fifth pressure P5. After the first reaction product removal, at time t5, the pressure of the helium gas is changed from the fourth pressure P4 to the fifth pressure P5. The fifth pressure P5 is higher than the fourth pressure P4.

At time t5, the fifth power Pw5 is applied to the inside of the chamber 20. At time t5, the high-frequency power applied to the inside of the chamber 20 is changed from the fourth power Pw4 to the fifth power Pw5. The fifth power Pw5 is lower than the fourth power Pw4.

After the pressure of the helium gas is controlled to the fifth pressure P5, and the fifth power Pw5 is applied, the third etching process of etching the stacked body 60 is performed using the reactive ion etching method.

Between time t5 and time t6, the third etching process for etching the stacked body 60 is performed.

As the pressure of the helium gas increases from the fourth pressure P4 to the fifth pressure P5, the temperature of the silicon substrate 10 decreases. During the third etching process, for example, a fifth state in which the temperature of the silicon substrate 10 is equal to or more than −150° C. and equal to or less than 60° C. is realized. During the third etching process, the reaction product 63 is formed on the stacked body 60.

After the third etching process, at time t6, the pressure of the helium gas is controlled to the sixth pressure P6. After the third etching process, at time t6, the pressure of the helium gas is changed from the fifth pressure P5 to the sixth pressure P6. The sixth pressure P6 is lower than the fifth pressure P5.

At time t6, the sixth power Pw6 is applied to the inside of the chamber 20. At time t6, the high-frequency power applied to the inside of the chamber 20 is changed from the fifth power Pw5 to the sixth power Pw6. The sixth power Pw6 is higher than the fifth power Pw5.

After the pressure of the helium gas is controlled to a sixth pressure P6, and the sixth power Pw6 is applied, a third reaction product removal of removing the reaction product 63 on the stacked body 60 is performed.

During the third reaction product removal, the temperature of the silicon substrate 10 is, for example, equal to or more than 100° C. and equal to or less than 300° C. During the third reaction product removal, for example, a sixth state in which the temperature of the silicon substrate 10 is equal to or more than 100° C. and equal to or less than 300° C. is realized.

After the third reaction product removal, at time t7, the application of the high-frequency power to the inside of the chamber 20 is stopped. Further, at time t7, the supply of the etching gas into the chamber 20 is blocked.

At time t7, the etching of the memory hole MH ends.

Next, functions and effects of the method for manufacturing the semiconductor device according to the second embodiment will be described.

In the method for manufacturing the semiconductor device according to the second embodiment, the control of the change in the pressure of the thermally conductive gas and the control of the change in the high-frequency power applied to the inside of the chamber are synchronized. The high-frequency power is increased in synchronization with the decrease in the pressure of the thermally conductive gas. In addition, the high-frequency power is reduced in synchronization with the increase in the pressure of the thermally conductive gas.

Specifically, for example, as described above, after the first etching process, at time t2, the pressure of the helium gas is decreased from the first pressure P1 to the second pressure P2, and at the same time, the high-frequency power applied to the inside of the chamber 20 is increased from the first power Pw1 to the second power Pw2. At time t3, the pressure of the helium gas is increased from the second pressure P2 to the third pressure P3, and at the same time, the high-frequency power applied to the inside of the chamber 20 is decreased from the second power Pw2 to the third power Pw3.

In the first reaction product removal after the first etching process, it is desirable that the temperature of the silicon substrate 10 is high in order to improve the removal efficiency of the reaction product 63. In addition, from the viewpoint of improving the throughput of etching of the memory hole MH, it is preferable that the temperature rise rate of the silicon substrate 10 is fast.

In addition, from the viewpoint of improving the throughput of etching of the memory hole MH, it is preferable that the rate of decrease in the temperature of the silicon substrate 10 is fast after the first reaction product removal.

At time t2, by increasing the high-frequency power from the first power Pw1 to the second power Pw2, the heat input from the plasma to the silicon substrate 10 increases. Therefore, in the first reaction product removal, the temperature of the silicon substrate 10 can be increased. In addition, it is possible to increase the temperature rise rate of the silicon substrate 10.

In addition, at time t3, the high-frequency power is reduced from the second power Pw2 to the third power Pw3, whereby the heat input from the plasma to the silicon substrate 10 is reduced. Therefore, it is possible to suppress a decrease of a decrease rate of the temperature of the silicon substrate 10 after the first reaction product removal.

The change of the pressure of the thermally conductive gas and the change of the high-frequency power may not necessarily be performed simultaneously. For example, the change in the high-frequency power may be made a predetermined time earlier than the change in the pressure of the thermally conductive gas, or the change in the high-frequency power may be made a predetermined time later than the change in the pressure of the thermally conductive gas.

As described above, according to the method for manufacturing the semiconductor device of the second embodiment, it is possible to process a layer to be processed with high accuracy when the layer to be processed is processed by dry etching.

Third Embodiment

A method for manufacturing a semiconductor device according to a third embodiment is different from the manufacturing method according to the first embodiment in that control of a change in pressure of a first gas is synchronized with control of a change in high-frequency power applied to the inside of a chamber. The method for manufacturing the semiconductor device according to the third embodiment is different from the method for manufacturing the semiconductor device according to the second embodiment in that the high-frequency power applied to the inside of the chamber during the first reaction product removal is made lower than the high-frequency power applied to the inside of the chamber during the first etching process. Hereinafter, description of contents overlapping with the first embodiment or the second embodiment may be partially omitted.

FIG. 9 is an explanatory diagram of the method for manufacturing the semiconductor device according to the third embodiment. FIG. 9 illustrates the relationship between the thermally conductive gas pressure, the total high-frequency power, the wafer temperature, and the etching time when the memory hole MH is formed.

As illustrated in FIG. 9, at time t2, the second power Pw2 is applied to the inside of the chamber 20. At time t2, the high-frequency power applied to the inside of the chamber 20 is changed from the first power Pw1 to the second power Pw2. The second power Pw2 is lower than the first power Pw1.

At time t3, the third power Pw3 is applied to the inside of the chamber 20. At time t3, the high-frequency power applied to the inside of the chamber 20 is changed from the second power Pw2 to the third power Pw3. The third power Pw3 is higher than the second power Pw2.

At time t4, the fourth power Pw4 is applied to the inside of the chamber 20. At time t4, the high-frequency power applied to the inside of the chamber 20 is changed from the third power Pw3 to the fourth power Pw4. The fourth power Pw4 is lower than the third power Pw3.

At time t5, the fifth power Pw5 is applied to the inside of the chamber 20. At time t5, the high-frequency power applied to the inside of the chamber 20 is changed from the fourth power Pw4 to the fifth power Pw5. The fifth power Pw5 is higher than the fourth power Pw4.

At time t6, the sixth power Pw6 is applied to the inside of the chamber 20. At time t6, the high-frequency power applied to the inside of the chamber 20 is changed from the fifth power Pw5 to the sixth power Pw6. The sixth power Pw6 is lower than the fifth power Pw5.

At time t7, the application of the high-frequency power to the inside of the chamber 20 is stopped. Further, at time t7, the supply of the etching gas into the chamber 20 is blocked.

At time t7, the etching of the memory hole MH ends.

The change of the pressure of the thermally conductive gas and the change of the high-frequency power may not necessarily be performed simultaneously. For example, the change in the high-frequency power may be made a predetermined time earlier than the change in the pressure of the thermally conductive gas, or the change in the high-frequency power may be made a predetermined time later than the change in the pressure of the thermally conductive gas.

Next, functions and effects of the method for manufacturing the semiconductor device according to the third embodiment will be described.

In the method for manufacturing the semiconductor device according to the third embodiment, the control of the change in the pressure of the thermally conductive gas and the control of the change in the high-frequency power applied to the inside of the chamber are synchronized. The high-frequency power is reduced in synchronization with the reduction in the pressure of the thermally conductive gas. In addition, the high-frequency power is increased in synchronization with the increase in the pressure of the thermally conductive gas.

Specifically, for example, as described above, after the first etching process, at time t2, the pressure of the helium gas is reduced from the first pressure P1 to the second pressure P2, and at the same time, the high-frequency power applied to the inside of the chamber 20 is reduced from the first power Pw1 to the second power Pw2. At time t3, the pressure of the helium gas is increased from the second pressure P2 to the third pressure P3, and at the same time, the high-frequency power applied to the inside of the chamber 20 is increased from the second power Pw2 to the third power Pw3.

In the first reaction product removal after the first etching process, the pressure of the helium gas decreases from the first pressure P1 to the second pressure P2, and the pressure of the thermally conductive gas region 76 decreases. When the pressure in the thermally conductive gas region 76 decreases, discharge in the thermally conductive gas region 76 is likely to occur. When discharge occurs in the thermally conductive gas region 76, for example, damage to the silicon substrate 10 or damage to the electrostatic chuck 22b may occur.

In the method for manufacturing the semiconductor device according to the third embodiment, for example, the discharge in the thermally conductive gas region 76 is suppressed by decreasing the high-frequency power from the first power Pw1 to the second power Pw2 at time t2. Therefore, damage to the silicon substrate 10 and damage to the electrostatic chuck 22b due to discharge can be suppressed.

As described above, according to the method for manufacturing the semiconductor device of the third embodiment, it is possible to process a layer to be processed with high accuracy when the layer to be processed is processed by dry etching.

Fourth Embodiment

A method for manufacturing a semiconductor device according to a fourth embodiment is different from the manufacturing method according to the first embodiment in that a third gas having a lower thermal conductivity than the first gas is supplied between the holder and the substrate so as to be in contact with the substrate instead of the first gas after the pressure of the first gas is controlled to a second pressure, after the first reaction product removal, the first gas is supplied between the holder and the substrate so as to be in contact with the substrate instead of the third gas, and the pressure of the first gas is controlled to a third pressure higher than the second pressure. Hereinafter, description of contents overlapping with the first embodiment may be partially omitted.

FIG. 10 is an explanatory diagram of the method for manufacturing the semiconductor device according to the fourth embodiment. FIG. 10 illustrates the relationship between the thermally conductive gas pressure, the total high-frequency power, the wafer temperature, and the etching time when the memory hole MH is formed.

At time t1, the thermally conductive gas is supplied to the thermally conductive gas region 76 between the holder 22 and the silicon substrate 10. The thermally conductive gas is, for example, helium gas. The helium gas is an example of the first gas.

At time t1, the pressure of the helium gas is controlled to the first pressure P1. At time t1, the first power Pw1 is applied to the inside of the chamber 20.

Further, at time t1, an etching gas is supplied into the chamber 20. The etching gas is an example of the second gas. At time t1, the refrigerant is supplied to the refrigerant flow path 22ax.

After the pressure of the helium gas is controlled to the first pressure P1, the first etching process of etching the stacked body 60 is performed using the reactive ion etching method.

After the first etching process, at time t2, the pressure of the helium gas is controlled to the second pressure P2. After the first etching process, at time t2, the pressure of the helium gas is changed from the first pressure P1 to the second pressure P2. The second pressure P2 is lower than the first pressure P1.

After the pressure of the helium gas is controlled to the second pressure P2, the argon gas is supplied instead of the helium gas to the thermally conductive gas region 76 between the holder 22 and the silicon substrate 10 at time ta. The argon gas is in contact with the back surface of the silicon substrate 10. The argon gas is an example of the third gas. The thermal conductivity of argon gas is lower than the thermal conductivity of helium gas.

The switching of the supply from the helium gas to the argon gas is performed, for example, by the control circuit 54 controlling the thermally conductive gas supply unit 44.

The pressure of the argon gas is controlled to, for example, a pressure Pa. The pressure Pa is higher than the second pressure P2. The pressure Pa is, for example, equal to the first pressure P1.

In FIG. 10, the pressure of helium gas is indicated by a solid line, and the pressure of argon gas is indicated by a dotted line.

After controlling the pressure of the helium gas to the second pressure P2, a first reaction product removal of removing the reaction product 63 on the stacked body 60 is performed.

After the first reaction product removal, at time t3, helium gas is supplied instead of argon gas to the thermally conductive gas region 76 between the holder 22 and the silicon substrate 10. The helium gas is in contact with the back surface of the silicon substrate 10. The pressure of the helium gas is controlled to a third pressure P3. The third pressure P3 is higher than the second pressure P2.

After the pressure of the helium gas is controlled to the third pressure P3, the second etching process of etching the stacked body 60 is performed using the reactive ion etching method.

Between time t3 and time t4, a second etching process for etching the stacked body 60 is performed.

After the second etching process, at time t4, the pressure of the helium gas is controlled to the fourth pressure P4. After the second etching process, at time t4, the pressure of the helium gas is changed from the third pressure P3 to the fourth pressure P4. The fourth pressure P4 is lower than the third pressure P3.

After the pressure of the helium gas is controlled to the fourth pressure P4, the argon gas is supplied instead of the helium gas to the thermally conductive gas region 76 between the holder 22 and the silicon substrate 10 at time tb.

The pressure of the argon gas is controlled to, for example, the pressure Pb. The pressure Pb is higher than the fourth pressure P4. The pressure Pb is, for example, equal to the third pressure P3.

After the pressure of the helium gas is controlled to the fourth pressure P4, a second reaction product removal of removing the reaction product 63 on the stacked body 60 is performed.

After the second reaction product removal, at time t5, helium gas is supplied instead of argon gas to the thermally conductive gas region 76 between the holder 22 and the silicon substrate 10. The helium gas is in contact with the back surface of the silicon substrate 10. The pressure of the helium gas is controlled to a fifth pressure P5. The fifth pressure P5 is higher than the fourth pressure P4.

After the pressure of the helium gas is controlled to the fifth pressure P5, the third etching process of etching the stacked body 60 is performed using the reactive ion etching method.

Between time t5 and time t6, the third etching process for etching the stacked body 60 is performed.

After the third etching process, at time t6, the pressure of the helium gas is controlled to the sixth pressure P6. After the third etching process, at time t6, the pressure of the helium gas is changed from the fifth pressure P5 to the sixth pressure P6. The sixth pressure P6 is lower than the fifth pressure P5.

After the pressure of the helium gas is controlled to the sixth pressure P6, a third reaction product removal of removing the reaction product 63 on the stacked body 60 is performed.

After the third reaction product removal, at time t7, the application of the high-frequency power to the inside of the chamber 20 is stopped. Further, at time t7, the supply of the etching gas into the chamber 20 is blocked.

At time t7, the etching of the memory hole MH ends.

Next, functions and effects of the method for manufacturing the semiconductor device according to the fourth embodiment will be described.

In the method for manufacturing the semiconductor device according to the fourth embodiment, for example, argon gas having thermal conductivity lower than that of helium gas is supplied into the thermally conductive gas region 76 at time ta. Since the thermal conductivity of the argon gas is lower than that of the helium gas, the rate of change in the temperature of the silicon substrate 10 is smaller than that in the case of the helium gas.

Therefore, for example, the silicon substrate 10 can be stably maintained at a temperature of equal to or more than 100° C. In addition, it is easy to lengthen the time for maintaining the silicon substrate 10 at a temperature of equal to or more than 100° C. Therefore, the removal of the reaction product can be promoted.

As the first gas, hydrogen gas can be used instead of helium gas. As the third gas having a lower thermal conductivity than the first gas, for example, nitrogen gas, neon gas, krypton gas, or xenon gas can be used instead of argon gas.

The pressure Pa may be different from the first pressure P1. The pressure Pb may be different from the third pressure P3. The pressure Pc may be different from the fifth pressure P5.

As described above, according to the method for manufacturing the semiconductor device of the fourth embodiment, it is possible to process a layer to be processed with high accuracy when the layer to be processed is processed by dry etching.

Fifth Embodiment

A method for manufacturing a semiconductor device according to a fifth embodiment includes: placing a substrate having a layer to be processed on a holder provided in a chamber; supplying a first gas in contact with the substrate between the holder and the substrate; controlling a pressure of the first gas to a first pressure; performing a first etching process of forming a recess on the layer to be processed by a reactive ion etching method using a first process gas; controlling the pressure of the first gas to a second pressure lower than the first pressure after the first etching process; performing a first process of supplying hydrogen radicals to the recess using a second process gas containing hydrogen in a state in which a temperature of the substrate is equal to or more than 200° C. and equal to or less than 350° C.; controlling a pressure of the first gas to a third pressure higher than the second pressure after the first process; and performing second etching process of etching a bottom surface of the recess by a reactive ion etching method using a third process gas.

The semiconductor device manufactured by the method for manufacturing the semiconductor device of the fifth embodiment is similar to the semiconductor device manufactured by the method for manufacturing the semiconductor device of the first embodiment. The semiconductor device manufactured by the method for manufacturing the semiconductor device according to the fifth embodiment is a nonvolatile memory 100 in which memory cells are three-dimensionally disposed. FIG. 1 is a cross-sectional view of a memory cell array of a nonvolatile memory 100. Hereinafter, in the description of the nonvolatile memory 100, description of contents overlapping with those of the first embodiment will be partially omitted.

The reactive ion etching apparatus used in the method for manufacturing the semiconductor device according to the fifth embodiment is similar to the reactive ion etching apparatus used in the method for manufacturing the semiconductor device according to the first embodiment. FIG. 2 is a schematic diagram of an example of a reactive ion etching apparatus used in the method for manufacturing the semiconductor device according to the fifth embodiment. The reactive ion etching apparatus (RIE apparatus) in FIG.

2 is a dual-frequency capacitively coupled plasma apparatus (CCP apparatus). Hereinafter, in the description of the RIE apparatus, description of contents overlapping with the first embodiment will be partially omitted.

Next, an example of a method for manufacturing the semiconductor device according to the fifth embodiment will be described.

Figure 11:
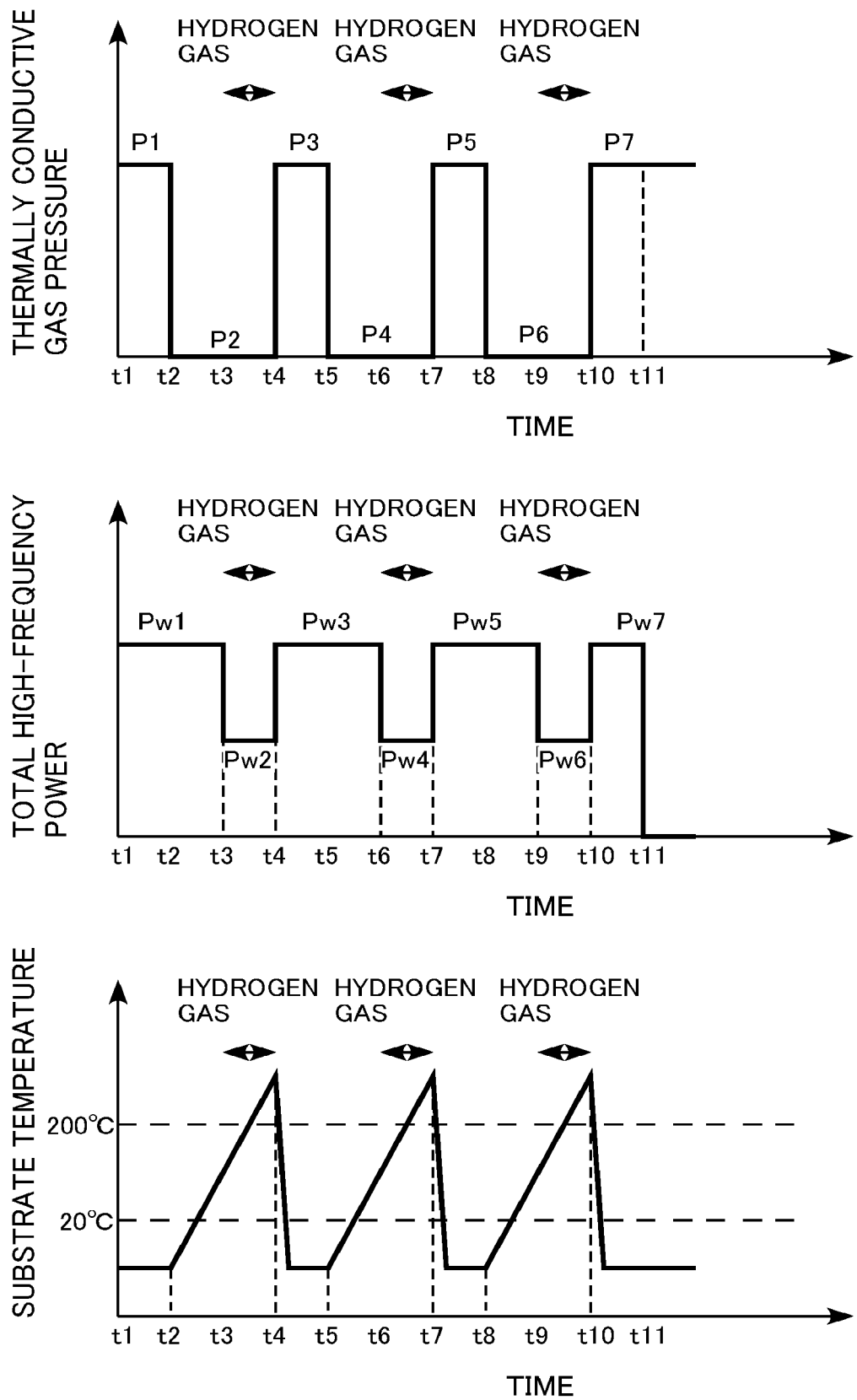
FIG. 11 is an explanatory diagram of the method for manufacturing the semiconductor device according to a fifth embodiment.

FIG. 11 is an explanatory diagram of the method for manufacturing the semiconductor device according to the fifth embodiment. FIGS. 12A, 12B, 12C, 12D, 13A, 13B, 13C, 13D, 14A, 14B, 14C, 14D, 15A, 15B, and 15C are schematic diagrams illustrating the method for manufacturing the semiconductor device of the fifth embodiment. FIGS. 12A, 12B, 12C, 12D, 13A, 13B, 13C, 13D, 14A, 14B, 14C, 14D, 15A, 15B, and 15C correspond to a portion including one channel layer 11 in FIG. 1.

First, a stacked body 60 is formed on the silicon substrate 10 (FIG. 12A). The silicon substrate 10 is a semiconductor wafer. The stacked body 60 is an insulating layer. The silicon substrate 10 is an example of the substrate. The stacked body 60 is an example of the layer to be processed. The silicon substrate 10 is an example of the semiconductor wafer W in FIG. 2.

The stacked body 60 has a structure in which silicon oxide films 60a and silicon nitride films 60b are alternately stacked. The silicon oxide film 60a and the silicon nitride film 60b are formed by, for example, a chemical vapor deposition method (CVD method). The silicon oxide film 60a is an example of the first layer. The silicon nitride film 60b is an example of the second layer.

A portion of the silicon oxide film 60a finally becomes the interlayer insulating layer 12.

Next, the carbon layer 62 having the hole pattern 62a is formed on the stacked body 60 (FIG. 12B). The carbon layer 62 is an example of the mask layer. The carbon layer 62 is formed by, for example, a sputtering method. The hole pattern 62a is formed using, for example, a lithography method and a RIE method.

As the mask layer, for example, a resist layer, an insulating layer, or a metal layer can also be used.

Next, the silicon substrate 10 is carried into the chamber 20 of the RIE apparatus. The silicon substrate 10 is placed on the holder 22 provided in the chamber 20. The silicon substrate 10 is an example of a substrate.

In the chamber 20 of the RIE apparatus, a memory hole MH is formed using the carbon layer 62 as a mask using a reactive ion etching method (FIGS. 12C to 14A). The etching of the memory hole MH is performed while periodically changing the pressure of the thermally conductive gas for cooling the silicon substrate 10. The memory hole MH is an example of a recess.

FIG. 11 illustrates a relationship between the thermally conductive gas pressure, the total high-frequency power, and the wafer temperature and the etching time when the memory hole MH is formed. FIG. 11 also illustrates timing at which hydrogen plasma is supplied to the silicon substrate 10.

At time t1, the thermally conductive gas is supplied to the thermally conductive gas region 76 between the holder 22 and the silicon substrate 10. The thermally conductive gas is, for example, helium gas. The helium gas is in contact with the back surface of the silicon substrate 10. The helium gas is an example of the first gas.

At time t1, the pressure of the helium gas is controlled to the first pressure P1. The pressure of the helium gas is controlled by, for example, flow rate control using the first main valve 50. By adjusting the opening degree of the first main valve 50, the pressure of the helium gas is controlled to the first pressure P1.

The first pressure P1 is, for example, equal to or more than 133 Pa (1 Torr) and 13,332 Pa equal to or less than (100 Torr).

At time t1, high-frequency power is applied to the inside of the chamber 20. For example, the first high-frequency power source 24 is used to apply the first high-frequency power between the support portion 22a of the holder 22 and the shower plate 32. For example, the second high-frequency power source 26 is used to apply the second high-frequency power to the support portion 22a of the holder 22. The sum of the first high-frequency power and the second high-frequency power is referred to as total high-frequency power. At time t1, the first power Pw1 is applied to the inside of the chamber 20.

At time t1, the first etching gas is supplied into the chamber 20. The first etching gas is an example of the first process gas. The etching gas is supplied into the chamber 20 from the process gas supply pipe 30 through the shower plate 32.

The first etching gas contains, for example, carbon (C) and fluorine (F).

At time t1, the refrigerant is supplied to the refrigerant flow path 22ax. The refrigerant is, for example, a fluorine-based inert liquid. When the refrigerant is supplied to the refrigerant flow path 22ax, the temperatures of the support portion 22a and the electrostatic chuck 22b of the holder 22 decrease. The temperature of the support portion 22a of the holder 22 and the electrostatic chuck 22b is, for example, equal to or more than −150° C. and equal to or less than 20° C.

After the pressure of the helium gas is controlled to the first pressure P1, the first etching process for etching the stacked body 60 is performed using the reactive ion etching method (FIG. 12C). A first etching process for etching the stacked body 60 is performed between time t1 and time t2. In the first etching process, the memory hole MH does not penetrate the stacked body 60.

During the first etching process, the temperature of the silicon substrate 10 is, for example, equal to or more than −150° C. and equal to or less than 20° C. During the first etching process, for example, a first state in which the temperature of the silicon substrate 10 is equal to or more than −150° C. and equal to or less than 20° C. is realized.

In the first etching process, the first protective film 64a is formed on the surface of the memory hole MH. The first protective film 64a is formed, for example, on the side walls of the memory hole MH. The first protective film 64a is formed simultaneously with the formation of the memory hole MH. The first protective film 64a is an example of the first film.

The first protective film 64a is a reaction product originating from the first etching gas. The first protective film 64a contains, for example, carbon (C) and fluorine (F). The first protective film 64a is, for example, a fluorocarbon film.

After the first etching process, at time t2, the pressure of the helium gas is controlled to the second pressure P2. After the first etching process, at time t2, the pressure of the helium gas is changed from the first pressure P1 to the second pressure P2. The second pressure P2 is lower than the first pressure P1.

The pressure of the helium gas is controlled by, for example, flow rate control using the first main valve 50. For example, the first main valve 50 is closed to block the inflow of the helium gas into the thermally conductive gas region 76. For example, by closing the first main valve 50, the second pressure P2 approaches vacuum.

The second pressure P2 is, for example, equal to or more than 0 Pa and equal to or less than 13.3 Pa (0.1 Torr). The second pressure P2 is, for example, equal to or less than 1/100 of the first pressure P1.

After the first etching process, for example, at time t3, the second power Pw2 is applied to the inside of the chamber 20. At time t3, the high-frequency power applied to the inside of the chamber 20 is changed from the first power Pw1 to the second power Pw2. The second power Pw2 is lower than the first power Pw1.

After the pressure of the helium gas is controlled to the second pressure P2 and the high-frequency power applied to the inside of the chamber 20 is changed to the second power Pw2, a first reforming process is performed (FIG. 12D). In the first reforming process, hydrogen radicals are supplied to the memory holes MH in the chamber 20. The first reforming process is an example of the first process.

During the first reforming process, for example, the first reforming gas is supplied into the chamber 20 at time t3. The first reforming gas is a gas containing hydrogen (H). The first reforming gas includes, for example, hydrogen gas. The first reforming gas is an example of a second process gas.

During the first reforming process, the gas supplied into the chamber 20 is switched from the first etching gas to the first reforming gas. For example, at time t3, the gas supplied to the inside of the chamber 20 is switched from the first etching gas to the first reforming gas.

During the first reforming process, high-frequency power is applied to the hydrogen gas to generate plasma containing hydrogen radicals.

Plasma containing hydrogen radicals is supplied to the surface of the silicon substrate 10. The hydrogen radicals are supplied into the memory hole MH. The surface of the first protective film 64a is exposed to hydrogen radicals.

The first reforming process is performed in a state in which the temperature of the silicon substrate 10 is equal to or more than 200° C. and equal to or less than 350° C. During the first reforming process, the second state in which the temperature of the silicon substrate 10 is equal to or more than 200° C. and equal to or less than 350° C. is realized.

At time t2, after the pressure of the helium gas is controlled from the first pressure P1 to the second pressure P2, the temperature of the silicon substrate 10 rises, and the second state in which the temperature of the silicon substrate 10 is equal to or more than 200° C. is realized. As the pressure of the helium gas decreases, the propagation of heat in the helium gas is suppressed. Heat dissipation from the silicon substrate 10 to the holder 22 via the helium gas is suppressed, and the temperature of the silicon substrate 10 rises.

In the first reforming process, the first protective film 64a is reformed to the first reformed protective film 65a. The chemical composition of the first reformed protective film 65a is different from that of the first protective film 64a, for example.

During the first reforming process, the first protective film 64a is reduced, for example. During the first reforming process, reduction reaction occurs. During the first reforming process, for example, the fluorine concentration of the first protective film 64a is reduced.

During the first reforming process, for example, a film is not formed on the first protective film 64a. After the first reforming process, for example, the inner diameter of the memory hole MH does not decrease. After the first reforming process, for example, the volume of the cavity of the memory hole MH does not decrease.

After the first reforming process, the pressure of the helium gas is controlled to the third pressure P3 at time t4. After the first reforming process, at time t4, the pressure of the helium gas is changed from the second pressure P2 to the third pressure P3. After the second state is realized, the pressure of the helium gas is controlled to the third pressure P3.

The third pressure P3 is higher than the second pressure P2. The pressure of the helium gas is controlled by, for example, flow rate control using the first main valve 50. For example, by opening the first main valve 50, the inflow of the helium gas into the thermally conductive gas region 76 is started. By adjusting the opening degree of the first main valve 50, the pressure of the helium gas is controlled to the third pressure P3.

The third pressure P3 is, for example, equal to or more than 133 Pa (1 Torr) and 13,332 Pa equal to or less than (100 Torr). The third pressure P3 is, for example, equal to the first pressure P1.

After the first reforming process, for example, at time t4, the third power Pw3 is applied to the inside of the chamber 20. At time t4, the high-frequency power applied to the inside of the chamber 20 is changed from the second power Pw2 to the third power Pw3. The third power Pw3 is higher than the second power Pw2.

At time t4, the second etching gas is supplied into the chamber 20. The second etching gas is an example of a third process gas. The second etching gas is supplied into the chamber 20 from the process gas supply pipe 30 through the shower plate 32. For example, the gas supplied to the inside of the chamber 20 at time t4 is switched from the first reforming gas to the second etching gas.

The second etching gas contains, for example, carbon (C) and fluorine (F).

The pressure of the helium gas is controlled to the third pressure P3, the high-frequency power applied to the inside of the chamber 20 is changed to the third power Pw3, the second etching gas is supplied to the inside of the chamber 20, and then the second etching process of etching the stacked body 60 is performed using the reactive ion etching method (FIG. 13A).

The second etching process is performed using the carbon layer 62 as a mask.

At least the bottom surface of the memory hole MH is etched by the second etching process. Between time t4 and time t5, the second etching process is performed. In the second etching process, the memory hole MH does not penetrate the stacked body 60.

As the pressure of the helium gas increases from the second pressure P2 to the third pressure P3, the propagation of heat in the helium gas is promoted. Heat dissipation from the silicon substrate 10 to the holder 22 via the helium gas is promoted, and the temperature of the silicon substrate 10 decreases.

During the second etching process, the temperature of the silicon substrate 10 is, for example, equal to or more than −150° C. and equal to or less than 20° C. During the second etching process, for example, a third state in which the temperature of the silicon substrate 10 is equal to or more than −150° C. and equal to or less than 20° C. is realized.

In the second etching process, the second protective film 64b is formed on the surface of the memory hole MH. The second protective film 64b is formed, for example, on the side walls of the memory hole MH at a portion deepened by the second etching process. The second protective film 64b is an example of the second film.

The second protective film 64b is a reaction product originating from the second etching gas. The second protective film 64b contains, for example, carbon (C) and fluorine (F). The second protective film 64b is, for example, a fluorocarbon film.

After the second etching process, at time t5, the pressure of the helium gas is controlled to the fourth pressure P4. After the second etching process, at time t5, the pressure of the helium gas is changed from the third pressure P3 to the fourth pressure P4. The fourth pressure P4 is lower than the third pressure P3.

The pressure of the helium gas is controlled by, for example, flow rate control using the first main valve 50. For example, the first main valve 50 is closed to block the inflow of the helium gas into the thermally conductive gas region 76. For example, by closing the first main valve 50, the fourth pressure P4 approaches vacuum.

The fourth pressure P4 is, for example, equal to or more than 0 Pa and equal to or less than 13.3 Pa (0.1 Torr). The fourth pressure P4 is, for example, 1/100 or less of the third pressure P3.

After the second etching process, for example, at time t6, the fourth power Pw4 is applied to the inside of the chamber 20. At time t6, the high-frequency power applied to the inside of the chamber 20 is changed from the third power Pw3 to the fourth power Pw4. The fourth power Pw4 is lower than the third power Pw3.

After the pressure of the helium gas is controlled to the third pressure P3 and the high-frequency power applied to the inside of the chamber 20 is changed to the fourth power Pw4, the second reforming process is performed (FIG. 13B). In the second reforming process, hydrogen radicals are supplied to the memory holes MH in the chamber 20. The second reforming process is an example of the second process.

During the second reforming process, for example, at time t6, the second reforming gas is supplied to the inside of the chamber 20. The second reforming gas is a gas containing hydrogen (H). The second reforming gas includes, for example, hydrogen gas. The second reforming gas is an example of a fourth process gas.

During the second reforming process, the gas supplied to the inside of the chamber 20 is switched from the second etching gas to the second reforming gas. For example, at time t6, the gas supplied to the inside of the chamber 20 is switched from the second etching gas to the second reforming gas.

During the second reforming process, high-frequency power is applied to the hydrogen gas to generate plasma containing hydrogen radicals.

Plasma containing hydrogen radicals is supplied to the surface of the silicon substrate 10. The hydrogen radicals are supplied into the memory hole MH. The surface of the second protective film 64b is exposed to hydrogen radicals.

The second reforming process is performed in a state in which the temperature of the silicon substrate 10 is equal to or more than 200° C. and equal to or less than 350° C. During the second reforming process, a fourth state in which the temperature of the silicon substrate 10 is equal to or more than 200° C. and equal to or less than 350° C. is realized.

At time t5, after the pressure of the helium gas is controlled from the third pressure P3 to the fourth pressure P4, the temperature of the silicon substrate 10 increases, and a fourth state in which the temperature of the silicon substrate 10 is equal to or more than 200° C. is realized. As the pressure of the helium gas decreases, the propagation of heat in the helium gas is suppressed. Heat dissipation from the silicon substrate 10 to the holder 22 via the helium gas is suppressed, and the temperature of the silicon substrate 10 rises.

In the second reforming process, the second protective film 64b is reformed to the second reformed protective film 65b. The chemical composition of the second reformed protective film 65b is different from that of the second protective film 64b, for example.

During the second reforming process, the second protective film 64b is reduced, for example. During the second reforming process, for example, the fluorine concentration of the second protective film 64b is reduced.

During the second reforming process, for example, a film is not formed on the second protective film 64b. After the second reforming process, for example, the inner diameter of the memory hole MH does not decrease. After the second reforming process, for example, the volume of the cavity of the memory hole MH does not decrease.

After the second reforming process, the pressure of the helium gas is controlled to the fifth pressure P5 at time t7. After the second reforming process, at time t7, the pressure of the helium gas is changed from the fourth pressure P4 to the fifth pressure P5. After the fourth state is realized, the pressure of the helium gas is controlled to the fifth pressure P5.

The fifth pressure P5 is higher than the fourth pressure P4. The pressure of the helium gas is controlled by, for example, flow rate control using the first main valve 50. For example, by opening the first main valve 50, the inflow of the helium gas into the thermally conductive gas region 76 is started. By adjusting the opening degree of the first main valve 50, the pressure of the helium gas is controlled to the fifth pressure P5.

The fifth pressure P5 is, for example, equal to or more than 133 Pa (1 Torr) and 13,332 Pa equal to or less than (100 Torr). The fifth pressure P5 is, for example, equal to the first pressure P1.

After the second reforming process, for example, at time t7, the fifth power Pw5 is applied to the inside of the chamber 20. At time t7, the high-frequency power applied to the inside of the chamber 20 is changed from the fourth power Pw4 to the fifth power Pw5. The fifth power Pw5 is higher than the fourth power Pw4.

At time t7, the third etching gas is supplied into the chamber 20. The third etching gas is an example of a fifth process gas. The third etching gas is supplied into the chamber 20 from the process gas supply pipe 30 through the shower plate 32. For example, the gas supplied to the inside of the chamber 20 at time t7 is switched from the second reforming gas to the third etching gas.

The third etching gas contains, for example, carbon (C) and fluorine (F).

The pressure of the helium gas is controlled to the fifth pressure P5, the high-frequency power applied to the inside of the chamber 20 is changed to the fifth power Pw5, the third etching gas is supplied to the inside of the chamber 20, and then the third etching process of etching the stacked body 60 is performed using the reactive ion etching method (FIG. 13C). The third etching process is performed using the carbon layer 62 as a mask.

At least the bottom surface of the memory hole MH is etched by the third etching process. The third etching process is performed between time t7 and time t8. In the third etching process, the memory hole MH does not penetrate the stacked body 60.

As the pressure of the helium gas increases from the fourth pressure P4 to the fifth pressure P5, the propagation of heat in the helium gas is promoted. Heat dissipation from the silicon substrate 10 to the holder 22 via the helium gas is promoted, and the temperature of the silicon substrate 10 decreases.

During the third etching process, the temperature of the silicon substrate 10 is, for example, equal to or more than −150° C. and equal to or less than 20° C. During the third etching process, for example, a fifth state in which the temperature of the silicon substrate 10 is equal to or more than −150° C. and equal to or less than 20° C. is realized.

During the third etching process, the third protective film 64c is formed on the surface of the memory hole MH. The third protective film 64c is formed, for example, on the side walls of the memory hole MH at a portion deepened by the third etching process. Third protective film 64c is an example of the third film.

The third protective film 64c is a reaction product originating from the third etching gas. The third protective film 64c contains, for example, carbon (C) and fluorine (F). Third protective film 64c is, for example, a fluorocarbon film.

After the third etching process, the pressure of the helium gas is controlled to the sixth pressure P6 at time t8. After the third etching process, at time t8, the pressure of the helium gas is changed from the fifth pressure P5 to the sixth pressure P6. The sixth pressure P6 is lower than the fifth pressure P5.

The pressure of the helium gas is controlled by, for example, flow rate control using the first main valve 50. For example, the first main valve 50 is closed to block the inflow of the helium gas into the thermally conductive gas region 76. For example, by closing the first main valve 50, the sixth pressure P6 approaches vacuum.

The sixth pressure P6 is, for example, equal to or more than 0 Pa and equal to or less than 13.3 Pa (0.1 Torr). The sixth pressure P6 is, for example, equal to or less than ¹⁄₁₀₀ of the fifth pressure P5.

After the third etching process, for example, at time t9, the sixth power Pw6 is applied to the inside of the chamber 20. At time t9, the high-frequency power applied to the inside of the chamber 20 is changed from the fifth power Pw5 to the sixth power Pw6. The sixth power Pw6 is lower than the fifth power Pw5.

After the pressure of the helium gas is controlled to the sixth pressure P6 and the high-frequency power applied to the inside of the chamber 20 is changed to the sixth power Pw6, the third reforming process is performed (FIG. 13D). In the third reforming process, hydrogen radicals are supplied to the memory holes MH in the chamber 20. The third reforming process is an example of the third process.

During the third reforming process, for example, at time t9, the third reforming gas is supplied to the inside of the chamber 20. The third reforming gas is a gas containing hydrogen (H). The third reforming gas includes, for example, hydrogen gas.

During the third reforming process, the gas supplied to the inside of the chamber 20 is switched from the third etching gas to the third reforming gas. For example, at time t9, the gas supplied to the inside of the chamber 20 is switched from the third etching gas to the third reforming gas.

During the third reforming process, high-frequency power is applied to the hydrogen gas to generate plasma containing hydrogen radicals.

Plasma containing hydrogen radicals is supplied to the surface of the silicon substrate 10. The hydrogen radicals are supplied into the memory hole MH. The surface of the third protective film 64c is exposed to hydrogen radicals.

The third reforming process is performed in a state in which the temperature of the silicon substrate 10 is equal to or more than 200° C. and equal to or less than 350° C. During the third reforming process, a sixth state in which the temperature of the silicon substrate 10 is equal to or more than 200° C. and equal to or less than 350° C. is realized.

At time t8, after the pressure of the helium gas is controlled from the fifth pressure P5 to the sixth pressure P6, the temperature of the silicon substrate 10 increases, and the sixth state in which the temperature of the silicon substrate 10 is equal to or more than 200° C. is realized. As the pressure of the helium gas decreases, the propagation of heat in the helium gas is suppressed. Heat dissipation from the silicon substrate 10 to the holder 22 via the helium gas is suppressed, and the temperature of the silicon substrate 10 rises.

In the third reforming process, the third protective film 64c is reformed to the third reformed protective film 65c. The chemical composition of the third reformed protective film 65c is different from that of the third protective film 64c, for example.

During the third reforming process, the third protective film 64c is reduced, for example. During the third reforming process, for example, the fluorine concentration of the third protective film 64c is reduced.

During the third reforming process, for example, a film is not formed on the third protective film 64c. After the third reforming process, for example, the inner diameter of the memory hole MH does not decrease. After the third reforming process, for example, the volume of the cavity of the memory hole MH does not decrease.

After the third reforming process, the pressure of the helium gas is controlled to the seventh pressure P7 at time t10. After the third reforming process, at time t10, the pressure of the helium gas is changed from the sixth pressure P6 to the seventh pressure P7. After the sixth state is realized, the pressure of the helium gas is controlled to the seventh pressure P7.

The seventh pressure P7 is higher than the sixth pressure P6. The pressure of the helium gas is controlled by, for example, flow rate control using the first main valve 50. For example, by opening the first main valve 50, the inflow of the helium gas into the thermally conductive gas region 76 is started. By adjusting the opening degree of the first main valve 50, the pressure of the helium gas is controlled to the seventh pressure P7.

The seventh pressure P7 is, for example, equal to or more than 133 Pa (1 Torr) and 13,332 Pa equal to or less than (100 Torr). The seventh pressure P7 is, for example, equal to the first pressure P1.

After the third reforming process, for example, at time t10, the seventh power Pw7 is applied to the inside of the chamber 20. At time t10, the high-frequency power applied to the inside of the chamber 20 is changed from the sixth power Pw6 to the seventh power Pw7. The seventh power Pw7 is higher than the sixth power Pw6.

At time t10, the fourth etching gas is supplied into the chamber 20. The fourth etching gas is supplied into the chamber 20 from the process gas supply pipe 30 through the shower plate 32. For example, the gas supplied to the inside of the chamber 20 at time t10 is switched from the third reforming gas to the fourth etching gas.

The fourth etching gas contains, for example, carbon (C) and fluorine (F).

The pressure of the helium gas is controlled to the seventh pressure P7, the high-frequency power applied to the inside of the chamber 20 is changed to the seventh power Pw7, the fourth etching gas is supplied to the inside of the chamber 20, and then a fourth etching process of etching the stacked body 60 is performed using the reactive ion etching method (FIG. 14A). The fourth etching process is performed using the carbon layer 62 as a mask.

At least the bottom surface of the memory hole MH is etched by the fourth etching process. The fourth etching process is performed between time t10 and time t11. In the fourth etching process, the memory hole MH penetrates the stacked body 60.

As the pressure of the helium gas increases from the sixth pressure P6 to the seventh pressure P7, the propagation of heat in the helium gas is promoted. Heat dissipation from the silicon substrate 10 to the holder 22 via the helium gas is promoted, and the temperature of the silicon substrate 10 decreases.

During the fourth etching process, the temperature of the silicon substrate 10 is, for example, equal to or more than −150° C. and equal to or less than 20° C. During the fourth etching process, for example, a seventh state in which the temperature of the silicon substrate 10 is equal to or more than −150° C. and equal to or less than 20° C. is realized.

During the fourth etching process, the fourth protective film 64d is formed on the surface of the memory hole MH. The fourth protective film 64d is formed, for example, on the side walls of the memory hole MH at a portion deepened by the fourth etching process.

The fourth protective film 64d is a reaction product originating from the fourth etching gas. The fourth protective film 64d contains, for example, carbon (C) and fluorine (F). The fourth protective film 64d is, for example, a fluorocarbon film.

After the fourth etching process, the application of the high-frequency power to the inside of the chamber 20 is stopped at time t11. Further, at time t11, the supply of the fourth etching process etching gas into the chamber 20 is blocked.

At time t11, the etching of the memory hole MH ends.

The aspect ratio of the memory hole MH penetrating the stacked body 60 is, for example, equal to or more than 30.

After the fourth etching process, the silicon substrate 10 is unloaded from the chamber 20 of the RIE apparatus.

The first etching gas, the second etching gas, the third etching gas, and the fourth etching gas contain, for example, carbon (C) and fluorine (F). The first etching gas, the second etching gas, the third etching gas, and the fourth etching gas contain, for example, oxygen (O). The first etching gas, the second etching gas, the third etching gas, and the fourth etching gas contain, for example, hydrogen (H).

The first etching gas, the second etching gas, the third etching gas, and the fourth etching gas include, for example, CxHyFz (x is an integer of equal to or more than 1, y is an integer of equal to or more than 0, and z is an integer of equal to or more than 1). The first etching gas, the second etching gas, the third etching gas, and the fourth etching gas include, for example, $C_4F_6$, $C_4F_8$, and $CH_2F_2$.

The first etching gas, the second etching gas, the third etching gas, and the fourth etching gas include, for example, oxygen gas.

The first etching gas, the second etching gas, the third etching gas, and the fourth etching gas are, for example, mixed gases of $C_4F_6$, $C_4F_8$, $CH_2F_2$, and oxygen gas.

The first etching gas, the second etching gas, the third etching gas, and the fourth etching gas are, for example, the same gas. For example, at least one of the first etching gas, the second etching gas, the third etching gas, and the fourth etching gas is different from the other gases.

The first reforming gas, the second reforming gas, and the third reforming gas contain hydrogen (H). The first reforming gas, the second reforming gas, and the third reforming gas include, for example, hydrogen gas.

Next, the carbon layer 62, the first reformed protective film 65a, the second reformed protective film 65b, the third reformed protective film 65c, and the fourth protective film 64d are removed (FIG. 14B). Removal of the carbon layer 62, the first reformed protective film 65a, the second reformed protective film 65b, the third reformed protective film 65c, and the fourth protective film 64d is performed, for example, by an ashing process using oxygen plasma.

Next, the stacked insulating layer 66 is formed in the memory hole MH (FIG. 14C). The stacked insulating layer 66 has, for example, a stacked structure of a silicon oxide film, a silicon nitride film, and an aluminum oxide film. The stacked insulating layer 66 finally becomes the gate insulating layer 13.

Next, the polycrystalline silicon layer 68 is formed in the memory hole MH (FIG. 14D). The polycrystalline silicon layer 68 finally becomes the channel layer 11.

Next, the silicon nitride film 60b is selectively removed (FIG. 15A).

Next, the first tungsten layer 70 is formed in the region from which the silicon nitride film 60b has been removed (FIG. 15B). The first tungsten layer 70 finally becomes the word line WL.

Next, a second tungsten layer 69 is formed on the polycrystalline silicon layer 68 (FIG. 15C). The second tungsten layer 69 finally becomes the bit line BL.

The nonvolatile memory 100 illustrated in FIG. 1 is manufactured by the above manufacturing method.

Next, functions and effects of the method for manufacturing the semiconductor device according to the fifth embodiment will be described.

Hereinafter, for convenience of description, the first etching process, the second etching process, the third etching process, and the fourth etching process may be collectively referred to simply as an etching process. In addition, the first reforming process, the second reforming process, and the third reforming process may be collectively referred to simply as a reforming process. In addition, the first protective film 64a, the second protective film 64b, and the third protective film 64c may be collectively referred to simply as the protective film 64. In addition, the first reformed protective film 65a, the second reformed protective film 65b, and the third reformed protective film 65c may be collectively referred to simply as a reformed protective film 65.

In the nonvolatile memory in which the memory cells are three-dimensionally disposed, in order to increase the capacity of the memory, for example, the hole diameter of the memory hole is reduced and the number of stacked word lines WL is increased. When the hole diameter of the memory hole is reduced and the number of stacked word lines WL is increased, it is necessary to form a memory hole having a high aspect ratio ((depth of memory hole)/(hole diameter of memory hole)).

An increase in the aspect ratio of the memory hole causes a problem that the memory hole has a bowing shape. The bowing shape of the memory hole is caused by expansion of the hole diameter during etching for forming the memory hole.

When the memory hole is etched, a substance originating from the plasmaized etching gas adheres to the side walls, and a protective film is formed on the side walls. By forming the protective film on the side walls of the memory hole, etching of the side walls is prevented, and the hole diameter is suppressed from expanding.

As a cause of the increase in the hole diameter during the etching of the memory hole, it is considered that a protective film formed on the side walls of the memory hole during the etching reacts with a material exposed on the side walls of the memory hole, and the etching of the side walls of the memory hole proceeds. The reaction between the protective film and the material exposed on the side walls proceeds, for example, by kinetic energy of ions incident on the protective film at the time of etching. As the etching of the side walls of the memory hole progresses, the hole diameter of the memory hole increases.

The side walls of the memory hole are formed of a material containing silicon (Si), such as silicon oxide or silicon nitride. The protective film formed on the side walls of the memory hole is, for example, a fluorocarbon film containing carbon and fluorine.

For example, silicon contained in the material forming the side walls reacts with fluorine contained in the protective film to form silicon fluoride. When silicon fluoride is formed and desorbed as a gas, etching of the side walls of the memory hole proceeds. As the etching of the side walls of the memory hole progresses, the hole diameter of the memory hole increases.

In the method for manufacturing the semiconductor device according to the fifth embodiment, the protective film 64 formed on the side walls is reformed to form the reformed protective film 65 when the memory hole MH is etched. By reforming the protective film 64 to the reformed protective film 65, the reaction between the reformed protective film 65 and the material forming the side walls of the memory hole MH is suppressed.

Specifically, for example, the protective film 64 is reduced to form the reformed protective film 65. Specifically, for example, the fluorine concentration of the protective film 64 is reduced to form the reformed protective film 65.

Specifically, for example, hydrogen radicals are supplied to the surface of the protective film 64 to cause the hydrogen radicals to react with fluorine in the protective film 64, thereby generating hydrogen fluoride. The generated hydrogen fluoride is desorbed as a gas, and the reformed protective film 65 having a fluorine concentration lower than that of the protective film 64 is formed.

Since the fluorine concentration of the reformed protective film 65 is reduced, the reaction between the reformed protective film 65 and the material forming the side walls of the memory hole MH is suppressed. Therefore, etching of the side walls of the memory hole MH is suppressed, and expansion of the hole diameter of the memory hole MH is suppressed.

In addition, the fluorine concentration of the reformed protective film 65 is reduced, so that the ratio of the carbon-carbon bond (C—C bond) having higher bonding energy than the bonding energy of the carbon-fluorine bond (C—F bond) is increased in the reformed protective film 65. Therefore, the etching resistance of the protective film at the time of forming the memory hole MH is also increased.

Therefore, according to the method for manufacturing the semiconductor device of the fifth embodiment, etching of the side walls of the memory hole MH is suppressed, and the shape of the memory hole can be suppressed from being bowed.

When the protective film 64 is reformed by the reforming process, it may be difficult to reform the protective film 64 at the bottom of a deep trench having a large aspect ratio. When the reforming of the protective film 64 at the bottom of the trench is insufficient, the shape of the bottom of the trench becomes a bowing shape.

In the method for manufacturing the semiconductor device according to the fifth embodiment, hydrogen radicals are used when the reforming process is performed. The hydrogen radicals are less likely to be deactivated than, for example, hydrogen ions. Therefore, it is considered that the hydrogen radicals easily reach the bottom of the deep trench having a large aspect ratio without being deactivated.

In order to reform the protective film 64 using hydrogen radicals, it is necessary to apply energy for causing the hydrogen radicals to react with fluorine in the protective film 64. In the method for manufacturing the semiconductor device according to the fifth embodiment, the temperature of the silicon substrate 10 is increased. In the method for manufacturing the semiconductor device according to the fifth embodiment, thermal energy is used as energy for causing hydrogen radicals to react with fluorine in the protective film 64.

As a result of examination by the inventors, it has become clear that a temperature of equal to or more than 200° C. is required in order for hydrogen radicals to react with fluorine in the fluorocarbon film and to extract fluorine from the fluorocarbon film. In addition, it has become clear that the fluorocarbon film in contact with the silicon oxide film reacts at a temperature exceeding 350° C., and etching of the silicon oxide film proceeds. In addition, it has become clear that decomposition of the fluorocarbon film became apparent at a temperature higher than 300° C.

In the method for manufacturing the semiconductor device according to the fifth embodiment, the temperature of the silicon substrate 10 on which the stacked body 60 is formed is controlled to equal to or more than 200° C. Therefore, the reaction between the hydrogen radical and fluorine in the protective film 64 proceeds, and the protective film 64 can be reformed.

In addition, in the method for manufacturing the semiconductor device according to the fifth embodiment, the temperature of the silicon substrate 10 on which the stacked body 60 is formed is controlled to equal to or less than 350° C. Therefore, the reaction between the material of the side walls of the memory hole MH and the protective film 64 is suppressed, and the etching of the material of the side walls is suppressed. Therefore, the expansion of the hole diameter of the memory hole MH is suppressed, and the shape of the memory hole MH can be suppressed from being bowed.

From the viewpoint of promoting the reforming of the protective film 64, the temperature of the silicon substrate 10 during the reforming process is preferably equal to or more than 225° C., and more preferably equal to or more than 250° C. In addition, from the viewpoint of suppressing etching of the material of the side walls and suppressing decomposition of the protective film 64, the temperature of the silicon substrate 10 during the reforming process is preferably equal to or less than 325° C. The temperature is more preferably equal to or less than 300° C. The reaction product 63 of the first embodiment can also be removed by controlling the temperature of the silicon substrate within this range.

In the method for manufacturing the semiconductor device according to the fifth embodiment, from the viewpoint of improving the etching speed of the stacked body 60 and improving the throughput of the etching process, the temperature of the silicon substrate 10 on which the stacked body 60 is formed is preferably low. In the method for manufacturing the semiconductor device according to the fifth embodiment, the temperature of the silicon substrate 10 during the etching process is, for example, preferably equal to or less than 20° C., and more preferably equal to or less than 0° C. The temperature of the silicon substrate 10 during the reforming process is preferably higher than the temperature of the silicon substrate 10 during the etching process.

In the method for manufacturing the semiconductor device according to the fifth embodiment, when the memory hole MH is formed, the temperature of the silicon substrate 10 having the stacked body 60 which is a layer to be processed is changed. That is, the low-temperature state of the silicon substrate 10 and the high-temperature state of the silicon substrate 10 are alternately repeated.

The first state, the third state, and the fifth state correspond to the low-temperature state. The second state, the fourth state, and the sixth state correspond to the high-temperature state.

When the silicon substrate 10 is in a low-temperature state, the memory hole MH is etched. On the other hand, when the silicon substrate 10 is in a high-temperature state, the reforming process of the protective film 64 is performed.

In the method for manufacturing the semiconductor device according to the fifth embodiment, the memory holes MH are formed while alternately repeating the low-temperature state of the silicon substrate 10 and the high-temperature state of the silicon substrate 10 in the same RIE apparatus, so that the processing accuracy of the shape of the memory holes is improved. In addition, the throughput of etching of the memory hole MH is improved.

In the method for manufacturing the semiconductor device according to the fifth embodiment, the transition between the high-temperature state and the low-temperature state of the silicon substrate 10 is performed by changing the pressure of the thermally conductive gas. The thermally conductive gas is, for example, helium gas.

By changing the pressure of the thermally conductive gas, propagation of heat between the silicon substrate 10 and the holder 22 is changed. The propagation of heat is accelerated when the pressure of the thermally conductive gas increases, and the propagation of heat is suppressed when the pressure of the thermally conductive gas decreases. For example, the silicon substrate 10 can be shifted from a low-temperature state to a high-temperature state by reducing the pressure of the thermally conductive gas. In addition, for example, the silicon substrate 10 can be shifted from a high-temperature state to a low-temperature state by increasing the pressure of the thermally conductive gas.

In the method for manufacturing the semiconductor device according to the fifth embodiment, the temperature of the silicon substrate 10 is changed by changing the pressure of the thermally conductive gas used for cooling the silicon substrate 10. Therefore, it is not necessary to add a new structure for changing the temperature of the silicon substrate 10 to the RIE apparatus. Therefore, the processing accuracy of the shape of the memory hole can be easily improved.

In the method for manufacturing the semiconductor device according to the fifth embodiment, from the viewpoint of suppressing etching of the carbon layer 62 due to collision of ions in the plasma with the carbon layer 62 during the reforming process, the high-frequency power applied to the silicon substrate 10 during the reforming process is preferably lower than the high-frequency power applied to the silicon substrate 10 during the etching process.

As described above, according to the method for manufacturing the semiconductor device of the fifth embodiment, it is possible to suppress the shape of the memory hole from being bowed, and to form the memory hole with high processing accuracy.

Sixth Embodiment

A semiconductor manufacturing apparatus according to a sixth embodiment includes a chamber; a holder provided in the chamber and capable of adsorbing a substrate, the holder including a recess on a surface, a first hole provided in the recess, and a second hole provided in the recess; a first gas passage connected to the first hole; a second gas passage connected to the second hole; a first valve provided in the first gas passage; a second valve provided in the second gas passage; a first gas supply pipe that supplies a first gas to the recess; and a gas discharge pipe that discharges gas from the recess, wherein the first gas passage and the second gas passage are connected to the first gas supply pipe, or the first gas passage and the second gas passage are connected to the gas discharge pipe.

The semiconductor manufacturing apparatus of the sixth embodiment is used, for example, for carrying out the method for manufacturing the semiconductor device of the first to fifth embodiments.

A method for manufacturing a semiconductor device according to a sixth embodiment includes: placing a substrate having a layer to be processed on a holder provided in a chamber and having a recess provided on a surface, a first hole provided in the recess, and a second hole provided in the recess; opening a first valve provided in a first gas passage connected to the first hole and a second valve provided in a second gas passage connected to the second hole to supply a first gas in contact with the substrate between the holder and the substrate via the first gas passage and the second gas passage; controlling a pressure of the first gas to a first pressure; performing a first etching process of etching the layer to be processed using a reactive ion etching method; closing the first valve and the second valve in the middle of the first etching process or after the first etching process; opening the first valve and the second valve after the first valve and the second valve are closed to discharge the first gas from between the holder and the substrate via the first gas passage and the second gas passage; controlling a pressure of the first gas to a second pressure lower than the first pressure; and performing a first reaction product removal to remove a reaction product on the layer to be processed. Then, either the first valve or the second valve is opened first when supplying the first gas, or either the first valve or the second valve is opened first when discharging the first gas. The method for manufacturing the semiconductor device of the sixth embodiment is different from the method for manufacturing the semiconductor device of the first embodiment in that the semiconductor manufacturing apparatus of the sixth embodiment is used. Hereinafter, description of contents overlapping with the method for manufacturing the semiconductor device according to the first embodiment may be partially omitted.

Figure 16:
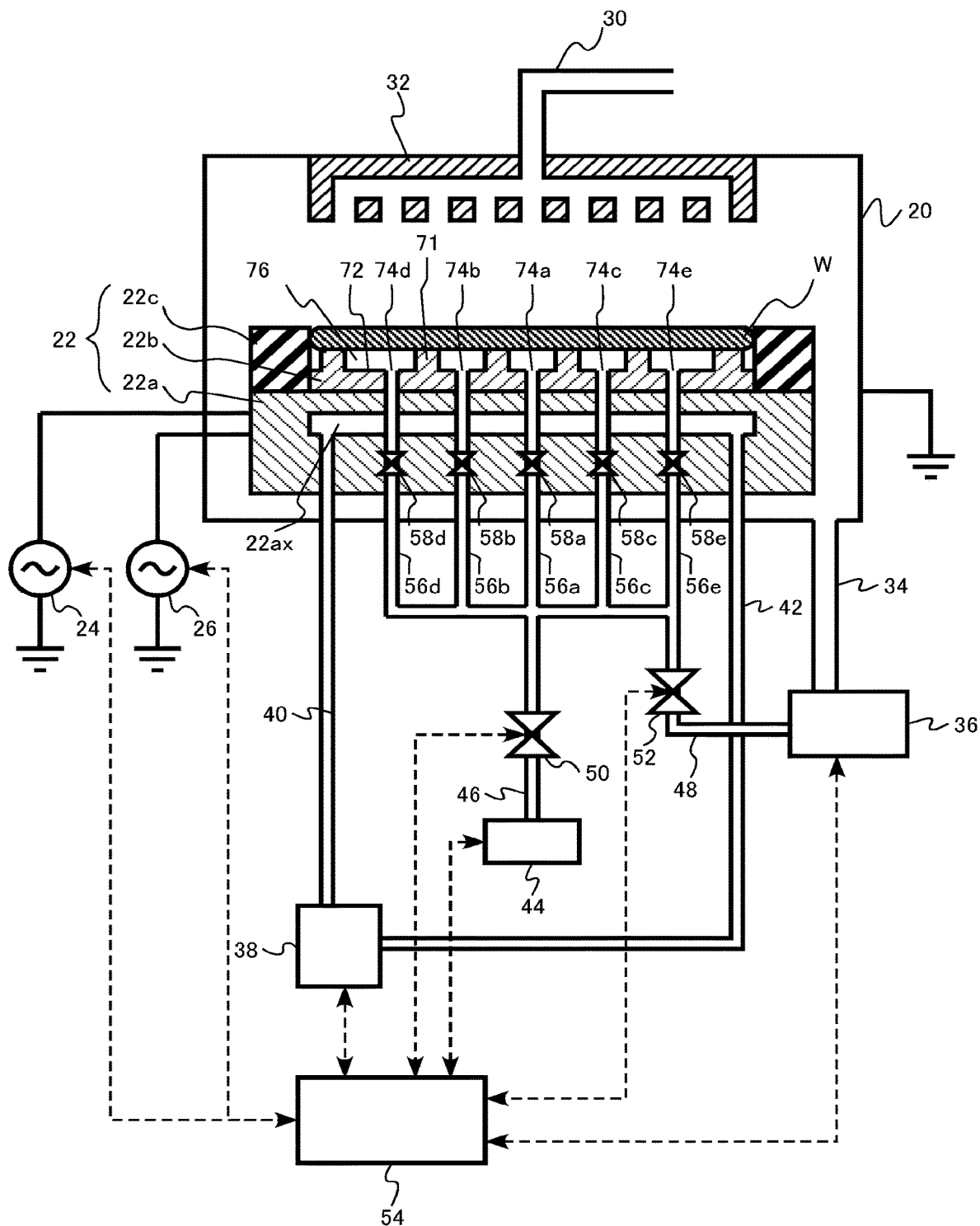
FIG. 16 is a schematic diagram of a semiconductor manufacturing apparatus according to a sixth embodiment.

FIG. 16 is a schematic diagram of the semiconductor manufacturing apparatus according to the sixth embodiment. The semiconductor manufacturing apparatus according to the sixth embodiment is a reactive ion etching apparatus (RIE apparatus). The reactive ion etching apparatus of the sixth embodiment is a dual-frequency capacitively-coupled plasma apparatus (CCP apparatus).

The RIE apparatus includes, for example, a chamber 20, a holder 22, a first high-frequency power source 24, a second high-frequency power source 26, a process gas supply pipe 30, a shower plate 32, a process gas discharge pipe 34, an exhaust device 36, a refrigerant unit 38, a refrigerant supply pipe 40, a refrigerant discharge pipe 42, a thermally conductive gas supply unit 44, a first thermally conductive gas supply pipe 46, a thermally conductive gas discharge pipe 48, a first main valve 50, a second main valve 52, a control circuit 54, a thermally conductive gas passage 56, and a thermally conductive gas valve 58.

The thermally conductive gas passage 56 includes a first thermally conductive gas passage 56a, a second thermally conductive gas passage 56b, a third thermally conductive gas passage 56c, a fourth thermally conductive gas passage 56d, and a fifth thermally conductive gas passage 56e. The thermally conductive gas valve 58 includes a first thermally conductive gas valve 58a, a second thermally conductive gas valve 58b, a third thermally conductive gas valve 58c, a fourth thermally conductive gas valve 58d, and a fifth thermally conductive gas valve 58e.

The first thermally conductive gas supply pipe 46 is an example of the first gas supply pipe. The thermally conductive gas discharge pipe 48 is an example of a gas discharge pipe. The first thermally conductive gas passage 56a is an example of the first gas passage. The second thermally conductive gas passage 56b is an example of the second gas passage. The third thermally conductive gas passage 56c is an example of a third gas passage. The fourth thermally conductive gas passage 56d is an example of a fourth gas passage. The fifth thermally conductive gas passage 56e is an example of a fifth gas passage.

The first thermally conductive gas valve 58a is an example of a first valve. The second thermally conductive gas valve 58b is an example of a second valve. The third thermally conductive gas valve 58c is an example of a third valve. The fourth thermally conductive gas valve 58d is an example of a fourth valve. The fifth thermally conductive gas valve 58e is an example of a fifth valve.

Figure 17A:
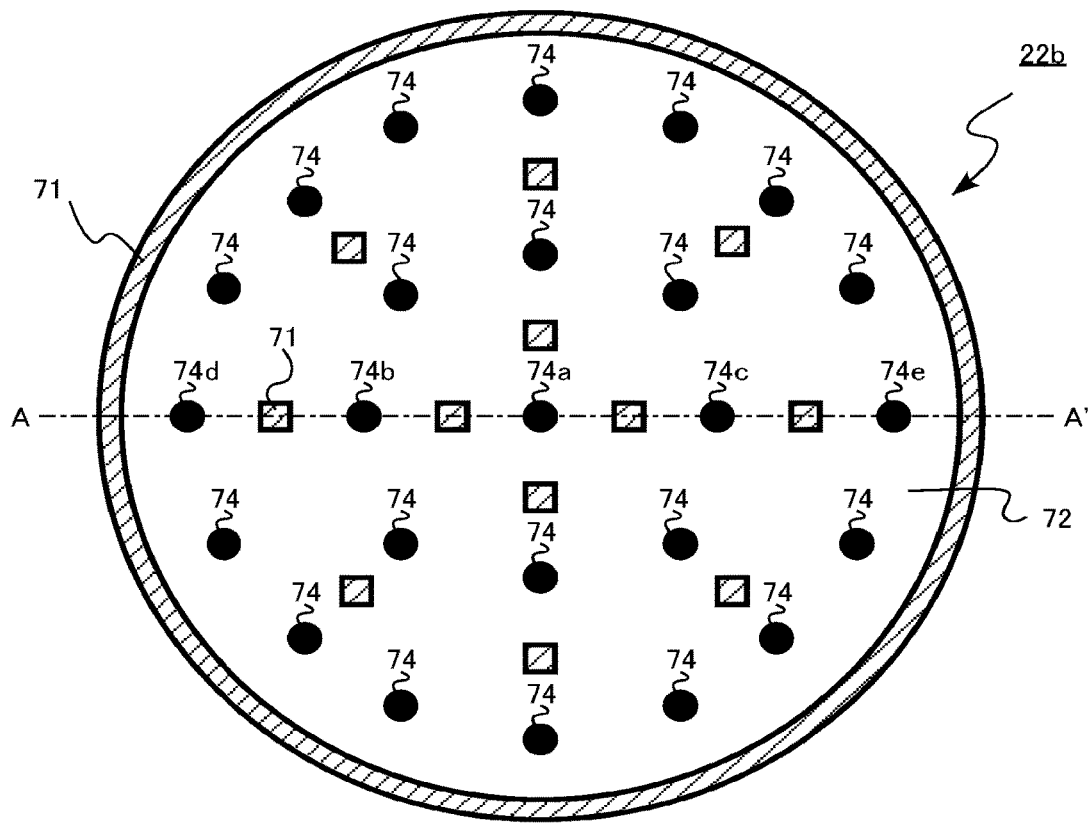
FIGS. 17A and 17B are schematic diagrams of a main part of a semiconductor manufacturing apparatus according to the sixth embodiment.
Figure 17B:
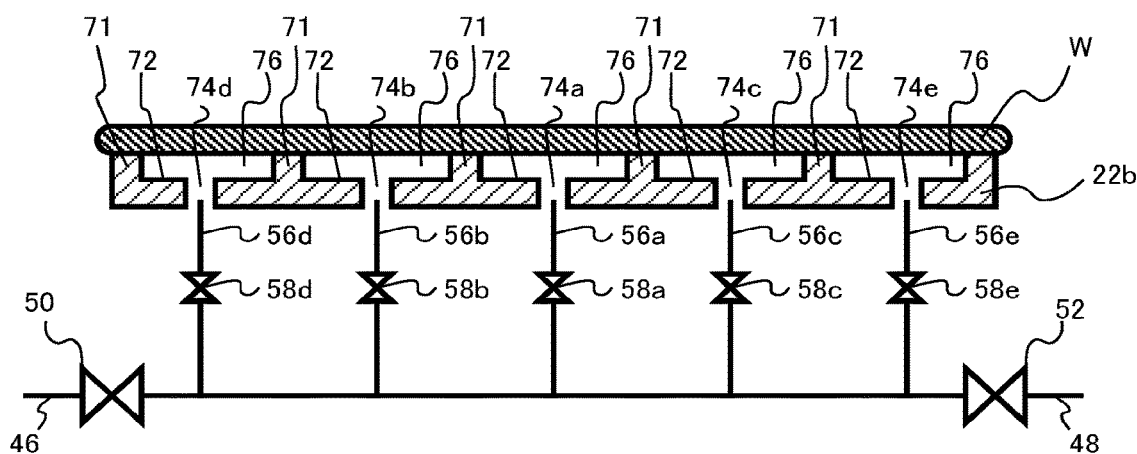

FIGS. 17A and 17B are schematic diagrams of main parts of the semiconductor manufacturing apparatus according to the sixth embodiment. FIG. 17A is a top view of the holder 22. FIG. 17A is a top view of the electrostatic chuck 22b. FIG. 17B is a diagram illustrating a relationship among the electrostatic chuck 22b, the thermally conductive gas passage 56, the thermally conductive gas valve 58, the first thermally conductive gas supply pipe 46, the thermally conductive gas discharge pipe 48, the first main valve 50, and the second main valve 52. FIG. 17B is a view including a cross-section taken along line AA' in FIG. 17A.

The holder 22 is provided in the chamber 20. The holder 22 mounts a semiconductor wafer W, for example. The holder 22 can suck the semiconductor wafer W. The semiconductor wafer W is an example of a substrate.

The holder 22 includes a support portion 22a, an electrostatic chuck 22b, and an outer circumferential ring 22c.

The support portion 22a functions as a lower electrode. High-frequency power is applied to the support portion 22a. The support portion 22a is, for example, metal.

A refrigerant flow path 22ax is provided inside the support portion 22a. The refrigerant flow path 22ax is a void. A refrigerant for cooling the support portion 22a is supplied to the refrigerant flow path 22ax. The refrigerant is, for example, a fluorine-based inert liquid.

The electrostatic chuck 22b includes a substrate support portion 71, a recess 72, and a thermally conductive gas hole 74. The thermally conductive gas holes 74 include first thermally conductive gas holes 74a, second thermally conductive gas holes 74b, third thermally conductive gas holes 74c, fourth thermally conductive gas holes 74d, and fifth thermally conductive gas holes 74e. The first thermally conductive gas hole 74a is an example of the first hole. The second thermally conductive gas hole 74b is an example of the second hole. The third thermally conductive gas hole 74c is an example of the third hole. The fourth thermally conductive gas hole 74d is an example of the fourth hole. The fifth thermally conductive gas hole 74e is an example of the fifth hole.

The electrostatic chuck 22b is provided on the support portion 22a. The electrostatic chuck 22b has a function of adsorbing and fixing the semiconductor wafer W. The electrostatic chuck 22b is formed of, for example, a dielectric including an electrode therein. The dielectric is, for example, ceramics.

The substrate support portion 71 is provided on the surface of the electrostatic chuck 22b. The substrate support portion 71 includes, for example, an annular portion provided on the outer circumference of the electrostatic chuck 22b and a plurality of protrusions provided inside the annular portion. When the semiconductor wafer W is placed on the holder 22, the back surface of the semiconductor wafer W is in contact with the substrate support portion 71.

A recess 72 is provided on the surface of the electrostatic chuck 22b. When the semiconductor wafer W is placed on the holder 22, the thermally conductive gas region 76 surrounded by the back surface of the semiconductor wafer W and the recess 72 is formed on the upper surface of the electrostatic chuck 22b.

A plurality of thermally conductive gas holes 74 are provided on the surface of the electrostatic chuck 22b. The thermally conductive gas hole 74 is provided in the recess 72. A thermally conductive gas for cooling the semiconductor wafer W is supplied to the thermally conductive gas region 76 through the thermally conductive gas holes 74.

The plurality of thermally conductive gas holes 74 are provided at equal intervals on the surface of the electrostatic chuck 22b, for example. A distance between two adjacent thermally conductive gas holes 74 is, for example, equal to or more than 10 cm and equal to or less than 20 cm.

The thermally conductive gas contains, for example, helium (He), hydrogen (H), nitrogen (N), neon (Ne), argon (Ar), krypton (Kr), or xenon (Xe). The thermally conductive gas includes, for example, helium gas, hydrogen gas, nitrogen gas, neon gas, argon gas, krypton gas, or xenon gas.

The outer circumferential ring 22c is provided on the support portion 22a. The outer circumferential ring 22c is provided around the electrostatic chuck 22b. The outer circumferential ring 22c has a function of supporting the outer circumference of the semiconductor wafer W. The upper surface of the outer circumferential ring 22c is formed of, for example, silicon.

The first high-frequency power source 24 has a function of applying first high-frequency power to the inside of the chamber 20. The first high-frequency power source 24 applies high-frequency power between the support portion 22a of the holder 22 and the shower plate 32. The first high-frequency power applied to the chamber 20 using the first high-frequency power source 24 generates plasma in the chamber 20.

The first high-frequency power applied by the first high-frequency power source 24 is, for example, equal to or more than 50 W and equal to or less than 20,000 W. The first frequency applied by the first high-frequency power source 24 is, for example, equal to or more than 20 MHz and equal to or less than 200 MHz.

The second high-frequency power source 26 has a function of applying second high-frequency power to the inside of the chamber 20. The second high-frequency power source 26 applies the second high-frequency power to the support portion 22a of the holder 22. By applying the second high-frequency power to the holder 22, the energy of ions colliding with the semiconductor wafer W is controlled.

The second high-frequency power applied to the holder 22 is, for example, equal to or more than 50 W and equal to or less than 20,000 W. The second frequency applied to the holder 22 is lower than the first frequency applied to the chamber 20 by the first high-frequency power source 24. The second frequency applied to the holder 22 is, for example, equal to or more than 0.1 MHz and 20 MHz or less.

The process gas supply pipe 30 is provided above the chamber 20. The process gas is supplied from the process gas supply pipe 30 to the shower plate 32. For example, an etching gas or a reforming gas is supplied from the process gas supply pipe 30 to the shower plate 32.

The shower plate 32 is provided in the chamber 20. The shower plate 32 is provided above the holder 22.

The process gas is supplied from the process gas supply pipe 30 to the shower plate 32. A process gas is supplied into the chamber 20 from a plurality of gas supply ports provided in the shower plate 32.

The shower plate 32 also functions as an upper electrode of the first high-frequency power.

The process gas discharge pipe 34 is provided below the chamber 20. For example, etching gas and reaction products not consumed in the etching reaction are discharged from the process gas discharge pipe 34 to the outside of the chamber 20.

The exhaust device 36 is connected to the process gas discharge pipe 34 and the thermally conductive gas discharge pipe 48. The exhaust device 36 is, for example, a vacuum pump.

The refrigerant unit 38 is connected to the refrigerant supply pipe 40. The refrigerant supply pipe 40 is connected to the refrigerant flow path 22ax. The refrigerant flow path 22ax is connected to the refrigerant discharge pipe 42. The refrigerant circulates in the refrigerant supply pipe 40, the refrigerant flow path 22ax, and the refrigerant discharge pipe 42 by the refrigerant unit 38.

The thermally conductive gas supply unit 44 is connected to the first thermally conductive gas supply pipe 46. The thermally conductive gas supply unit 44 is, for example, a gas cylinder that stores thermally conductive gas. The thermally conductive gas is supplied from the thermally conductive gas supply unit 44 to the first thermally conductive gas supply pipe 46. The thermally conductive gas is an example of the first gas.

The first thermally conductive gas supply pipe 46 is connected to the recess 72. The first thermally conductive gas supply pipe 46 is connected to the thermally conductive gas passage 56. The thermally conductive gas is supplied from the first thermally conductive gas supply pipe 46 to the thermally conductive gas passage 56.

The first main valve 50 is provided in the first thermally conductive gas supply pipe 46. The first main valve 50 is, for example, a flow control valve. The first main valve 50 is used to control the supply of thermally conductive gas to the thermally conductive gas passage 56. The first main valve 50 can also be used to cut off the supply of thermally conductive gas to the thermally conductive gas passage 56.

The exhaust device 36 is connected to the chamber 20 and the thermally conductive gas discharge pipe 48. Through the thermally conductive gas discharge pipe 48, the thermally conductive gas is discharged to the outside of the RIE apparatus.

The thermally conductive gas discharge pipe 48 is connected to the recess 72. The thermally conductive gas discharge pipe 48 is connected to the thermally conductive gas passage 56. Through the thermally conductive gas passage 56, the thermally conductive gas is discharged out of the RIE apparatus.

The second main valve 52 is provided in the thermally conductive gas discharge pipe 48. The discharge of the thermally conductive gas from the thermally conductive gas passage 56 is controlled using the second main valve 52.

The thermally conductive gas passage 56 is connected to the thermally conductive gas hole 74. For example, the first thermally conductive gas passage 56a is connected to the first thermally conductive gas hole 74a. For example, the second thermally conductive gas passage 56b is connected to the second thermally conductive gas hole 74b. For example, the third thermally conductive gas passage 56c is connected to the third thermally conductive gas hole 74c. For example, the fourth thermally conductive gas passage 56d is connected to the fourth thermally conductive gas hole 74d. For example, the fifth thermally conductive gas passage 56e is connected to the fifth thermally conductive gas hole 74e.

The thermally conductive gas is supplied from the thermally conductive gas passage 56 to the thermally conductive gas region 76 through the thermally conductive gas hole 74. In addition, the thermally conductive gas is discharged from the thermally conductive gas region 76 to the thermally conductive gas passage 56 through the thermally conductive gas hole 74.

At least a portion of the thermally conductive gas passage 56 is provided in the holder 22.

The thermally conductive gas passage 56 is connected to the first thermally conductive gas supply pipe 46. For example, the first thermally conductive gas passage 56a, the second thermally conductive gas passage 56b, the third thermally conductive gas passage 56c, the fourth thermally conductive gas passage 56d, and the fifth thermally conductive gas passage 56e are connected to the first thermally conductive gas supply pipe 46.

The thermally conductive gas passage 56 is connected to the thermally conductive gas discharge pipe 48. For example, the first thermally conductive gas passage 56a, the second thermally conductive gas passage 56b, the third thermally conductive gas passage 56c, the fourth thermally conductive gas passage 56d, and the fifth thermally conductive gas passage 56e are connected to the thermally conductive gas discharge pipe 48.

The thermally conductive gas valve 58 is provided in the thermally conductive gas passage 56. For example, the first thermally conductive gas valve 58a is provided in the first thermally conductive gas passage 56a. For example, the second thermally conductive gas valve 58b is provided in the second thermally conductive gas passage 56b. For example, the third thermally conductive gas valve 58c is provided in the third thermally conductive gas passage 56c. For example, the fourth thermally conductive gas valve 58d is provided in the fourth thermally conductive gas passage 56d. For example, the fifth thermally conductive gas valve 58e is provided in the fifth thermally conductive gas passage 56e. For example, the thermally conductive gas valve 58 is also provided in the thermally conductive gas passages 56 other than the first to fifth thermally conductive gas passages 56a to 56e.

The plurality of thermally conductive gas passages 56 may be shared to provide one thermally conductive gas valve 58. That is, one thermally conductive gas valve 58 may be provided for the plurality of thermally conductive gas holes 74. For example, one thermally conductive gas valve 58 may be provided for a plurality of thermally conductive gas holes 74 annularly disposed on the surface of the electrostatic chuck 22b. In addition, for example, one thermally conductive gas valve 58 may be provided for a plurality of thermally conductive gas holes 74 disposed in a fan shape on the surface of the electrostatic chuck 22b.

For example, the flow rate of the thermally conductive gas supplied from the thermally conductive gas passage 56 to the thermally conductive gas region 76 can be controlled for each thermally conductive gas passage 56 by the thermally conductive gas valve 58. In addition, for example, the flow rate of the thermally conductive gas discharged from the thermally conductive gas region 76 to the thermally conductive gas passage 56 can be controlled for each thermally conductive gas passage 56 by the thermally conductive gas valve 58.

The thermally conductive gas valve 58 is, for example, a flow control valve or a pressure control valve.

The thermally conductive gas valve 58 is provided, for example, in the holder 22. The thermally conductive gas valve 58 is provided, for example, in the support portion 22a.

The control circuit 54 has a function of controlling operations of the first high-frequency power source 24, the second high-frequency power source 26, the exhaust device 36, the refrigerant unit 38, the thermally conductive gas supply unit 44, the first main valve 50, the second main valve 52, and the thermally conductive gas valve 58.

The control circuit 54 controls opening and closing of the thermally conductive gas valve 58, for example. For example, the control circuit 54 independently controls opening and closing of the plurality of thermally conductive gas valves 58. For example, the control circuit 54 independently controls opening and closing of the first thermally conductive gas valve 58a and opening and closing of the second thermally conductive gas valve 58b.

In addition, the control circuit 54 controls, for example, the opening degree of the thermally conductive gas valve 58. For example, the control circuit 54 independently controls the opening degrees of the plurality of thermally conductive gas valves 58. For example, the control circuit 54 independently controls the opening degree of the first thermally conductive gas valve 58a and the opening degree of the second thermally conductive gas valve 58b.

The control circuit 54 includes, for example, hardware and software. The control circuit 54 includes, for example, an electronic circuit.

The semiconductor wafer W placed on the holder 22 is anisotropically etched using plasma generated between the shower plate 32 and the holder 22 in the chamber 20.

Next, a method for manufacturing the semiconductor device of the sixth embodiment using the semiconductor manufacturing apparatus of the sixth embodiment will be described. Hereinafter, a case where etching of the stacked body 60 is performed by a method similar to the method for manufacturing the semiconductor device of the first embodiment using the RIE apparatus of the sixth embodiment will be described as an example. Hereinafter, a description will be given with reference to FIGS. 4A to 4D of the first embodiment.

FIGS. 18A, 18B, 18C, and 18D are explanatory diagrams of the operation of the semiconductor manufacturing apparatus according to the sixth embodiment. FIGS. 18A to 18D are diagrams illustrating an example of a control sequence of the first main valve 50, the second main valve 52, and the thermally conductive gas valve 58 when the temperature of the semiconductor wafer W is changed.

Figure 18A:
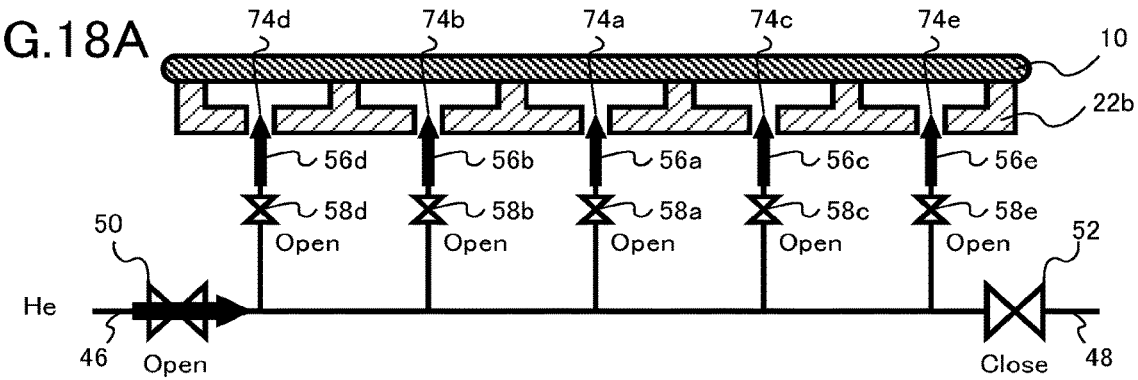
FIGS. 18A, 18B, 18C, and 18D are explanatory diagrams of the operation of the semiconductor manufacturing apparatus according to the sixth embodiment.

For example, as illustrated in FIG. 4A, when the first etching process is performed, as illustrated in FIG. 18A, the first main valve 50 and the thermally conductive gas valve 58 are opened, and helium gas is supplied from the first thermally conductive gas supply pipe 46 to the thermally conductive gas region 76. For example, the pressure of the helium gas in the thermally conductive gas region 76 is controlled to the first pressure P1.

The silicon substrate 10 is in a low-temperature state. When the silicon substrate 10 is in a low-temperature state, the etching speed of the memory hole MH increases, and the etching of the stacked body 60 mainly proceeds.

Figure 18B:
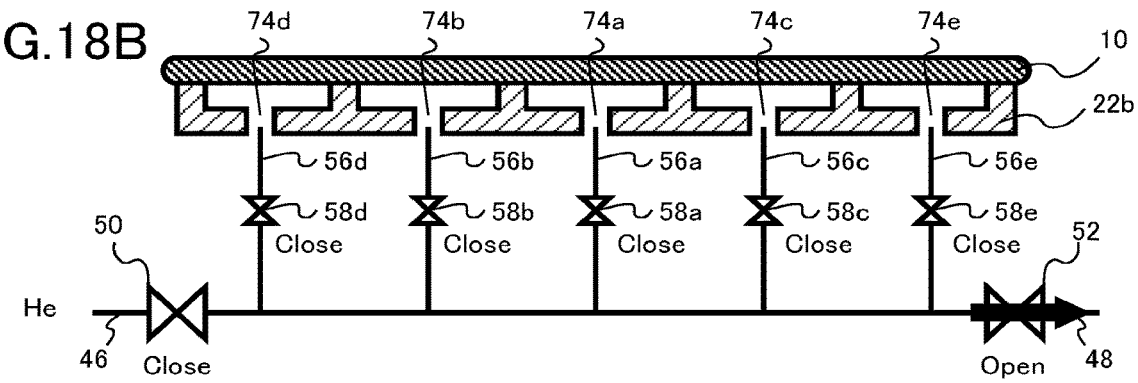

Next, as illustrated in FIG. 18B, the first main valve 50 and the thermally conductive gas valve 58 are closed in the middle of the first etching process or after the first etching process. When the second main valve 52 is opened, helium gas in the thermally conductive gas passage 56 between the thermally conductive gas valve 58 and the thermally conductive gas discharge pipe 48 is discharged from the thermally conductive gas discharge pipe 48 connected to the thermally conductive gas passage 56. The thermally conductive gas passage 56 on the downstream side of the thermally conductive gas valve 58 is in a vacuum state.

Next, during the first reaction product removal shown in FIG. 4D, the pressure of the helium gas in the thermally conductive gas region 76 is changed from the first pressure P1 to the second pressure P2. The second pressure P2 is lower than the first pressure P1.

Figure 18C:
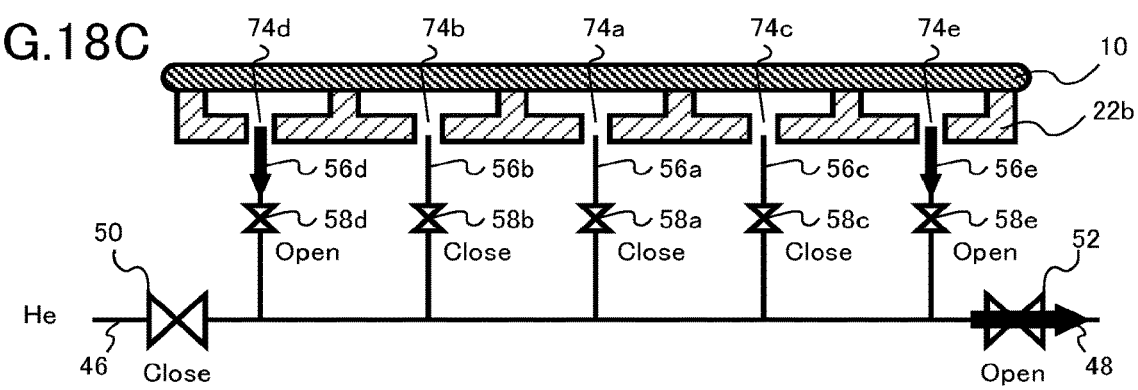

First, as shown in FIG. 18C, the fourth thermally conductive gas valve 58d and the fifth thermally conductive gas valve 58e are opened first. Since the thermally conductive gas passage 56 on the downstream side of the thermally conductive gas valve 58 is in the vacuum state in advance, the decrease in the pressure of the thermally conductive gas region 76 is promoted.

Figure 18D:
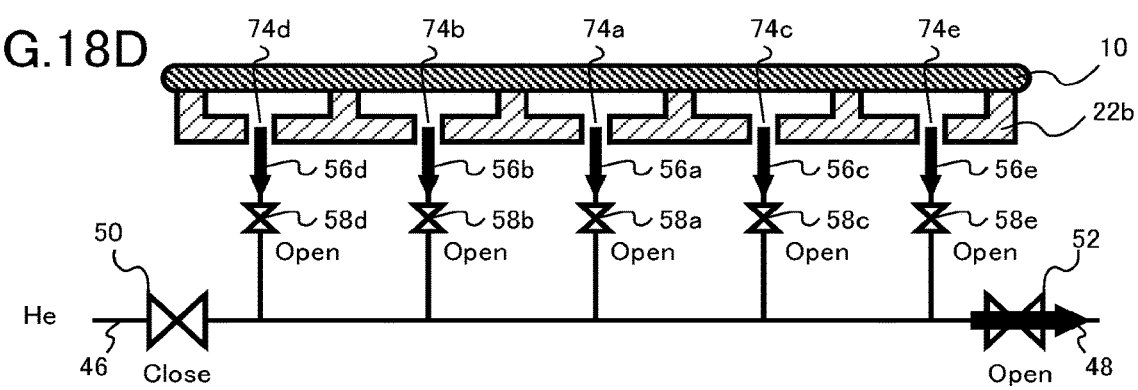

Next, as illustrated in FIG. 18D, the first thermally conductive gas valve 58a, the second thermally conductive gas valve 58b, and the third thermally conductive gas valve 58c are opened.

As the pressure of the thermally conductive gas region 76 decreases, the silicon substrate 10 enters a high-temperature state. When the silicon substrate 10 is in a high-temperature state, the decomposition reaction of the reaction product 63 formed on the bottom surface and the side surfaces of the memory hole MH is promoted, and the decomposition of the reaction product 63 mainly proceeds.

Next, when the second etching and the second reaction product removal are performed, the operations of FIGS. 18A to 18D are repeated. By repeating the operations of FIGS. 18A to 18D, the pressure of the thermally conductive gas in the thermally conductive gas region 76 is changed, and the low-temperature state of the silicon substrate 10 and the high-temperature state of the silicon substrate 10 can be alternately repeated.

Next, functions and effects of the semiconductor manufacturing apparatus according to the sixth embodiment will be described.

Figure 19A:
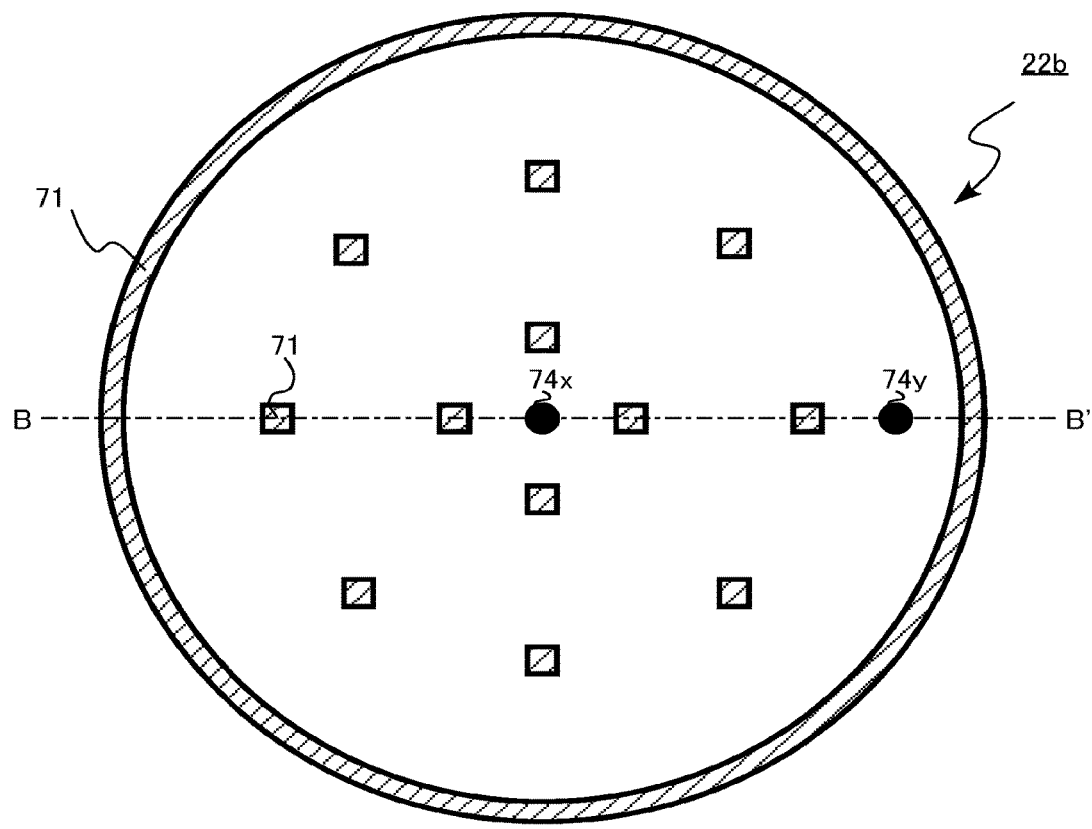
FIGS. 19A and 19B are schematic diagrams of main parts of a semiconductor manufacturing apparatus according to a comparative example.
Figure 19B:
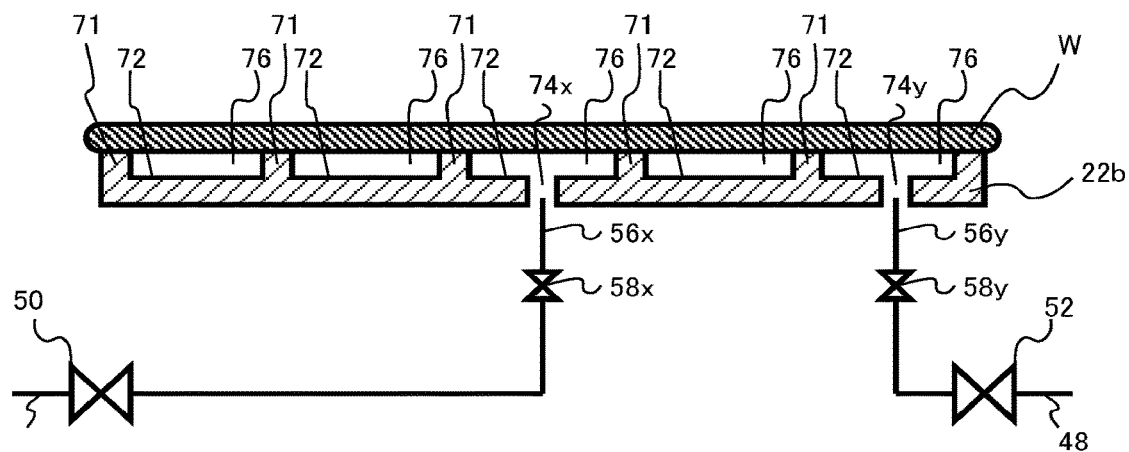

FIGS. 19A and 19B are schematic diagrams of main parts of a semiconductor manufacturing apparatus according to a comparative example. FIG. 19A is a top view of the holder 22. FIG. 19A is a top view of the electrostatic chuck 22b. FIG. 19B is a diagram illustrating a relationship among the electrostatic chuck 22b, the thermally conductive gas passage 56, the thermally conductive gas valve 58, the first thermally conductive gas supply pipe 46, the thermally conductive gas discharge pipe 48, the first main valve 50, and the second main valve 52. FIG. 19B is a view including a BB' cross-section of FIG. 19A. FIGS. 19A and 19B are diagrams corresponding to FIGS. 17A and 17B of the sixth embodiment.

The RIE apparatus of the comparative example is different from the RIE apparatus of the sixth embodiment in that the thermally conductive gas passage 56, the thermally conductive gas valve 58, and the thermally conductive gas hole 74 are provided one by one for supplying the thermally conductive gas, and the thermally conductive gas passage 56, the thermally conductive gas valve 58, and the thermally conductive gas hole 74 are provided one by one for discharging the thermally conductive gas.

Specifically, the RIE apparatus of the comparative example includes a thermally conductive gas passage 56x, a thermally conductive gas valve 58x, and a thermally conductive gas hole 74x for supplying the thermally conductive gas. The RIE apparatus of the comparative example includes a thermally conductive gas passage 56y, a thermally conductive gas valve 58y, and a thermally conductive gas hole 74y for discharging the thermally conductive gas.

In the case of the RIE apparatus of the comparative example, when the pressure of the thermally conductive gas in the thermally conductive gas region 76 is changed and the low-temperature state of the semiconductor wafer W and the high-temperature state of the semiconductor wafer W are alternately repeated, there is a problem that the in-plane variation in the temperature of the semiconductor wafer W increases. When the in-plane variation of the temperature of the semiconductor wafer W increases, for example, the variation in etching process and reaction product removal increases, and the processing accuracy in processing the layer to be processed by dry etching decreases.

One reason why the in-plane variation of the temperature of the semiconductor wafer W occurs is considered to be that the position dependence of the pressure change of the thermally conductive gas in the thermally conductive gas region 76 is large.

For example, in a case where the semiconductor wafer W is shifted from the high-temperature state to the low-temperature state, that is, in a case where the pressure of the thermally conductive gas in the thermally conductive gas region 76 is increased, when the supply of the thermally conductive gas is delayed in the outer circumferential portion of the electrostatic chuck 22b, the temperature of the outer circumferential portion of the semiconductor wafer W is less likely to decrease. Conversely, when the supply of the thermally conductive gas is delayed in the inner circumferential portion of the electrostatic chuck 22b, the temperature of the inner circumferential portion of the semiconductor wafer W is less likely to decrease.

In addition, for example, in a case where the semiconductor wafer W is shifted from a low-temperature state to a high-temperature state, that is, in a case where the pressure of the thermally conductive gas in the thermally conductive gas region 76 is reduced, when the discharge of the thermally conductive gas is delayed in the outer circumferential portion of the electrostatic chuck 22b, the temperature of the outer circumferential portion of the semiconductor wafer W is less likely to increase. Conversely, when the discharge of the thermally conductive gas is delayed in the inner circumferential portion of the electrostatic chuck 22b, the temperature of the inner circumferential portion of the semiconductor wafer W is less likely to increase.

The RIE apparatus of the sixth embodiment is provided with a plurality of thermally conductive gas passages 56 and a plurality of thermally conductive gas holes 74 for supplying thermally conductive gas. Therefore, the supply of the thermally conductive gas to the thermally conductive gas region 76 is promoted as compared with the comparative example. Therefore, when the semiconductor wafer W is shifted from the high-temperature state to the low-temperature state, the in-plane variation in the temperature of the semiconductor wafer W is suppressed.

Further, the RIE apparatus of the sixth embodiment is provided with the plurality of thermally conductive gas passages 56 and the plurality of thermally conductive gas holes 74 for discharging the thermally conductive gas. Therefore, the discharge of the thermally conductive gas from the thermally conductive gas region 76 is promoted as compared with the comparative example. Therefore, when the semiconductor wafer W is shifted from the low-temperature state to the high-temperature state, the in-plane variation in the temperature of the semiconductor wafer W is suppressed.

Further, in the RIE apparatus of the sixth embodiment, the thermally conductive gas valve 58 is provided in each of the plurality of thermally conductive gas passages 56. The opening/closing or the opening degree of the thermally conductive gas valve 58 can be independently controlled.

Therefore, for example, the supply of the thermally conductive gas to the thermally conductive gas region 76 can be adjusted for each position of the thermally conductive gas region 76. For example, it is possible to promote the supply of the thermally conductive gas to a region where it is difficult to decrease the temperature of the semiconductor wafer W. Therefore, when the semiconductor wafer W is shifted from the high-temperature state to the low-temperature state, the in-plane variation in the temperature of the semiconductor wafer W can be further suppressed.

In addition, for example, the discharge of the thermally conductive gas from the thermally conductive gas region 76 can be adjusted for each position of the thermally conductive gas region 76. For example, it is possible to promote the discharge of the thermally conductive gas from a region where it is difficult to increase the temperature of the semiconductor wafer W. Therefore, when the semiconductor wafer W is shifted from the low-temperature state to the high-temperature state, the in-plane variation in the temperature of the semiconductor wafer W can be further suppressed.

FIGS. 18A, 18B, 18C, and 18D illustrate an example of a control sequence of the first main valve 50, the second main valve 52, and the thermally conductive gas valve 58, for example, in a case where the silicon substrate 10 is shifted from the low-temperature state to the high-temperature state and it is difficult to increase the temperature of the outer circumferential portion of the silicon substrate 10. As illustrated in FIG. 18C, by opening the fourth thermally conductive gas valve 58d and the fifth thermally conductive gas valve 58e first, the discharge of the thermally conductive gas from the thermally conductive gas region 76 corresponding to the outer circumferential portion of the silicon substrate 10 is promoted. Therefore, the temperature of the outer circumferential portion of the silicon substrate 10 easily increases. Therefore, it is possible to suppress the in-plane variation in the temperature of the silicon substrate 10 when the silicon substrate 10 is shifted from the low-temperature state to the high-temperature state.

In FIG. 18C, the fourth thermally conductive gas valve 58d and the fifth thermally conductive gas valve 58e are opened first, but the valve opened first is not limited thereto. For example, the first thermally conductive gas valve 58a may be opened earlier than the second thermally conductive gas valve 58*b*. For example, the second thermally conductive gas valve 58*b* may be opened earlier than the first thermally conductive gas valve 58*a*.

For example, when the silicon substrate 10 is shifted from the high-temperature state to the low-temperature state, that is, when the first main valve 50 and the thermally conductive gas valve 58 are opened and the helium gas is supplied from the first thermally conductive gas supply pipe 46 to the thermally conductive gas region 76, a portion of the thermally conductive gas valve 58 may be opened first. For example, the first thermally conductive gas valve 58*a* is opened earlier than the second thermally conductive gas valve 58*b*. As a result, the temperature of the silicon substrate 10 on the first thermally conductive gas holes 74*a* can be lowered faster than the temperature of the silicon substrate 10 on the second thermally conductive gas holes 74*b*. Further, for example, the second thermally conductive gas valve 58*b* is opened earlier than the first thermally conductive gas valve 58*a*. As a result, the temperature of the silicon substrate 10 on the second thermally conductive gas holes 74*b* can be lowered faster than the temperature of the silicon substrate 10 on the first thermally conductive gas holes 74*a*.

As described above, according to the semiconductor device manufacturing apparatus and the method for manufacturing the semiconductor device of the sixth embodiment, it is possible to process a layer to be processed with high accuracy when the layer to be processed is processed by dry etching.

Seventh Embodiment

A semiconductor manufacturing apparatus according to a seventh embodiment is different from the semiconductor manufacturing apparatus according to the sixth embodiment in that a first gas passage and a second gas passage are connected to a gas discharge pipe, and the first gas passage and the second gas passage are not connected to a first gas supply pipe. Hereinafter, description of contents overlapping with the sixth embodiment may be partially omitted.

Figure 20:
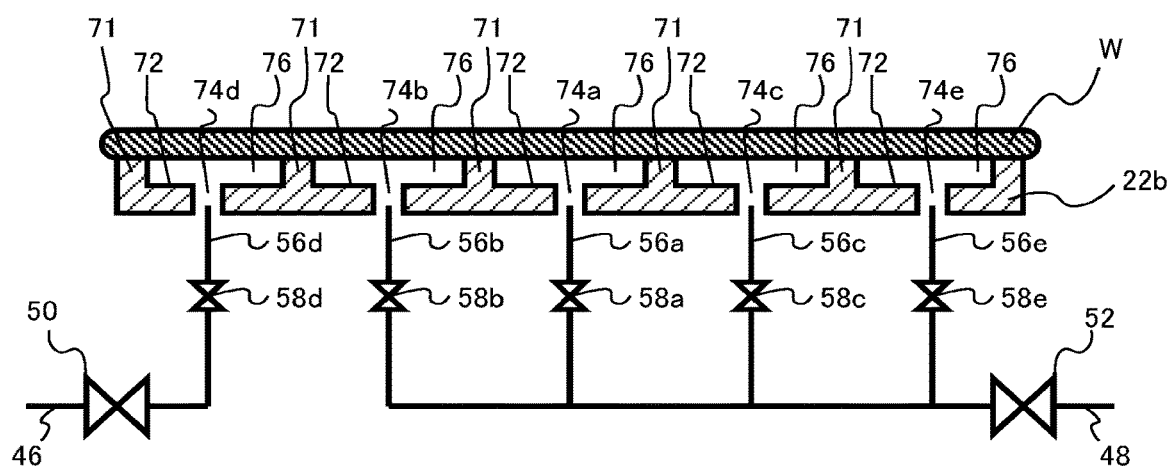
FIG. 20 is a schematic diagram of a main part of a semiconductor manufacturing apparatus according to a seventh embodiment.

FIG. 20 is a schematic diagram of a main part of the semiconductor manufacturing apparatus according to the seventh embodiment. FIG. 20 is a diagram corresponding to FIG. 17B of the sixth embodiment.

One of the thermally conductive gas passages 56 is connected to the first thermally conductive gas supply pipe 46. A fourth thermally conductive gas passage 56*d* is connected to the first thermally conductive gas supply pipe 46.

A portion of the thermally conductive gas passage 56 is connected to the thermally conductive gas discharge pipe 48. The first thermally conductive gas passage 56*a*, the second thermally conductive gas passage 56*b*, the third thermally conductive gas passage 56*c*, and the fifth thermally conductive gas passage 56*e* are connected to the thermally conductive gas discharge pipe 48.

The RIE apparatus of the seventh embodiment can adjust, for example, the discharge of the thermally conductive gas from the thermally conductive gas region 76 for each position of the thermally conductive gas region 76. For example, it is possible to promote the discharge of the thermally conductive gas from a region where it is difficult to increase the temperature of the semiconductor wafer W. Therefore, when the semiconductor wafer W is shifted from the low-temperature state to the high-temperature state, the in-plane variation in the temperature of the semiconductor wafer W can be suppressed.

Modified Example

Figure 21:
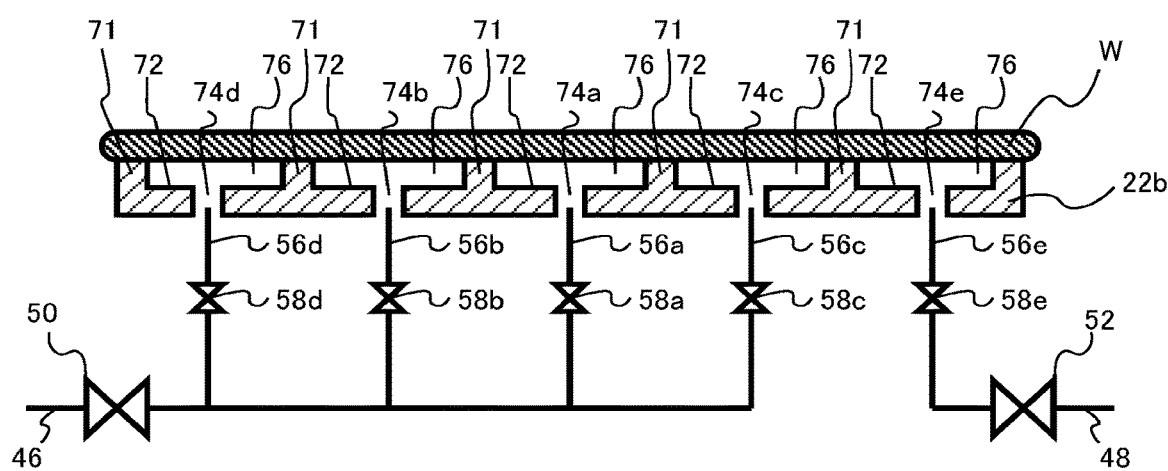
FIG. 21 is a schematic diagram of a main part of a semiconductor manufacturing apparatus according to a modified example of the seventh embodiment.

FIG. 21 is a schematic diagram of a main part of a semiconductor manufacturing apparatus according to a modified example of the seventh embodiment. FIG. 21 is a diagram corresponding to FIG. 20 of the seventh embodiment. The semiconductor manufacturing apparatus according to the seventh embodiment is different from the semiconductor manufacturing apparatus according to the sixth embodiment in that the first gas passage and the second gas passage are not connected to the gas discharge pipe, and the first gas passage and the second gas passage are connected to the first gas supply pipe.

A portion of the thermally conductive gas passage 56 is connected to the first thermally conductive gas supply pipe 46. The first thermally conductive gas passage 56*a*, the second thermally conductive gas passage 56*b*, the third thermally conductive gas passage 56*c*, and the fourth thermally conductive gas passage 56*d* are connected to the first thermally conductive gas supply pipe 46.

One of the thermally conductive gas passages 56 is connected to the thermally conductive gas discharge pipe 48. The fifth thermally conductive gas passage 56*e* is connected to the thermally conductive gas discharge pipe 48.

The RIE apparatus according to the modified example of the seventh embodiment can adjust, for example, the supply of the thermally conductive gas to the thermally conductive gas region 76 for each position of the thermally conductive gas region 76. For example, it is possible to promote the supply of the thermally conductive gas to a region where it is difficult to decrease the temperature of the semiconductor wafer W. Therefore, when the semiconductor wafer W is shifted from the high-temperature state to the low-temperature state, the in-plane variation in the temperature of the semiconductor wafer W can be suppressed.

As described above, according to the semiconductor device manufacturing apparatuses of the seventh embodiment and the modified example, it is possible to process a layer to be processed with high accuracy when the layer to be processed is processed by dry etching.

Eighth Embodiment

A semiconductor manufacturing apparatus according to an eighth embodiment is different from the semiconductor manufacturing apparatus according to the sixth embodiment in that the first gas passage, the second gas passage, and the third gas passage are connected to the first gas supply pipe and are not connected to the gas discharge pipe, and the fourth gas passage and the fifth gas passage are not connected to the first gas supply pipe and are connected to the gas discharge pipe. Hereinafter, description of contents overlapping with the sixth embodiment may be partially omitted.

Figure 22:
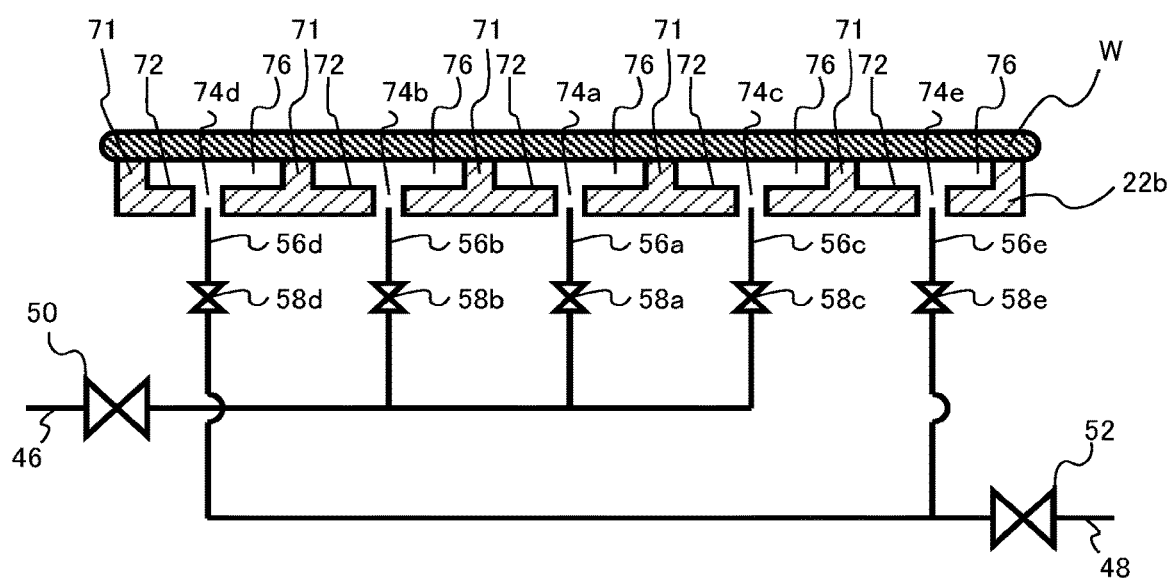
FIG. 22 is a schematic diagram of a main part of a semiconductor manufacturing apparatus according to an eighth embodiment.

FIG. 22 is a schematic diagram of a main part of a semiconductor manufacturing apparatus according to an eighth embodiment. FIG. 22 is a diagram corresponding to FIG. 17B of the sixth embodiment.

A portion of the thermally conductive gas passage 56 is connected to the first thermally conductive gas supply pipe 46. The first thermally conductive gas passage 56*a*, the second thermally conductive gas passage 56*b*, and the third thermally conductive gas passage 56*c* are connected to the first thermally conductive gas supply pipe 46.

A portion of the thermally conductive gas passage 56 is connected to the thermally conductive gas discharge pipe 48. The fourth thermally conductive gas passage 56*d* and the fifth thermally conductive gas passage 56e are connected to the thermally conductive gas discharge pipe 48.

The RIE apparatus of the eighth embodiment can adjust, for example, the discharge of the thermally conductive gas from the thermally conductive gas region 76 for each position of the thermally conductive gas region 76. For example, it is possible to promote the discharge of the thermally conductive gas from a region where it is difficult to increase the temperature of the semiconductor wafer W. Therefore, when the semiconductor wafer W is shifted from the low-temperature state to the high-temperature state, the in-plane variation in the temperature of the semiconductor wafer W can be suppressed.

In addition, for example, the supply of the thermally conductive gas to the thermally conductive gas region 76 can be adjusted for each position of the thermally conductive gas region 76. For example, it is possible to promote the supply of the thermally conductive gas to a region where it is difficult to decrease the temperature of the semiconductor wafer W. Therefore, when the semiconductor wafer W is shifted from the high-temperature state to the low-temperature state, the in-plane variation in the temperature of the semiconductor wafer W can be suppressed.

As described above, according to the eighth embodiment and the semiconductor device manufacturing apparatus, it is possible to process a layer to be processed with high accuracy when the layer to be processed is processed by dry etching.

Ninth Embodiment

A semiconductor manufacturing apparatus according to a ninth embodiment is different from the semiconductor manufacturing apparatus according to the sixth embodiment in that the semiconductor manufacturing apparatus further includes a second gas supply pipe that supplies a second gas different from the first gas to the recess, and the first gas passage and the second gas passage are connected to the first gas supply pipe and the second gas supply pipe. Hereinafter, description of contents overlapping with the sixth embodiment may be partially omitted.

Figure 23:
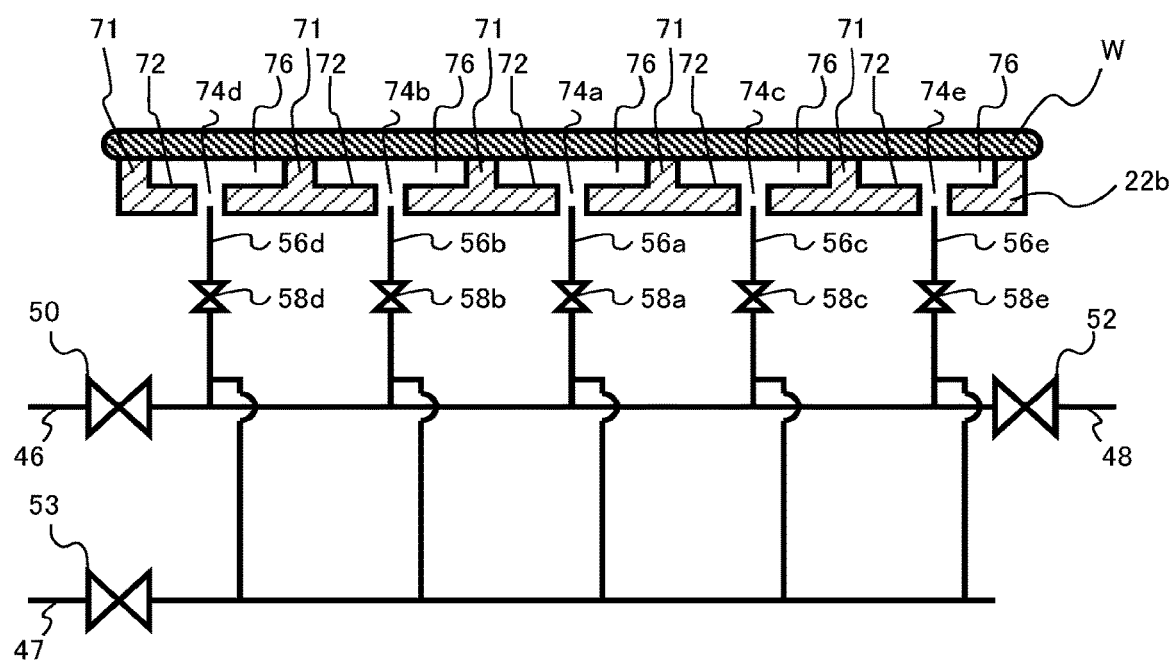
FIG. 23 is a schematic diagram of a main part of a semiconductor manufacturing apparatus according to a ninth embodiment.

FIG. 23 is a schematic diagram of a main part of a semiconductor manufacturing apparatus according to a ninth embodiment. FIG. 23 is a diagram corresponding to FIG. 17B of the sixth embodiment.

The RIE apparatus of the ninth embodiment includes a second thermally conductive gas supply pipe 47 and a third main valve 53.

The second thermally conductive gas supply pipe 47 is connected to the recess 72. The second thermally conductive gas supply pipe 47 is connected to the thermally conductive gas passage 56. The thermally conductive gas is supplied from the second thermally conductive gas supply pipe 47 to the thermally conductive gas passage 56.

A thermally conductive gas different from the thermally conductive gas supplied from the first thermally conductive gas supply pipe 46 is supplied from the second thermally conductive gas supply pipe 47. The thermally conductive gas supplied from the second thermally conductive gas supply pipe 47 is an example of the second gas.

The thermally conductive gas supplied from the second thermally conductive gas supply pipe 47 has lower heat conductivity than the thermally conductive gas supplied from the first thermally conductive gas supply pipe 46, for example.

For example, the thermally conductive gas supplied from the first thermally conductive gas supply pipe 46 is helium gas, and the thermally conductive gas supplied from the second thermally conductive gas supply pipe 47 is argon gas or nitrogen gas.

The third main valve 53 is provided in the second thermally conductive gas supply pipe 47. The third main valve 53 is, for example, a flow control valve. The third main valve 53 is used to control the supply of thermally conductive gas to the thermally conductive gas passage 56. The third main valve 53 can also be used to cut off the supply of thermally conductive gas to the thermally conductive gas passage 56.

The RIE apparatus of the ninth embodiment is used, for example, for carrying out the method for manufacturing the semiconductor device of the fourth embodiment using two kinds of thermally conductive gases.

As described above, according to the semiconductor device manufacturing apparatus of the ninth embodiment, it is possible to process a layer to be processed with high accuracy when the layer to be processed is processed by dry etching.

In the first to fourth embodiments, the case where etching is performed three times and reaction product removal is performed after each etching has been described as an example. However, the number of times of etching is not limited to three. The number of times of etching may be any number as long as it is equal to or more than two.

In the fifth embodiment, the case where etching is performed four times has been described as an example. However, the number of times of etching is not limited to four. The number of times of etching may be any number as long as it is equal to or more than two.

In the first to fifth embodiments, the case where the semiconductor device is a nonvolatile memory has been described as an example, but the semiconductor device is not limited to a nonvolatile memory.

In the first to fifth embodiments, the case where the layer to be processed has a structure in which a silicon oxide film and a silicon nitride film are alternately stacked has been described as an example, but the layer to be processed is not particularly limited. For example, the layer to be processed may have a structure in which a silicon oxide film and an insulating film other than the silicon nitride film are alternately stacked. In addition, for example, the layer to be processed may include a structure in which an insulating film and a semiconductor film are alternately stacked. In addition, for example, the layer to be processed may include a structure in which an insulating film and a metal film are alternately stacked. The layer to be processed may be formed of a single film.

In the first to fifth embodiments, the case where the memory hole MH is formed in the layer to be processed by etching has been described as an example, but the pattern formed in the layer to be processed is not limited to the hole pattern. The pattern formed on the layer to be processed may be, for example, a groove pattern. In addition, it is also possible to adopt a mode in which the entire surface of the layer to be processed is etched.

In the first to fifth embodiments, the case where the reactive ion etching apparatus (RIE apparatus) is a dual-frequency capacitively-coupled plasma apparatus (CCP apparatus) has been described as an example. However, the type of the RIE apparatus is not particularly limited.

In the first to fourth embodiments, the case where the etching gas is supplied into the chamber 20 also during reaction product removal has been described as an example, but for example, hydrogen gas, nitrogen gas, argon gas, or the like may be supplied into the chamber 20 instead of the etching gas during reaction product removal.

While certain embodiments have been described, these embodiments have been presented by way of example only, and are not intended to limit the scope of the inventions. Indeed, the semiconductor manufacturing apparatus and the method for manufacturing the semiconductor device described herein may be embodied in a variety of other forms; further, various omissions, substitutions and changes in the form of the devices and methods described herein may be made without departing from the spirit of the inventions. The accompanying claims and their equivalents are intended to cover such forms or modifications as would fall within the scope and spirit of the inventions.

Clause 1

A method for manufacturing a semiconductor device, including:
- placing a substrate having a layer to be processed on a holder provided in a chamber;
- supplying a first gas between the holder and the substrate so as to be in contact with the substrate;
- controlling a pressure of the first gas to a first pressure;
- performing a first etching process of forming a recess on the layer to be processed by a reactive ion etching method using a first process gas;
- controlling the pressure of the first gas to a second pressure lower than the first pressure after the performing the first etching process;
- performing a first process of supplying hydrogen radicals to the recess using a second process gas containing hydrogen in a state in which a temperature of the substrate is equal to or more than 200° C. and equal to or less than 350° C.;
- controlling a pressure of the first gas to a third pressure higher than the second pressure after the performing the first process; and
- performing second etching process of etching a bottom surface of the recess by a reactive ion etching method using a third process gas.

Clause 2

The method for manufacturing the semiconductor device according to Clause 1, wherein a first film is formed on a surface of the recess during the first etching process.

Clause 3

The method for manufacturing the semiconductor device according to Clause 2, wherein the first film contains carbon and fluorine.

Clause 4

The method for manufacturing the semiconductor device according to Clause 2, wherein in the first process, the fluorine concentration of the first film is reduced.

Clause 5

The method for manufacturing the semiconductor device according to Clause 1, wherein a mask layer having a pattern is formed on the layer to be processed before the performing the first etching process, and the recess is formed using the mask layer as a mask in the first etching process.

Clause 6

The method for manufacturing the semiconductor device according to Clause 5, wherein the mask layer contains carbon.

Clause 7

The method for manufacturing the semiconductor device according to Clause 1, wherein a high-frequency power applied to the substrate in the first process is lower than the high-frequency power applied to the substrate in the first etching process.

Clause 8

The method for manufacturing the semiconductor device according to Clause 1, wherein the layer to be processed contains silicon.

Clause 9

The method for manufacturing the semiconductor device according to Clause 1, wherein the layer to be processed has a structure in which a first layer and a second layer different from the first layer are alternately stacked.

Clause 10

The method for manufacturing the semiconductor device according to Clause 9, wherein the first layer is a silicon oxide film, and the second layer is a silicon nitride film.

Clause 11

The method for manufacturing the semiconductor device according to Clause 1, further including:
- controlling the pressure of the first gas to a fourth pressure lower than the third pressure after the performing the second etching process;
- performing a second process of supplying hydrogen radicals to the recess using a fourth process gas containing hydrogen in a state in which the temperature of the substrate is equal to or more than 200° C. and equal to or less than 350° C.;
- controlling the pressure of the first gas to a fifth pressure higher than the fourth pressure after the performing the second process; and
- performing a third etching process of etching the bottom surface of the recess by a reactive ion etching method using a fifth process gas.

Clause 12

A method for manufacturing a semiconductor device, including:
- placing a substrate having a layer to be processed on a holder provided in a chamber;
- supplying a first gas between the holder and the substrate so as to be in contact with the substrate;
- controlling a pressure of the first gas to a first pressure;
- performing a first etching process of etching the layer to be processed using a reactive ion etching method;
- controlling the pressure of the first gas to a second pressure lower than the first pressure after the performing the first etching process;

performing a first reaction product removal to remove a reaction product on the layer to be processed;

controlling the pressure of the first gas to a third pressure higher than the second pressure after the performing the first reaction product removal; and performing a second etching process of etching the layer to be processed using a reactive ion etching method.

Clause 13

The method for manufacturing the semiconductor device according to Clause 12, wherein the layer to be processed contains silicon (Si) and nitrogen (N).

Clause 14

The method for manufacturing the semiconductor device according to Clause 12, wherein the layer to be processed has a structure in which a silicon oxide film and a silicon nitride film are alternately stacked.

Clause 15

The method for manufacturing the semiconductor device according to Clause 12, wherein the following inequality is satisfied where td (sec) is a time during which the pressure of the first gas is controlled to the second pressure, T (° C.) is a temperature of the holder in the first etching process, k is a ratio of an area of the substrate to a sum of an area of the substrate and an inner wall area of the chamber, Pw (W) is high-frequency power applied to the inside of the chamber, m (kg) is a mass of the substrate, and c (J/(kg·° C.)) is a specific heat capacity of the substrate.

$$td \geq (100-T)/\{(k \times Pw)/(m \times c)\}$$

Clause 16

The method for manufacturing the semiconductor device according to Clause 12, wherein a time during which the pressure of the first gas is controlled to the second pressure is longer than 10 seconds.

Clause 17

The method for manufacturing the semiconductor device according to Clause 12, wherein the control of the change in the pressure of the first gas and the control of the change in the high-frequency power applied to the inside of the chamber are synchronized with each other.

Clause 18

The method for manufacturing the semiconductor device according to Clause 17, wherein the high-frequency power applied to the inside of the chamber during the first reaction product removal is made higher than the high-frequency power applied to the inside of the chamber during the first etching process.

Clause 19

The method for manufacturing the semiconductor device according to Clause 17, wherein the high-frequency power applied to the inside of the chamber during the first reaction product removal is made lower than the high-frequency power applied to the inside of the chamber during the first etching process.

Clause 20

The method for manufacturing the semiconductor device according to Clause 12, wherein the second pressure is equal to or less than $1/100$ of the first pressure.

Clause 21

The method for manufacturing the semiconductor device according to Clause 12, further including:

controlling the pressure of the first gas to a fourth pressure lower than the third pressure after the performing the second etching process;

performing a second reaction product removal to remove a reaction product on the layer to be processed;

controlling the pressure of the first gas to a fifth pressure higher than the fourth pressure after the performing the second reaction product removal; and performing a third etching process of etching the layer to be processed using a reactive ion etching method.

Clause 22

The method for manufacturing the semiconductor device according to Clause 12, wherein a temperature of the substrate is measured, and the pressure of the first gas is controlled to the third pressure based on the measured temperature of the substrate.

Clause 23

A method for manufacturing a semiconductor device, including:

placing a substrate having a layer to be processed on a holder provided in a chamber;

supplying a first gas between the holder and the substrate so as to be in contact with the substrate; and controlling a pressure of the first gas to a first pressure;

performing a first etching process of etching the layer to be processed using a reactive ion etching method in a first state in which a temperature of the substrate is equal to or less than 60° C.;

controlling the pressure of the first gas to a second pressure lower than the first pressure after the first etching process;

realizing a second state in which the temperature of the substrate is equal to or more than 100° C.;

controlling the pressure of the first gas to a third pressure higher than the second pressure after the realizing the second state; and performing a second etching process of etching the layer to be processed using a reactive ion etching method in a third state in which the temperature of the substrate is equal to or less than 60° C.

Clause 24

The method for manufacturing the semiconductor device according to Clause 23, wherein the following inequality is satisfied where td (sec) is a time during which the pressure of the first gas is controlled to the second pressure, T (° C.) is a temperature of the holder in the first etching process, k is a ratio of an area of the substrate to a sum of an area of the substrate and an inner wall area of the chamber, Pw (W) is high-frequency power applied to the inside of the chamber, m (kg) is a mass of the substrate, and c (J/(kg·° C.)) is a specific heat capacity of the substrate.

$$td \geq (100-T)/\{(k \times Pw)/(m \times c)\}$$

Clause 25

The method for manufacturing the semiconductor device according to Clause 23, wherein the control of the change in the pressure of the first gas and the control of the change in the high-frequency power applied to the inside of the chamber are synchronized with each other.

Clause 26

A semiconductor manufacturing apparatus comprising:
a chamber;
a holder provided in the chamber and capable of adsorbing a substrate, the holder including a recess, a first hole, and a second hole, the recess provided on a surface of the holder, the first hole provided in the recess, and the second hole provided in the recess;
a first gas passage connected to the first hole;
a second gas passage connected to the second hole;
a first valve provided in the first gas passage;
a second valve provided in the second gas passage;
a first gas supply pipe supplying a first gas to the recess; and
a gas discharge pipe discharging gas from the recess, wherein
the first gas passage and the second gas passage are connected to the first gas supply pipe, or the first gas passage and the second gas passage are connected to the gas discharge pipe.

Clause 27

The semiconductor manufacturing apparatus according to Clause 26, wherein the first valve and the second valve are flow control valves or pressure control valves.

Clause 28

The semiconductor manufacturing apparatus according to Clause 26, wherein the first valve and the second valve are provided in the holder.

Clause 29

A method for manufacturing a semiconductor device, including:
placing a substrate having a layer to be processed on a holder provided in a chamber and having a recess provided on a surface, a first hole provided in the recess, and a second hole provided in the recess;
opening a first valve provided in a first gas passage connected to the first hole and a second valve provided in a second gas passage connected to the second hole to supply a first gas between the holder and the substrate so as to be in contact with the substrate via the first gas passage and the second gas passage;
controlling a pressure of the first gas to a first pressure;
performing a first etching process of etching the layer to be processed using a reactive ion etching method;
closing the first valve and the second valve in the middle of the first etching process or after the first etching process;
opening the first valve and the second valve after the first valve and the second valve are closed to discharge the first gas from between the holder and the substrate via the first gas passage and the second gas passage;
controlling a pressure of the first gas to a second pressure lower than the first pressure; and
performing a first reaction product removal to remove a reaction product on the layer to be processed, wherein
either the first valve or the second valve is opened first when supplying the first gas, or
either the first valve or the second valve is opened first when discharging the first gas.

Clause 30

The method for manufacturing the semiconductor device according to Clause 29, wherein either the first valve or the second valve is opened first when supplying the first gas.

Clause 31

The method for manufacturing the semiconductor device according to Clause 29, wherein either the first valve or the second valve is opened first when discharging the first gas.

Clause 32

The method for manufacturing the semiconductor device according to Clause 29, wherein after the first valve and the second valve are closed and before the first valve and the second valve are opened, the first gas in the first gas passage between the first valve and the gas discharge pipe and the first gas in the second gas passage between the second valve and the gas discharge pipe are discharged from the gas discharge pipe connected to the first gas passage and the second gas passage.

What is claimed is:
1. A method for manufacturing a semiconductor device, comprising:
placing a substrate having a layer to be processed on a holder provided in a chamber;
supplying a first gas between the holder and the substrate so as to be in contact with the substrate;
controlling a pressure of the first gas to a first pressure;
performing a first etching process of etching the layer to be processed using a reactive ion etching method;
controlling a pressure of the first gas to a second pressure lower than the first pressure after the performing the first etching process;
performing a first reaction product removal to remove a reaction product on the layer to be processed;
controlling a pressure of the first gas to a third pressure higher than the second pressure after the performing the first reaction product removal; and
performing a second etching process of etching the layer to be processed using a reactive ion etching method.
2. The method for manufacturing the semiconductor device according to claim 1, wherein a second gas containing carbon (C) and fluorine (F) is supplied into the chamber during the first etching process and the second etching process.
3. The method for manufacturing the semiconductor device according to claim 2, wherein the second gas is supplied into the chamber during the first reaction product removal.
4. The method for manufacturing the semiconductor device according to claim 1, wherein control of changing the pressure of the first gas and control of changing high-frequency power applied in the chamber are synchronized with each other.

5. The method for manufacturing the semiconductor device according to claim 1, wherein
a recess is formed in the layer to be processed during the first etching process, and
a bottom surface of the recess is etched during the second etching process.

6. The method for manufacturing the semiconductor device according to claim 1, wherein the first gas contains helium (He), hydrogen (H), nitrogen (N), neon (Ne), argon (Ar), krypton (Kr), or xenon (Xe).

7. The method for manufacturing the semiconductor device according to claim 1, wherein
a third gas having a thermal conductivity lower than a thermal conductivity of the first gas is supplied between the holder and the substrate so as to be in contact with the substrate instead of the first gas after the controlling the pressure of the first gas to the second pressure,
the first gas is supplied between the holder and the substrate so as to be in contact with the substrate instead of the third gas after the performing the first reaction product removal, and
the pressure of the first gas is controlled to a third pressure higher than the second pressure.

8. The method for manufacturing the semiconductor device according to claim 1, wherein
a temperature of the substrate during the first etching process is equal to or less than 60° C., and
a temperature of the substrate during the first reaction product removal is equal to or more than 100° C.

9. The method for manufacturing the semiconductor device according to claim 1, wherein the following inequality is satisfied where td (sec) is a time during which the pressure of the first gas is controlled to the second pressure, T (° C.) is a temperature of the holder in the first etching process, k is a ratio of an area of the substrate to a sum of an area of the substrate and an inner wall area of the chamber, Pw (W) is high-frequency power applied to the inside of the chamber, m (kg) is a mass of the substrate, and c (J/(kg·° C.)) is a specific heat capacity of the substrate, $$td \geq (100-T)/\{(k \times Pw)/(m \times c)\}.$$

10. A method for manufacturing a semiconductor device comprising:
placing a substrate having a layer to be processed on a holder provided in a chamber;
supplying a first gas between the holder and the substrate so as to be in contact with the substrate;
controlling a pressure of the first gas to a first pressure;
performing a first etching process of forming a recess on the layer to be processed by a reactive ion etching method using a first process gas;
controlling the pressure of the first gas to a second pressure lower than the first pressure after the performing the first etching process;
performing a first process of supplying hydrogen radicals to the recess using a second process gas containing hydrogen in a state in which a temperature of the substrate is equal to or more than 200° C. and equal to or less than 350° C.;
controlling a pressure of the first gas to a third pressure higher than the second pressure after the performing the first process; and
performing second etching process of etching a bottom surface of the recess by a reactive ion etching method using a third process gas.

11. The method for manufacturing the semiconductor device according to claim 10, wherein the first etching process, the first process, and the second etching process are performed in a same chamber.

12. The method for manufacturing the semiconductor device according to claim 10, wherein the first process gas contains carbon and fluorine.

13. The method for manufacturing the semiconductor device according to claim 10, wherein a first film is formed on a surface of the recess during the first etching process, and the first film is reduced in the first process.

14. The method for manufacturing the semiconductor device according to claim 10, wherein the second process gas contains hydrogen gas.

15. The method for manufacturing the semiconductor device according to claim 10, wherein a temperature of the substrate in the first etching process is equal to or less than 20° C.

* * * * *